(12) United States Patent
Au

(10) Patent No.: US 11,043,607 B2
(45) Date of Patent: Jun. 22, 2021

(54) HORIZONTAL BALANCED SOLAR TRACKER

(71) Applicant: NEXTracker Inc., Fremont, CA (US)

(72) Inventor: Alexander W. Au, Oakland, CA (US)

(73) Assignee: NEXTRACKER INC., Fremont, CA (US)

( * ) Notice: Subject to any disclaimer, the term of this patent is extended or adjusted under 35 U.S.C. 154(b) by 150 days.

(21) Appl. No.: 15/640,322

(22) Filed: Jun. 30, 2017

(65) Prior Publication Data

US 2017/0301814 A1 Oct. 19, 2017

Related U.S. Application Data

(63) Continuation of application No. 14/101,273, filed on Dec. 9, 2013, now Pat. No. 9,905,717.

(Continued)

(51) Int. Cl.
| | |
|---|---|
| *H01L 31/052* | (2014.01) |
| *H02S 20/32* | (2014.01) |
| *F24S 25/10* | (2018.01) |
| *F24S 25/70* | (2018.01) |
| *F24S 30/425* | (2018.01) |
| *F24S 30/00* | (2018.01) |

(52) U.S. Cl.
CPC ............ *H01L 31/052* (2013.01); *F24S 25/10* (2018.05); *F24S 25/70* (2018.05); *F24S 30/425* (2018.05); *H02S 20/32* (2014.12); *F24S 2030/15* (2018.05); *Y02E 10/47* (2013.01)

(58) Field of Classification Search
CPC ....................................................... H02S 20/32
See application file for complete search history.

(56) References Cited

U.S. PATENT DOCUMENTS

| | | | |
|---|---|---|---|
| 1,683,266 | A | 9/1928 | Shipman |
| 2,156,965 | A | 5/1939 | Borden |

(Continued)

FOREIGN PATENT DOCUMENTS

| | | |
|---|---|---|
| JP | 2004-525596 A | 8/2004 |
| KR | 10-2008-0108640 A | 12/2008 |

(Continued)

OTHER PUBLICATIONS

Office Action from Chinese Patent Office for Application No. 201380072577.7 dated Aug. 23, 2017.

(Continued)

*Primary Examiner* — Sadie White
(74) *Attorney, Agent, or Firm* — Weber Rosselli & Cannon LLP

(57) ABSTRACT

In an example, the present invention provides a solar tracker apparatus. In an example, the apparatus comprises a center of mass with an adjustable hanger assembly configured with a clam shell clamp assembly on the adjustable hanger assembly and a cylindrical torque tube comprising a plurality of torque tubes configured together in a continuous length from a first end to a second end such that the center of mass is aligned with a center of rotation of the cylindrical torque tubes to reduce a load of a drive motor operably coupled to the cylindrical torque tube. Further details of the present example, among others, can be found throughout the present specification and more particularly below.

7 Claims, 61 Drawing Sheets

Related U.S. Application Data

(60) Provisional application No. 61/735,537, filed on Dec. 10, 2012.

(56) References Cited

U.S. PATENT DOCUMENTS

| | | | |
|---|---|---|---|
| 2,164,022 A | 6/1939 | Rowe | |
| 2,894,773 A | 7/1959 | Noe | |
| 3,935,987 A | 2/1976 | Foster et al. | |
| 4,023,368 A | 5/1977 | Kelly | |
| 4,061,130 A | 12/1977 | Gonzalez | |
| 4,135,493 A | 1/1979 | Kennedy | |
| 4,158,356 A | 6/1979 | Wininger | |
| 4,192,583 A | 3/1980 | Horton | |
| 4,205,657 A | 6/1980 | Kelly | |
| 4,226,502 A | 10/1980 | Gunzler | |
| 4,276,872 A | 7/1981 | Blake et al. | |
| 4,340,812 A | 7/1982 | Mori | |
| 4,372,017 A | 2/1983 | Heckethorn | |
| 4,429,952 A | 2/1984 | Dominguez | |
| 4,545,166 A | 10/1985 | Kielmeyer | |
| 4,602,811 A | 7/1986 | Heckethorn et al. | |
| 4,704,038 A | 11/1987 | Bruchon, Jr. | |
| 4,815,585 A | 3/1989 | May | |
| 4,890,599 A | 1/1990 | Eiden | |
| 5,092,939 A | 3/1992 | Nath et al. | |
| 5,181,762 A | 1/1993 | Beumer | |
| 5,274,888 A | 1/1994 | Payne | |
| D361,561 S | 8/1995 | Baudot | |
| 6,106,065 A | 8/2000 | Carroll | |
| 6,269,596 B1 | 8/2001 | Ohtsuka et al. | |
| 6,431,502 B1 | 8/2002 | Goodman | |
| 6,561,473 B1 | 5/2003 | Ianello | |
| D547,262 S | 7/2007 | Ullman | |
| D564,958 S | 3/2008 | Almy et al. | |
| 7,531,741 B1* | 5/2009 | Melton | H02S 20/32 136/246 |
| D606,938 S | 12/2009 | Mack | |
| 7,647,924 B2* | 1/2010 | Hayden | H02S 20/30 126/600 |
| D651,969 S | 1/2012 | Turk et al. | |
| D651,970 S | 1/2012 | Turk et al. | |
| 8,419,130 B2 | 4/2013 | Bergman | |
| 8,459,249 B2 | 6/2013 | Corio | |
| D689,434 S | 9/2013 | Tilscher | |
| 8,671,930 B2 | 3/2014 | Liao | |
| 8,727,288 B2 | 5/2014 | Ruiz et al. | |
| D713,784 S | 9/2014 | Wildes | |
| 8,839,573 B2 | 9/2014 | Cusson et al. | |
| 8,939,648 B2 | 1/2015 | Schneider et al. | |
| 9,303,684 B2 | 4/2016 | Lumbreras | |
| 9,347,691 B2 | 5/2016 | West et al. | |
| D758,834 S | 6/2016 | Tally | |
| 9,413,287 B2 | 8/2016 | Hartelius | |
| 9,466,749 B1 | 10/2016 | Au | |
| 10,008,975 B2 | 6/2018 | Au | |
| 10,222,446 B2 | 3/2019 | Au | |
| 2002/0078945 A1 | 6/2002 | Funger et al. | |
| 2002/0179138 A1 | 12/2002 | Lawheed | |
| 2003/0034029 A1 | 2/2003 | Shingleton | |
| 2003/0070368 A1 | 4/2003 | Shingleton | |
| 2003/0226412 A1 | 12/2003 | Rumminger et al. | |
| 2005/0284467 A1* | 12/2005 | Patterson | G01S 3/7861 126/580 |
| 2006/0086382 A1 | 4/2006 | Plaisted | |
| 2007/0144575 A1 | 6/2007 | Mascolo et al. | |
| 2007/0176059 A1 | 8/2007 | Roscetti et al. | |
| 2008/0040990 A1 | 2/2008 | Vendig et al. | |
| 2008/0168981 A1 | 7/2008 | Cummings et al. | |
| 2008/0230047 A1 | 9/2008 | Shugar et al. | |
| 2008/0308091 A1 | 12/2008 | Corio | |
| 2009/0025708 A1 | 1/2009 | Shingleton | |
| 2009/0032014 A1 | 2/2009 | Meydbray | |
| 2009/0159778 A1 | 6/2009 | Yeh et al. | |
| 2010/0101632 A1 | 4/2010 | Kats et al. | |
| 2010/0147286 A1 | 6/2010 | Xiang et al. | |
| 2010/0212714 A1 | 8/2010 | Rothschild et al. | |
| 2010/0263297 A1 | 10/2010 | Liebendorfer | |
| 2011/0023940 A1* | 2/2011 | Do | H02S 20/00 136/246 |
| 2011/0041834 A1 | 2/2011 | Liao | |
| 2011/0073104 A1 | 3/2011 | Dopp et al. | |
| 2011/0132353 A1* | 6/2011 | Gumm | H02S 30/20 126/680 |
| 2011/0278411 A1 | 11/2011 | Carbonare et al. | |
| 2012/0006386 A1 | 1/2012 | Klinga et al. | |
| 2012/0073565 A1* | 3/2012 | Grant | F24S 25/617 126/606 |
| 2012/0091077 A1 | 4/2012 | Zuritis | |
| 2012/0180845 A1 | 7/2012 | Cole et al. | |
| 2013/0269752 A1 | 10/2013 | Corio | |
| 2013/0269753 A1 | 10/2013 | Corio | |
| 2014/0048124 A1 | 2/2014 | Park et al. | |
| 2014/0130847 A1 | 5/2014 | West et al. | |
| 2014/0216522 A1 | 8/2014 | Au | |
| 2015/0000721 A1 | 1/2015 | Au | |
| 2015/0000722 A1 | 1/2015 | Au | |
| 2015/0092383 A1 | 4/2015 | Corio et al. | |
| 2015/0236636 A1 | 8/2015 | Sade | |
| 2019/0036478 A1 | 1/2019 | Liu et al. | |

FOREIGN PATENT DOCUMENTS

| | | |
|---|---|---|
| KR | 10-0896332 B1 | 5/2009 |
| WO | WO 2012/076949 A1 | 6/2012 |

OTHER PUBLICATIONS

Office Action from Japanese Patent Office for Application No. 2015-545918 dated Jun. 9, 2017.
International Search Report and Written Opinion for PCT/US2013/073948, filed on Dec. 9, 2013.
Non-Final Office Action issued in U.S. Appl. No. 15/890,934 dated Apr. 25, 2019.
India Office Action for application No. 4839/DELNP/2015 dated May 25, 2018, 6 pages.
Notice of Allowance issued in U.S. Appl. No. 16/234,723 dated Jun. 5, 2019, 22 pages.
U.S. Office Action issued in U.S. Appl. No. 15/694,647 dated Jun. 25, 2019, 31 pages.
U.S. Office Action issued in U.S. Appl. No. 15/694,647 dated Dec. 26, 2019, 18 pages.
U.S. Patent Office Action issued in U.S. Appl. No. 15/974,553 dated Mar. 5, 2020.
Advisory Action issued in U.S. Appl. No. 15/948,960 dated Sep. 12, 2019, 5 pages.
Notice of Allowance issued in U.S. Appl. No. 15/974,553 dated Dec. 17, 2020, 8 pages.
Advisory Action issued in U.S. Appl. No. 15/694,647 dated Jan. 28, 2021, 12 pages.
U.S. Office Action issued in U.S. Appl. No. 15/694,647 dated Jul. 20, 2020, 19 pages.
U.S. Office Action issued in U.S. Appl. No. 15/890,934 dated Jun. 29, 2020, 22 pages.
U.S. Office Action issued in U.S. Appl. No. 15/948,960 dated Jun. 16, 2020, 34 pages.
U.S. Office Action issued in U.S. Appl. No. 15/948,960 dated Jun. 16, 2020.

* cited by examiner

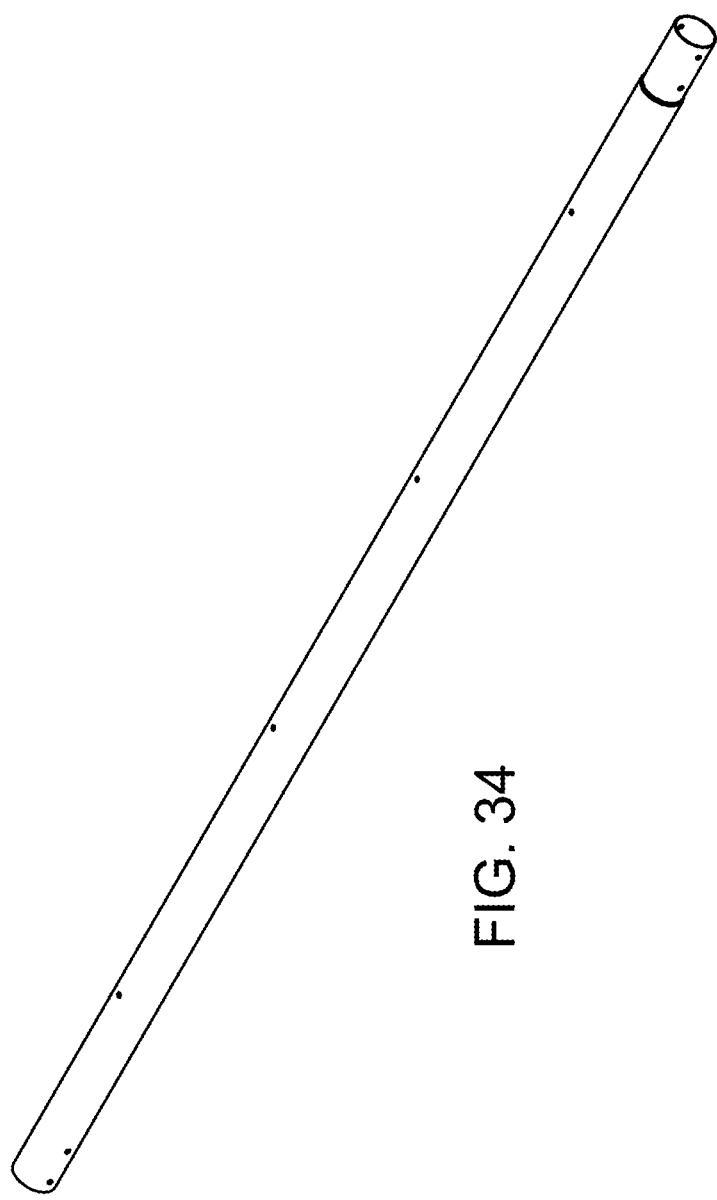
FIG. 34
FIG. 35

HORIZONTAL BALANCED SOLAR TRACKER

CROSS-REFERENCE TO RELATED APPLICATIONS

The present invention is a continuation of U.S. patent application Ser. No. 14/101,273, filed on Dec. 9, 2013, which is a non-provisional of U.S. Provisional Application No. 61/735,537 filed Dec. 10, 2012, which is incorporated by reference herein for all purposes.

BACKGROUND

The present application relates generally to a tracking system for solar panels. More specifically, embodiments of the present invention provide tracking systems that are suitable for solar panels. In a specific embodiment, a tracking system according to the present invention is fully adjustable in at each of the pillars, among other aspects. There are other embodiments as well.

As the population of the world increases, industrial expansion has led to an equally large consumption of energy. Energy often comes from fossil fuels, including coal and oil, hydroelectric plants, nuclear sources, and others. As an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use come from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies have been developed to capture solar energy, concentrate it, store it, and convert it into other useful forms of energy.

Solar panels have been developed to convert sunlight into energy. As an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still limitations. Often, solar panels are unable to convert energy at their full potential due to the fact that the sun is often at an angle that is not optimum for the solar cells to receive solar energy. In the past, various types of conventional solar tracking mechanisms have been developed. Unfortunately, conventional solar tracking techniques are often inadequate. These and other limitations are described throughout the present specification, and may be described in more detail below.

From the above, it is seen that techniques for improving solar systems are highly desirable.

SUMMARY OF THE INVENTION

The present application relates generally to a tracking system for solar panels. More specifically, embodiments of the present invention provide tracking systems that are suitable for solar panels. In a specific embodiment, a tracking system according to the present invention is fully adjustable in at each of the pillars, among other aspects. There are other embodiments as well.

In an example, the present invention provides a solar tracker apparatus. In an example, the apparatus comprises a center of mass with an adjustable hanger assembly configured with a clam shell clamp assembly on the adjustable hanger assembly and a cylindrical torque tube comprising a plurality of torque tubes configured together in a continuous length from a first end to a second end such that the center of mass is aligned with a center of rotation of the cylindrical torque tubes to reduce a load of a drive motor operably coupled to the cylindrical torque tube. Further details of the present example, among others, can be found throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 34 and 35 are simplified side view diagrams of a torque tube according to an embodiment of the present invention.

DESCRIPTION OF THE SPECIFIC EMBODIMENTS

Figure 1:
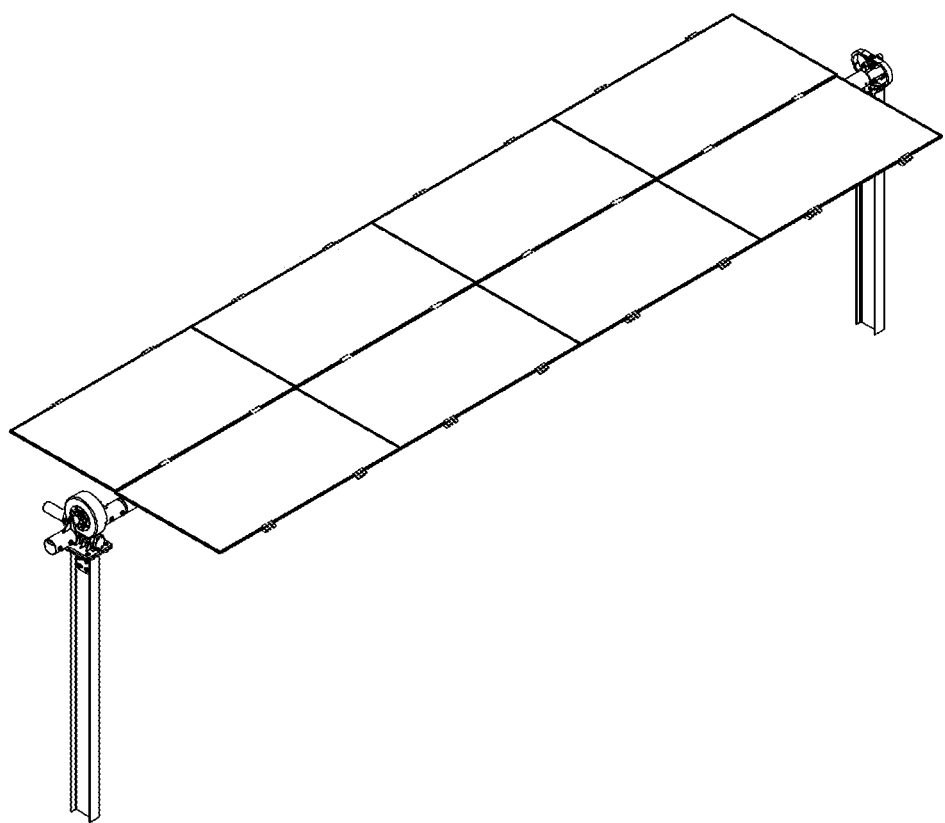
FIG. 1 is a simplified perspective view of a horizontal tracker apparatus configured with a plurality of solar modules according to an embodiment of the present invention.
Figure 2:
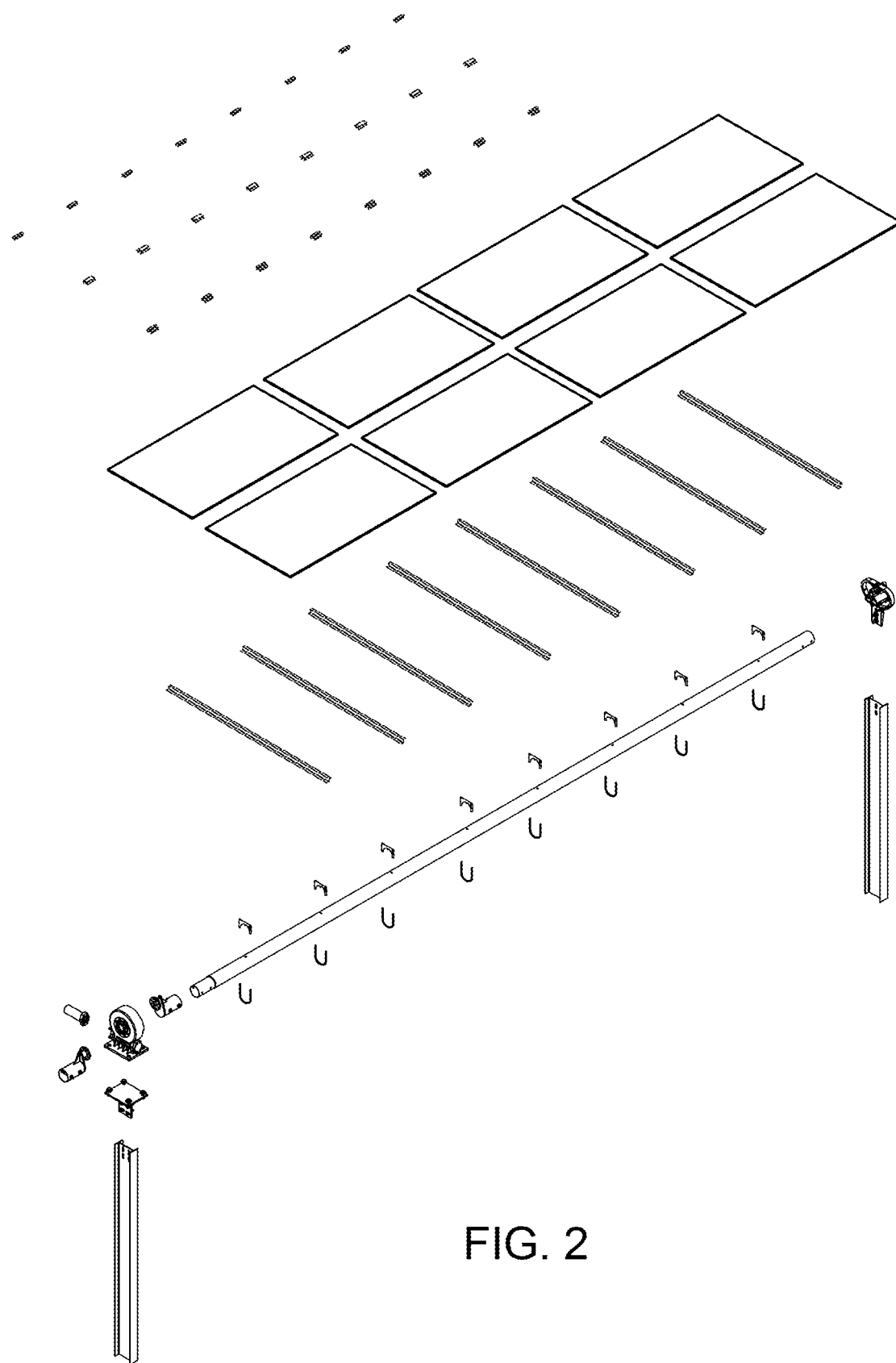
FIGS. 2 through 7 illustrate a method of assembling the horizontal tracker apparatus of FIG. 1.
Figure 3:
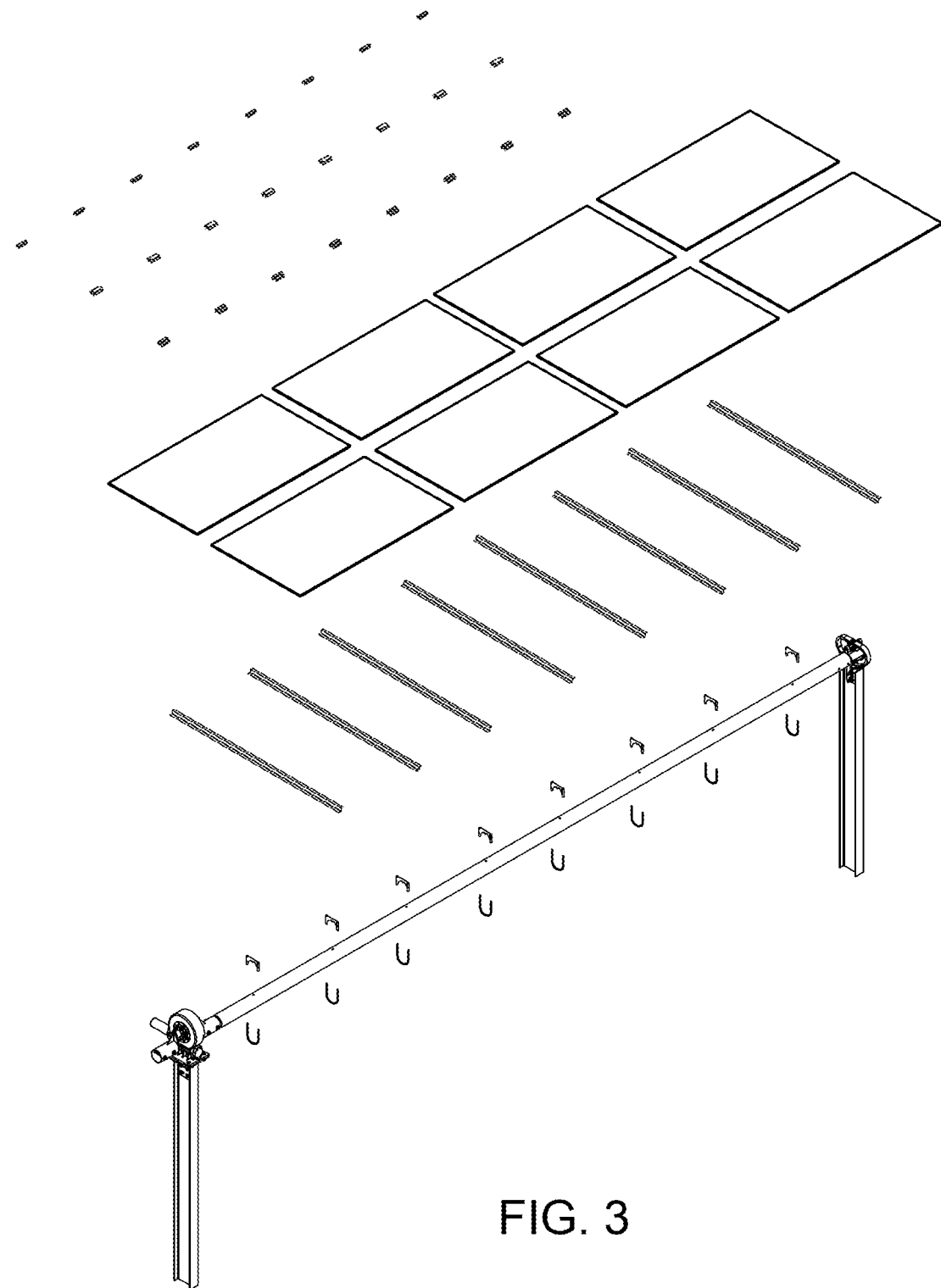
Figure 4:
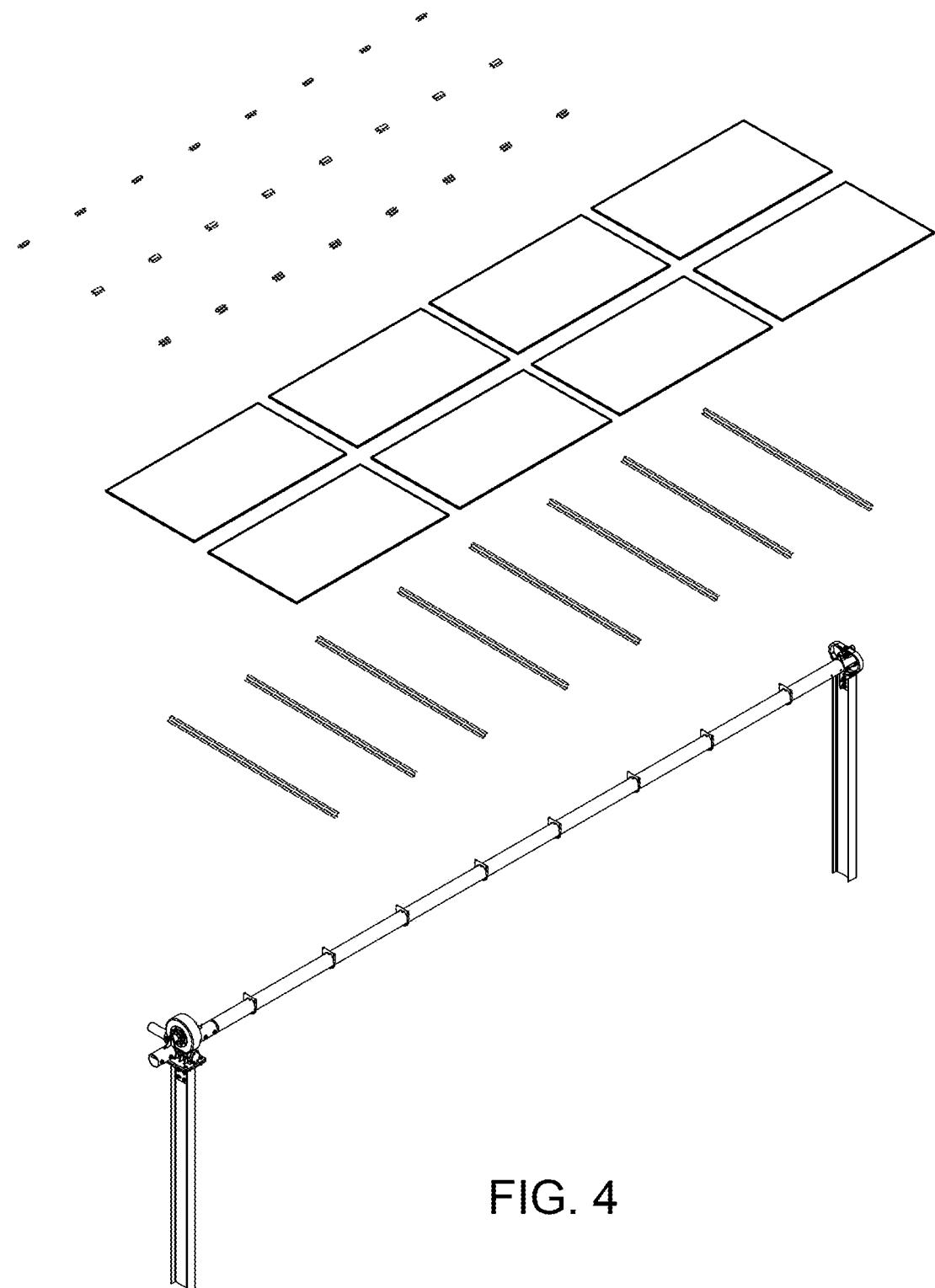
Figure 5:
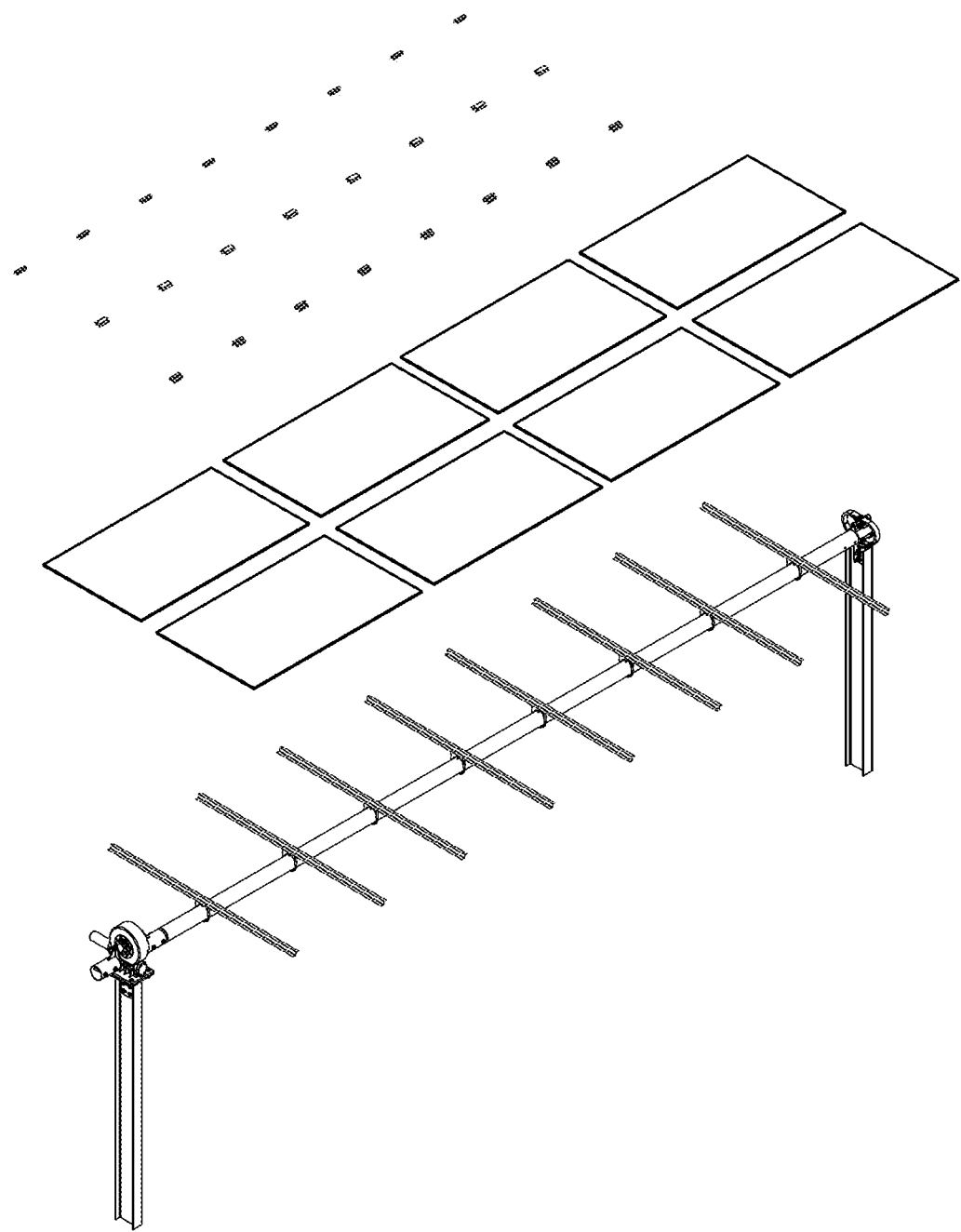
Figure 6:
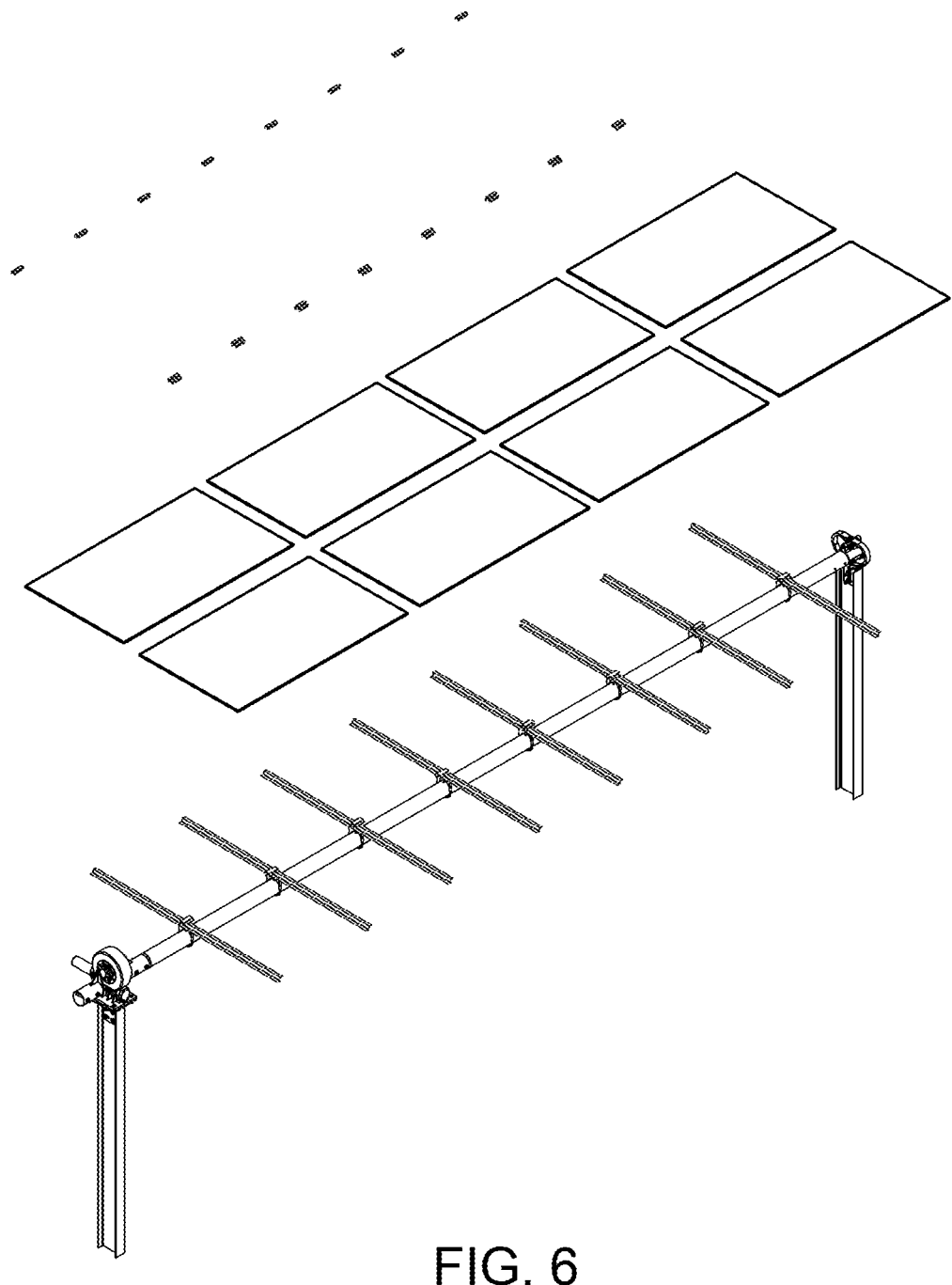
Figure 7:
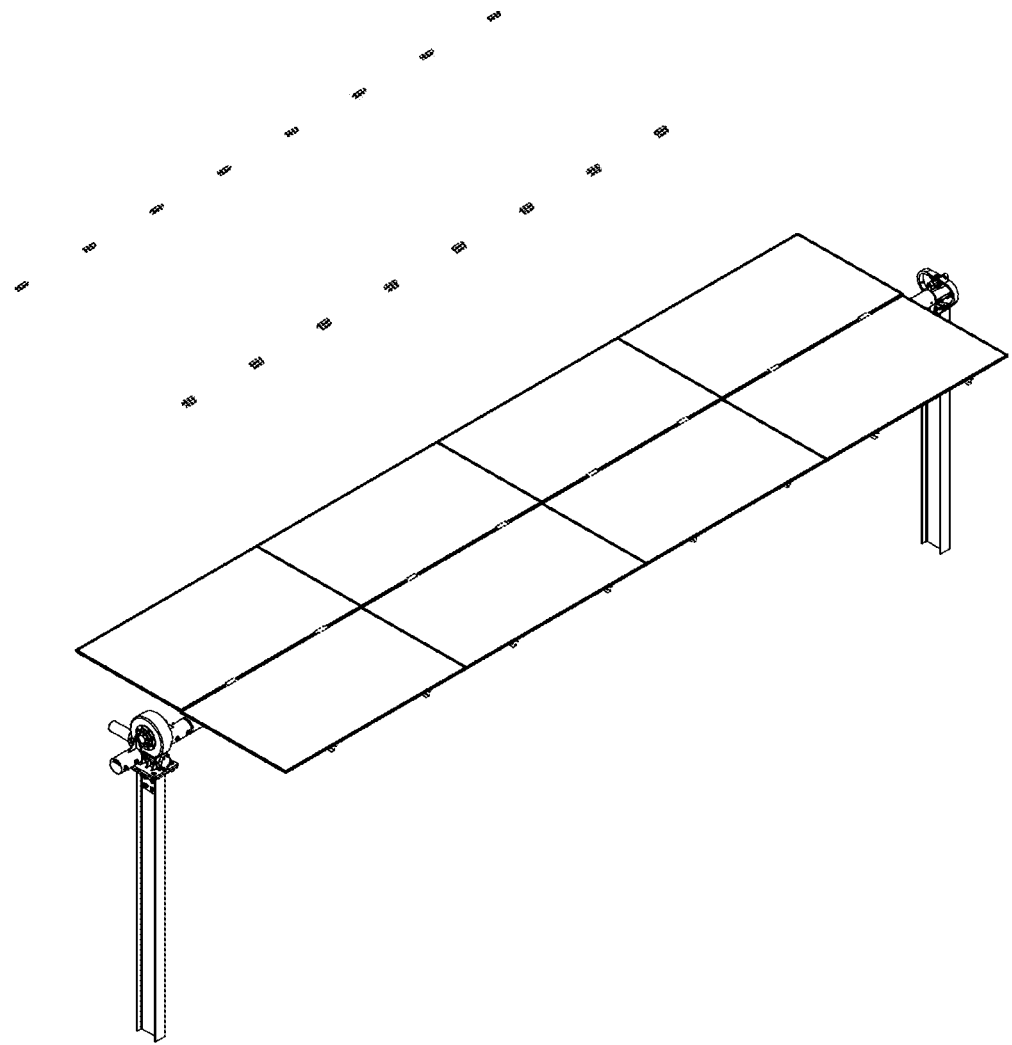

The present application relates generally to a tracking system for solar panels. More specifically, embodiments of the present invention provide tracking systems that are suitable for solar panels. In a specific embodiment, a tracking system according to the present invention is fully adjustable in at each of the pillars, among other aspects. There are other embodiments as well.

In a specific embodiment, the present invention provides a tracker apparatus for solar modules. The tracker apparatus has a first pier comprising a first pivot device and a second pier comprising a drive mount. The drive mount is capable for construction tolerances in at least three-axis, and is configured to a drive device. The drive device has an off-set clamp device coupled to a cylindrical bearing device coupled to a clamp member. The apparatus has a cylindrical torque tube operably disposed on the first pier and the second pier. The cylindrical torque tube comprises a first end and a second end, and a notch. The notch is one of a plurality of notches spatially disposed along a length of the cylindrical torque tube. The apparatus has a clamp configured around an annular portion of the cylindrical torque tube and mate with the notch to prevent movement of the clamp. The clamp comprises a support region configured to support a portion of a solar module.

In an alternative embodiment, the present invention provides an alternative solar tracker apparatus. The apparatus has a drive device, a crank coupled to the drive device and configured in an offset manner to a frame assembly. The frame assembly is coupled to a plurality of solar modules.

In an example, the apparatus has a continuous torque tube spatially disposed from a first region to a second region. The crank comprises a first crank coupled to a first side of the drive device and a second crank coupled to a second side of the drive device. The crank comprises a first crank coupled to a first side of the drive device and a second crank coupled to a second side of the drive device; and further comprises a first torque tube coupled to the first crank and a second torque tube coupled to the second crank. The crank comprises a first crank coupled to a first side of the drive device and a second crank coupled to a second side of the drive device; and further comprises a first torque tube coupled to the first crank and a second torque tube coupled to the second crank, and further comprises a first swage fitting coupling the first crank to the first torque tube and a second swage fitting coupling the second crank to the second torque tube. The apparatus also has a pier coupled to the drive device. In an example, the apparatus also has a drive mount coupled to a pier.

In an alternative embodiment, the present invention provides an alternative solar tracker apparatus. The apparatus has a center of mass with an adjustable hanger assembly configured with a clam shell clamp assembly on the adjustable hanger assembly and a cylindrical torque tube comprising a plurality of torque tubes configured together in a continuous length from a first end to a second end such that the center of mass is aligned with a center of rotation of the cylindrical torque tubes to reduce a load of a drive motor operably coupled to the cylindrical torque tube.

In an example, the drive motor is operable to move the torque tube about the center of rotation and is substantially free from a load. The center of rotation is offset from a center of the cylindrical torque tube.

In an alternative embodiment, the present invention provides a solar tracker apparatus. The apparatus has a clamp housing member configured in a upright direction. The clamp housing member comprises a lower region and an upper region. The lower region is coupled to a pier structure, and the upper region comprises a spherical bearing device. The upright direction is away from a direction of gravity. The apparatus has a clam shell clamp member coupled to the cylindrical bearing and a torque tube coupled to the spherical bearing to support the torque tube from the upper region of the clamp housing member. The torque tube is configured from an off-set position from a center region of rotation.

In an example, the apparatus is configured substantially free from any welds during assembly. Reduced welding lowers cost, improves installation time, avoids errors in installation, improves manufacturability, and reduces component count through standardized parts. The torque tube is coupled to another torque tube via a swage device within a vicinity of the clam shall clamp member. In an example, the connection is low cost, and provides for strong axial and torsional loading. The apparatus is quick to install with the pokey-yoke design. The torque tube is coupled to an elastomeric damper in line to dampen torque movement to be substantially free from formation of a harmonic waveform along any portion of a plurality of solar panels configured to the torque tube. The apparatus also has a locking damper or rigid structure to configure a solar panel coupled to the torque tube in a fixed tilt position to prevent damage to stopper and lock into a foundation-in a position that is substantially free from fluttering in an environment with high movement of air. The apparatus further comprises a controller apparatus configured in an inserter box provided in an underground region to protect the controller apparatus. The apparatus has a drive device to linearly actuate the torque tube. In an example, the apparatus uses an electrical connection coupled to a drive device. In an example, the spherical bearing allows for a construction tolerance, tracker movement, and acts as a bonding path of least resistance taking an electrical current to ground. The apparatus can be one of a plurality of tracker apparatus configured in an array within a geographic region. Each of the plurality of tracker apparatus is driven independently of each other to cause each row to stow independently at a different or similar angle.

Still further, the present invention provides a tracker apparatus comprising a clam shell apparatus, which has a first member operably coupled to a second member to hold a torque tube in place.

In an example, the apparatus also has a clamp housing operably coupled to the clam shell apparatus via a spherical bearing device such that the spherical bearing comprises an axis of rotation. The axis of rotation is different from a center of the torque tube. The apparatus further comprises a solar module coupled to the torque tube.

In an example, the invention provides a tracker apparatus comprising a plurality of torque tubes comprising a first torque tube coupled to a second torque tube coupled to an Nth torque tube, whereupon N is an integer greater than 2. Each pair of torque tubes is coupled to each other free from any welds.

In an example, each pair of torque tubes is swaged fitted together. Each of the torque tubes is cylindrical in shape. The plurality of torque tubes is characterized by a length greater than 80 meters. Each of the torque tubes comprises a plurality of notches. In an example, the apparatus also has a plurality of U-bolt devices coupled respectively to the plurality of notches. The plurality of torque tubes are made of steel.

In an alternative embodiment, the present invention provides a tracker apparatus having a pier member comprising a lower region and an upper region. A clamp holding member is configured to the upper region and is capable of moving in at least a first direction, a second direction opposite to the first direction, a third direction normal to the first direction and the second direction, a fourth direction opposite of the third direction, a fifth direction normal to the first direction, the second direction, the third direction, and the fourth direction, and a sixth direction opposite of the fifth direction.

In yet an alternative embodiment, the present invention provides a solar tracker apparatus. The apparatus has a clamp housing member configured in a upright direction. The clamp housing member comprises a lower region and an upper region. The lower region is coupled to a pier structure. The upper region comprises a spherical bearing device. The upright direction is away from a direction of gravity. The apparatus has a clam shell clamp member coupled to the cylindrical bearing and the clam shell clamp being suspended from the cylindrical bearing. In an example, the apparatus has a torque tube comprising a first end and a second end. The first end is coupled to the spherical bearing to support the torque tube from the upper region of the clamp housing member. The torque tube is configured from an off-set position from a center region of rotation. The apparatus has a drive device coupled to the second end such that the drive device and the torque tube are configured to be substantially free from a twisting action while under a load, e.g., rotation, wind, other internal or external forces. Further details of the present examples can be found throughout the present specification and more particularly below.

FIG. 1 is a simplified perspective view of a horizontal tracker apparatus configured with a plurality of solar modules according to an embodiment of the present invention. As shown, the present invention provides a tracker apparatus for solar modules. In an example, the solar modules can be a silicon based solar module, a polysilicon based solar module, a concentrated solar module, or a thin film solar module, including cadmium telluride (CdTe), copper indium gallium selenide (CuIn1-xGaxSe2 or CIGS), which is a direct bandgap semiconductor useful for the manufacture of solar cells, among others. As shown, each of the solar panels can be arranged in pairs, which form an array. Of course, there can be other variations. In an example, the first pier and the second pier are provided on a sloped surface, an irregular surface, or a flat surface. The first pier and the second pier are two of a plurality of piers provided for the apparatus. In example, the apparatus has a solar module configured in a hanging position or a supporting position.

The tracker apparatus has a first pier comprising a first pivot device and a second pier comprising a drive mount. In an example, the first pier is made of a solid or patterned metal structure, such as a wide beam flange or the like, as shown. In an example, each of the piers is inserted into the ground, and sealed, using cement or other attachment material. Each pier is provided in generally an upright position and in the direction of gravity, although there can be variations. In an example, each of the piers is spatially spaced along a region of the ground, which may be flat or along a hillside or other structure, according to an embodiment. In an example, the first pillar comprises a wide flange beam. In an example, the first pillar and the second pillar can be off-set and reconfigurable.

In an example, the drive mount is capable for construction tolerances in at least three-axis, and is configured to a drive device. The drive device has an off-set clamp device coupled to a cylindrical bearing device coupled to a clamp member.

In an example, the apparatus has a cylindrical torque tube operably disposed on the first pier and the second pier. In an example, the cylindrical torque tube comprises a one to ten inch diameter pipe made of Hollow Structure Steel (HSS) steel. The cylindrical torque tube comprises a first end and a second end, and a notch. The notch is one of a plurality of notches spatially disposed along a length of the cylindrical torque tube.

In an example, the apparatus has a clamp configured around an annular portion of the cylindrical torque tube and mate with the notch to prevent movement of the clamp. The clamp comprises a support region configured to support a portion of a solar module. The clamp comprises a pin configured with the notch. The apparatus also has a rail configured to the clamp. The rail comprises a thread region configured to hold a bolt, which is adapted to screw into the thread and bottom out against a portion of cylindrical torque tube such that the clamp is desirably torqued against the cylindrical torque tube. The apparatus has a solar module attached to the rail or other attachment device-shared module claim or other devices. The cylindrical torque tube is one of a plurality of torque tubes configured in as a continuous structure and extends in length for 80 to 200 meters. Each pair of torque tubes is swage fitted together, and bolted for the configuration.

In an example, the apparatus also has a center of mass of along an axial direction is matched with a pivot point of the drive device. The pivot point of the drive device is fixed in three dimensions while rotating along the center of mass. In an example, the off-set clamp comprises a crank device. The first pivot device comprises a spherical bearing configured a clam-shell clamp device to secure the first end to the cylindrical torque tube. In other examples, the drive device comprises a slew gear. The apparatus also has an overrun device configured with the first pivot device. The overrun device comprises a mechanical stop to allow the cylindrical torque tube to rotate about a desired range. Further details of the present tracker apparatus can be found throughout the present specification and more particularly below.

FIGS. 2 through 7 illustrate a method of assembling the horizontal tracker apparatus of FIG. 1. As shown, the method includes disposing a first pier into a first ground structure. The method also includes disposing a second pier into a second ground structure. Each of the piers is one of a plurality of piers to be spatially disposed along a ground structure for one row of solar modules configured to a tracker apparatus.

In an example, the method includes configuring a first pivot device on the first pier.

In an example, the method includes configuring a drive mount on the second pier. In an example, the drive mount is capable for construction tolerances in at least three-axis. In an example, the drive mount is configured to a drive device having an off-set clamp device coupled to a cylindrical bearing device coupled to a clamp member.

In an example, the method includes assembling a cylindrical torque tube and operably disposing on the first pier and the second pier cylindrical torque tube. The cylindrical torque tube comprises a first end and a second end, and a notch. In an example, the notch is one of a plurality of notches spatially disposed along a length of the cylindrical torque tube.

In an example, the method includes assembling a plurality of clamps spatially disposed and configured around an annular portion of the cylindrical torque tube. Each of the plurality of clamps is configured to mate with the notch to prevent movement of the clamp. In an example, the clamp comprises a support region configured to support a portion of a solar module.

In an example, the method includes attaching a rail configured to each of the clamps, the rail comprising a thread region configured to hold a bolt. The bolt is adapted to screw into the thread and bottom out against a portion of cylindrical torque tube such that the clamp is desirably torqued against the cylindrical torque tube.

In an example, the method includes attaching a solar module to the rail or other attachment device. Further details of other examples can be found throughout the present specification and more particularly below.

Figure 8:
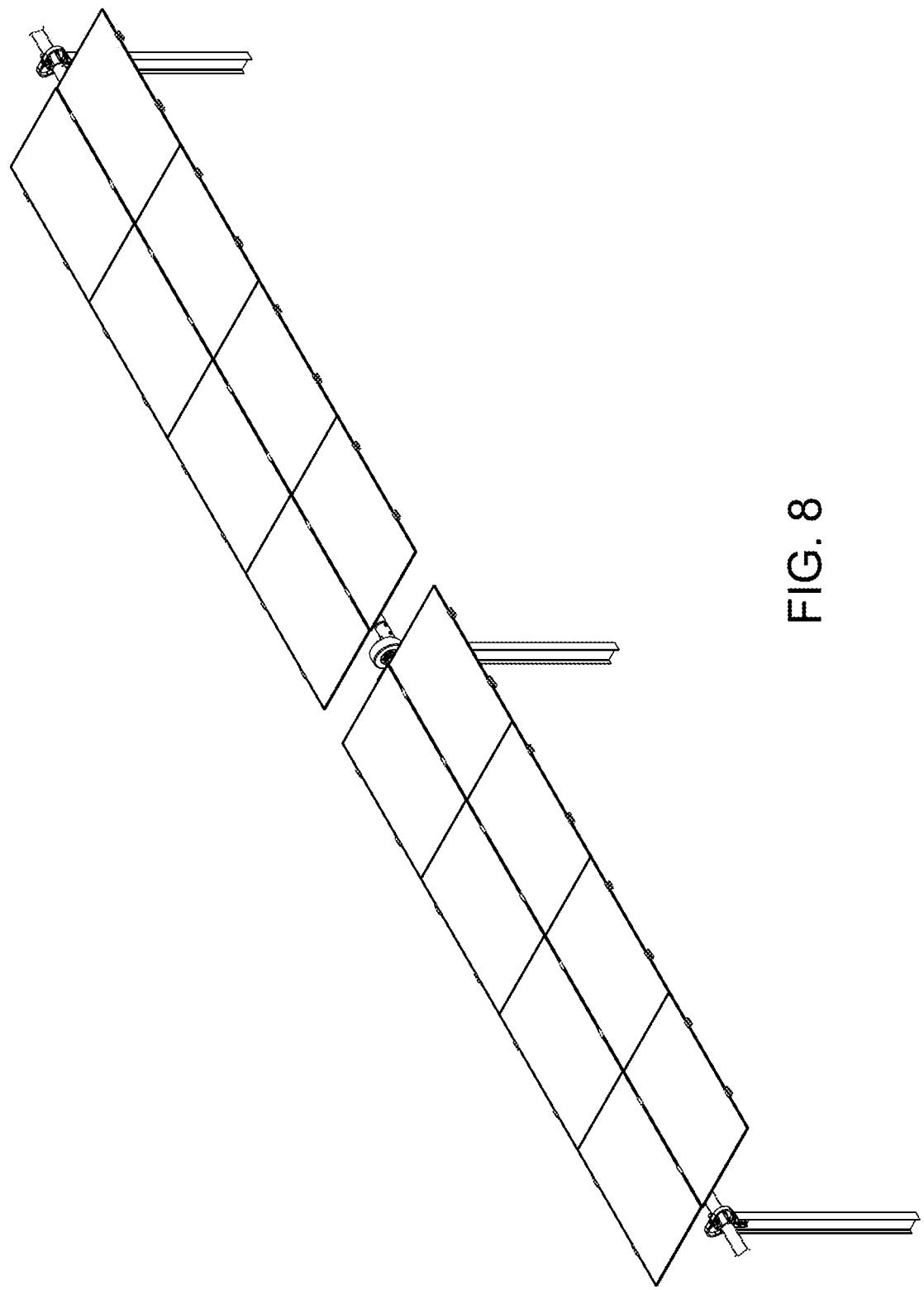
FIG. 8 is a simplified perspective view of a pair of horizontal tracker apparatus configured together with a plurality of solar panels according to an embodiment of the present invention.

FIG. 8 is a simplified perspective view of a pair of horizontal tracker apparatus configured together with a plurality of solar panels according to an embodiment of the present invention. As shown is a tracker apparatus for solar modules. The tracker apparatus has a first pier comprising a first pivot device, a second pier comprising a drive mount, and a third pier comprising a second pivot device. The second pier is between the first and third piers, as shown in an example. Of course, additional piers can be configured on each outer side of the first and third piers.

In an example, the drive mount is capable for construction tolerances in at least three-axis, and is configured to a drive device. The drive device has an off-set clamp device coupled to a cylindrical bearing device coupled to a clamp member.

In an example, the apparatus has a cylindrical torque tube operably disposed on the first pier and the second pier, and then on the third pier. In an example, the cylindrical torque tube comprises a first end and a second end, and a notch. The notch is one of a plurality of notches spatially disposed along a length of the cylindrical torque tube. The apparatus has a clamp configured around an annular portion of the cylindrical torque tube and mate with the notch to prevent movement of the clamp. The clamp comprises a support region configured to support a portion of a solar module. In an example, the cylindrical torque tube is configured to the drive device to rotate the cylindrical torque tube while each of the clamp members holds the tube in place. Further details of the present apparatus can be found throughout the present specification and more particularly below.

Figure 9:
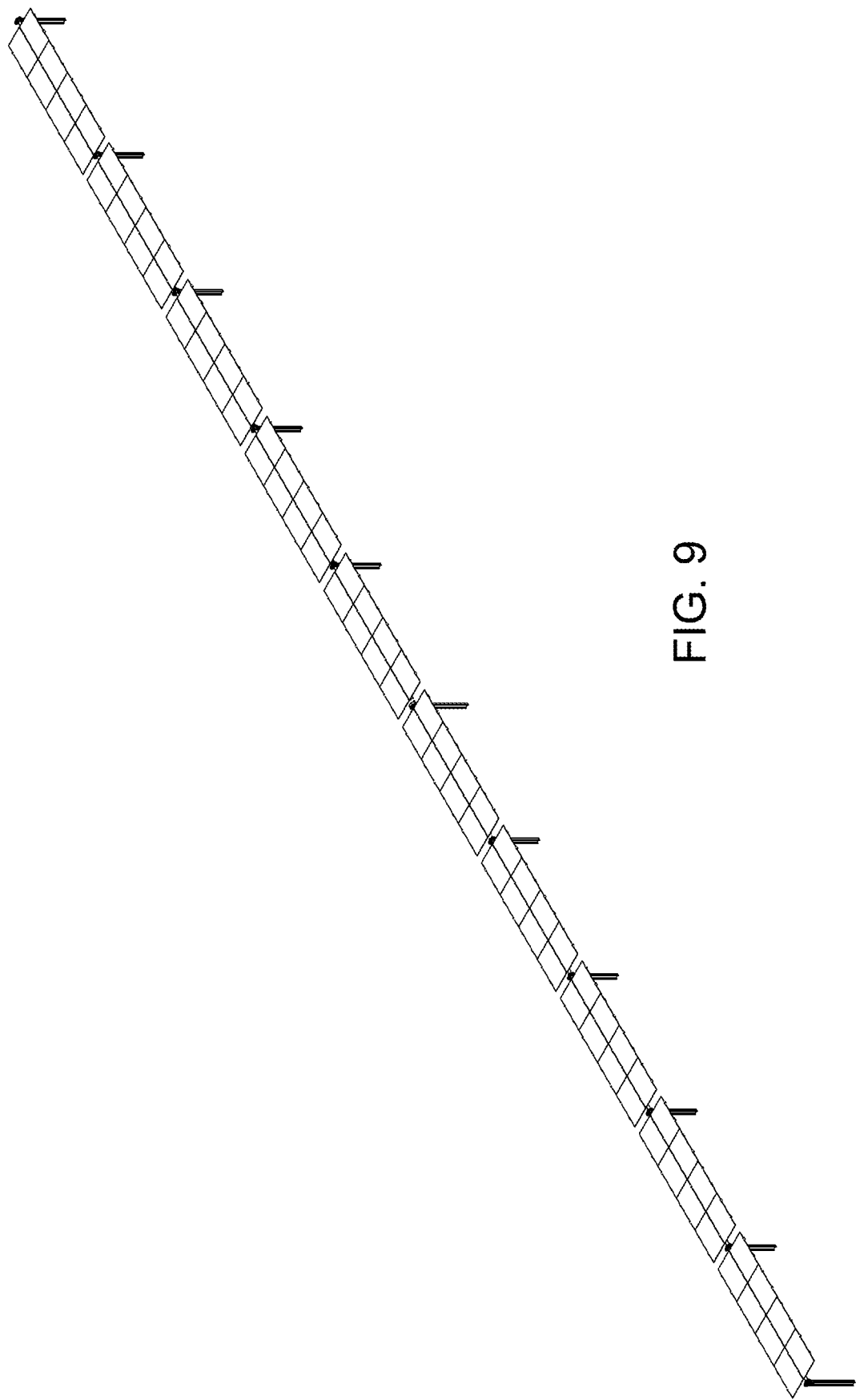
FIG. 9 is a simplified diagram of a plurality of horizontal tracker apparatus configured together according to an embodiment of the present invention.

FIG. 9 is a simplified diagram of a plurality of horizontal tracker apparatus configured together according to an embodiment of the present invention. As shown is a solar tracker apparatus. The apparatus has a center of mass with an adjustable hanger assembly configured with a clam shell clamp assembly on the adjustable hanger assembly and a cylindrical torque tube comprising a plurality of torque tubes configured together in a continuous length from a first end to a second end such that the center of mass is aligned with a center of rotation of the cylindrical torque tubes to reduce a load of a drive motor operably coupled to the cylindrical torque tube. In an example, the drive motor is operable to move the torque tube about the center of rotation and is substantially free from a load. The center of rotation is offset from a center of the cylindrical torque tube.

In an example, the invention provides a tracker apparatus comprising a plurality of torque tubes comprising a first torque tube coupled to a second torque tube coupled to an Nth torque tube, whereupon N is an integer greater than 2. Each pair of torque tubes is coupled to each other free from any welds.

In an example, a single drive motor can be coupled to a center region of the plurality of torque tubes to rotate the torque tube in a desirable manner to allow each of the solar modules to track a direction of electromagnetic radiation from the sun.

In an example, each tracker apparatus comprises a torque tube coupled to an array of solar panels, as shown. Each of the tracker apparatus is coupled to each other via the torque tube, and a pivot device. Each tracker has a corresponding pair of piers, a torque tube, and one or more pivot devices, as shown. Further details of each of these elements are described in detail throughout the present specification.

Figure 10:
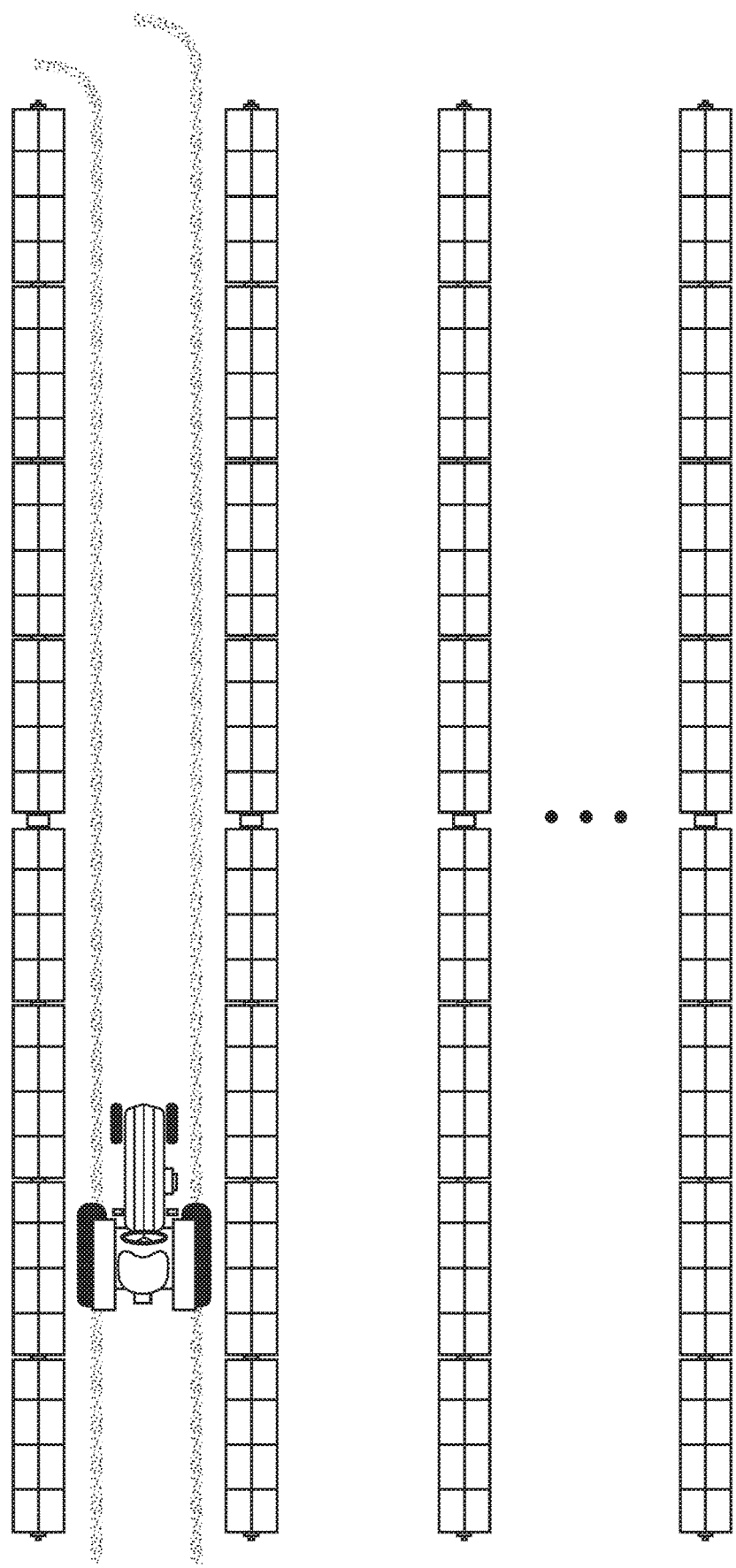
FIG. 10 is a simplified diagram of an array of a plurality of horizontal tracker apparatus configured together according to an embodiment of the present invention.

FIG. 10 is a simplified diagram of an array of a plurality of horizontal tracker apparatus configured together according to an embodiment of the present invention. As shown are an array of horizontally configured tracker devices to form a plurality of rows of tracker devices arranged in a parallel manner. Each pair of rows of trackers has an avenue, which allows for other applications. That is, row crops or other things can be provided in the avenue, which extends along an entirety of each horizontal tracker row. In an example, the plurality of tracker apparatus are configured in an array within a geographic region. Each of the plurality of tracker apparatus is driven independently of each other to cause each row to stow independently at a different or similar angle. Unlike conventional trackers, which often have mechanical device between the rows, each of the avenues is continuous from one end to the other end, as allows for a tractor or other vehicle to drive from one end to the other end in a preferred example. Of course, there can be other variations, modifications, and alternatives.

In an example, the apparatus is configured substantially free from any welds during assembly, and can be assembled using conventional tools. In an example, the torque tube is coupled to another torque tube via a swage device within a vicinity of the clam shall clamp member. In an example, the torque tube is coupled to an elastomeric damper in line to dampen torque movement to be substantially free from formation of a harmonic waveform along any portion of a plurality of solar panels configured to the torque tube.

In an example, the apparatus further comprising a locking damper or rigid structure to configure a solar panel coupled to the torque tube in a fixed tilt position to prevent damage to stopper and lock into a foundation-in a position that is substantially free from fluttering in an environment with high movement of air. In an example, the locking damper fixes each of the plurality of solar modules in a desirable angle relative to the direction of air or wind.

In an example, the apparatus has a controller apparatus configured in an inserter box provided in an underground region to protect the controller apparatus. In an example, the inserter box is made of a suitable material, which is sealed and/or environmentally suitable to protect the controller apparatus.

In operation, the apparatus has a drive device to linearly actuate the torque tube to allow for desirable positions of each of the solar modules relative to incident electromagnetic radiation. In an example, an electrical connection and source (e.g., 120V, 60 Hz, 240V) is coupled to a drive device. Of course, there can be variations.

Figure 11:
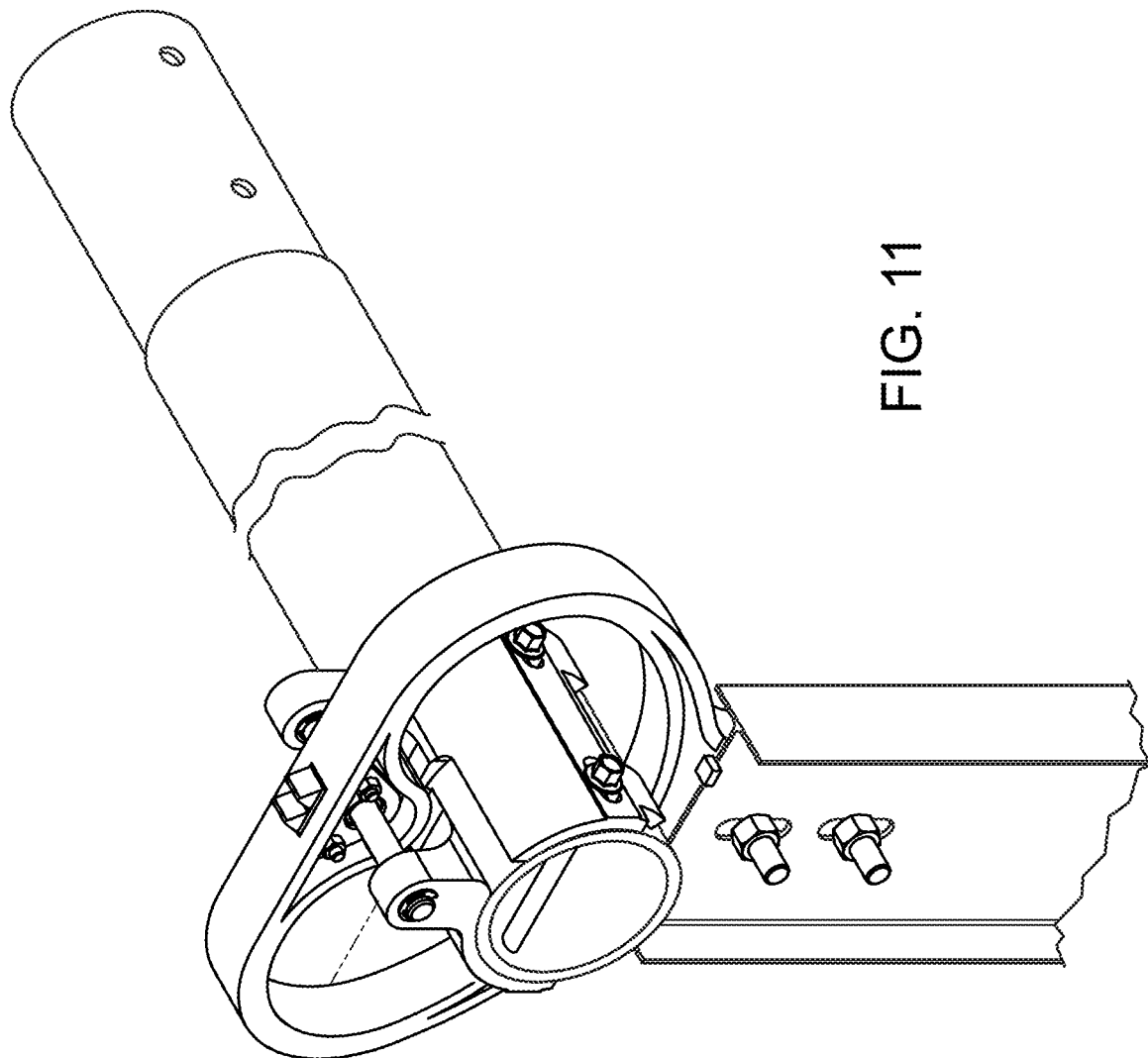
FIG. 11 is a simplified diagram of a clamp assembly for the horizontal tracker of FIG. 1 according to an embodiment of the present invention.

FIG. 11 is a simplified diagram of a clamp assembly for the horizontal tracker of FIG. 1 according to an embodiment of the present invention. As shown, the clamp assembly has a clamp housing member configured in a upright direction, which is a direction away from a direction of gravity. In an example, the clamp housing member comprises a lower region and an upper region. The lower region is coupled to a pier structure. The lower region has a thickness of material comprising bolt openings, which align to openings on an upper portion of the pier structure. Locking nuts and bolts are configured to hold the lower region of the clamp housing to the pier structure in an upright manner. At least a pair of openings are provided in each of the lower region of the clamp housing and the pier structure, as shown.

In an example, the upper region comprises a spherical bearing device. The upper region has a tongue structure, which has an opening that houses the spherical bearing between a pair of plates, which hold the bearing in place. In an example, the spherical bearing allows for rotational, and movement in each of the three axis directions within a desirable range. Each of the plates is disposed within a recessed region on each side of the tongue structure. Each of the plates may include a fastener to hold such plate in place within the recessed region.

In an example, clamp assembly has a clam shell clamp member coupled to the spherical bearing and the clam shell clamp being suspended from the spherical bearing. That is, the clam shell clamp has a first side and a second side. Each side has an upper region comprising an opening. A pin is inserted through each of the openings, while an opening of the spherical bearing is provided as a third suspension region between each of the openings, as shown.

Each side of the clam shell is shaped to conform or couple to at least one side of a portion of the torque tube, as shown. Each side has one or more opens, which align to one or more openings on the portion of the torque tube. A pin or bolt is inserted through each of the openings to clamp the clam shell clamp to the portion of the torque tube and surround substantially an entirety of a peripheral region of the torque tube. The pin or bolt or pins or bolts also holds the torque tube in a fixed position relative to the clam shell clamp to prevent the torque tube from slipping and/or twisting within the clam shell clamp. Of course, there can be variations.

In an example, the spherical bearing allows for a construction tolerance, tracker movement, and acts as a bonding path of least resistance taking an electrical current to ground. The bonding path occurs from any of the modules, through the frame, to each of the clamp assembly, to one or more piers, and then to ground.

In an example, a torque tube comprising a first end and a second end is coupled to the spherical bearing to support the torque tube from the upper region of the clamp housing member. In an example, the torque tube is configured from an off-set position from a center region of rotation.

In an example, a drive device, which will be described in more detail below, is coupled to the second end such that the drive device and the torque tube are configured to be substantially free from a twisting action while under a load.

In an example, the clam shell apparatus comprising a first member operably coupled to a second member to hold a torque tube in place. In an example, the apparatus has a clamp housing operably coupled to the clam shell apparatus via a spherical bearing device such that the spherical bearing comprises an axis of rotation, which is different from a center of the torque tube.

Figure 12:
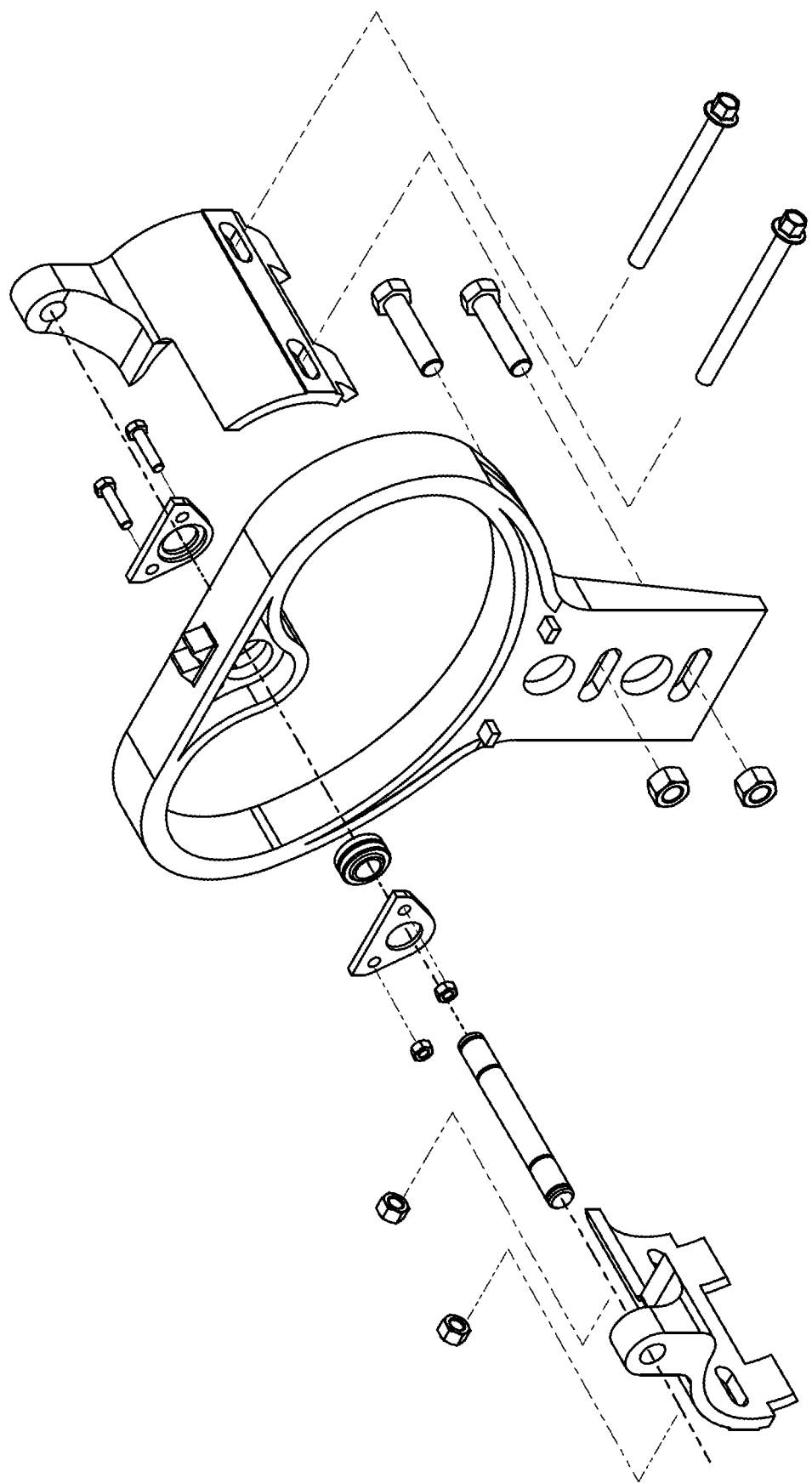
FIGS. 12 through 14 are simplified diagrams illustrating a method for assembling the clamp assembly of FIG. 11.
Figure 13:
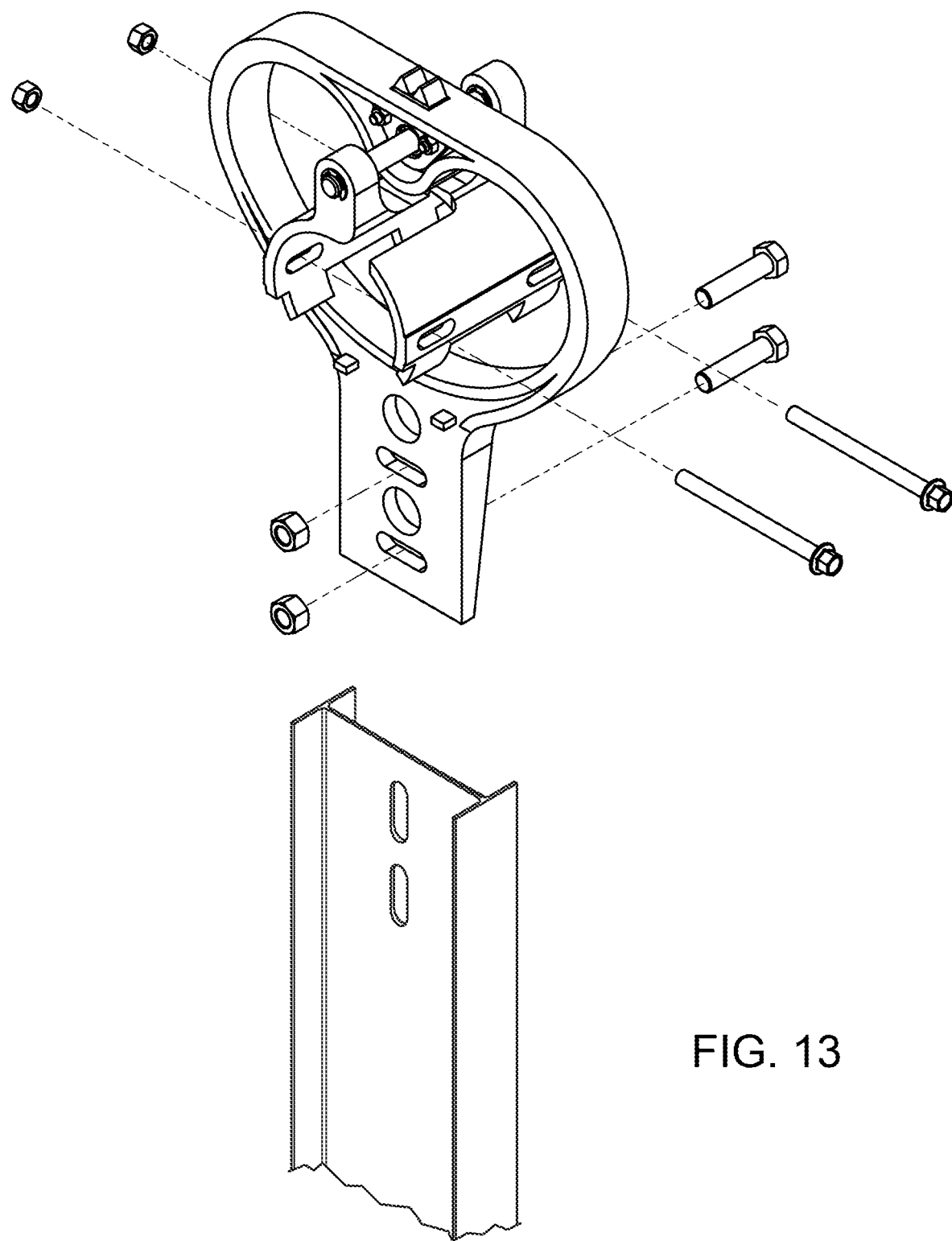
Figure 14:
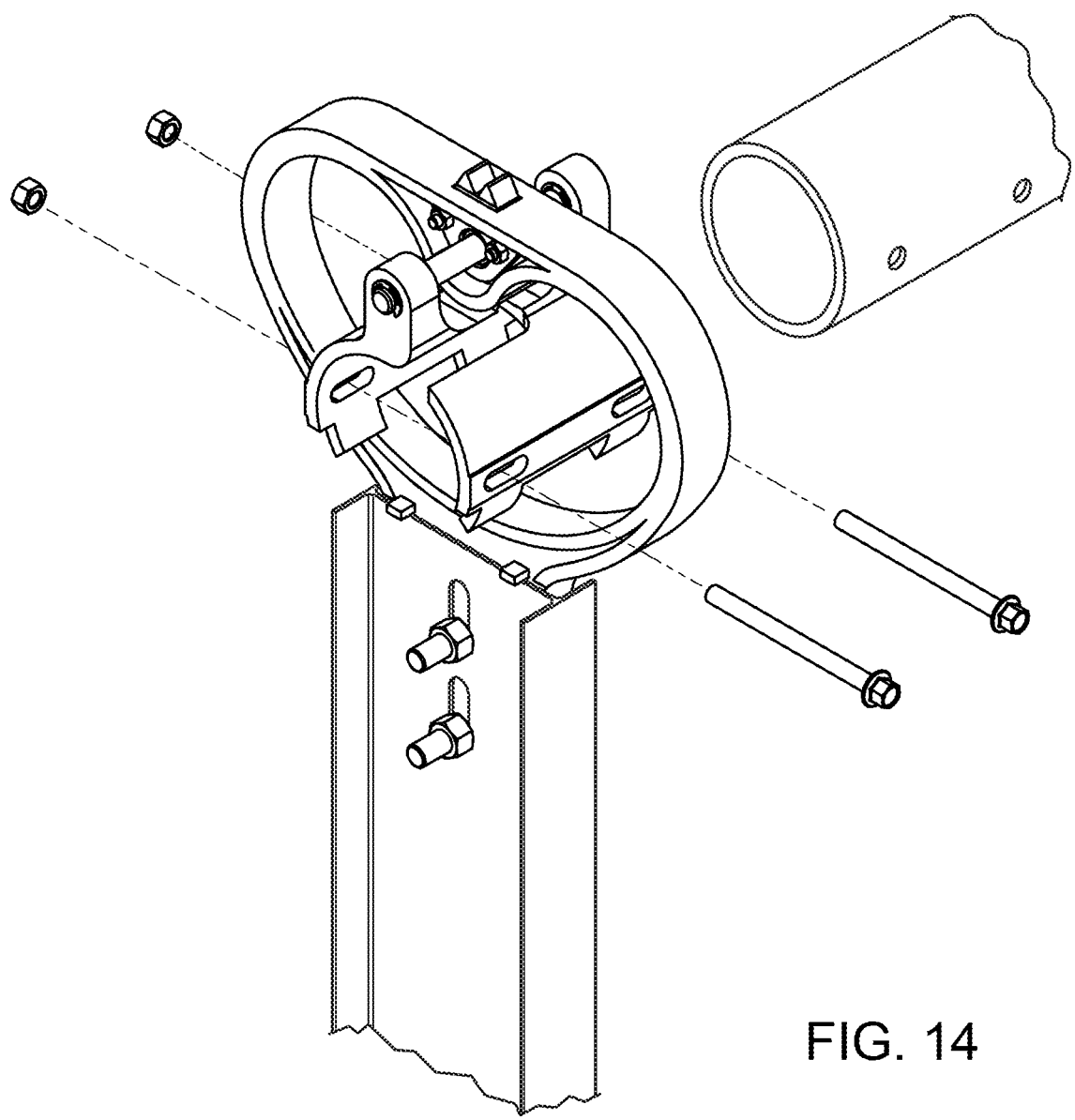

FIGS. 12 through 14 are simplified diagrams illustrating a method for assembling the clamp assembly of FIG. 11. In an example, the present method is for assembling a solar tracker apparatus. The method includes providing a clamp housing member configured in a upright direction. The clamp housing member comprises a lower region and an upper region. In an example, the lower region is coupled to a pier structure. The upper region comprises a spherical bearing device. In an example, the upright direction is away from a direction of gravity. In an example, the method includes coupling a first half clam shell clamp member and a second half clam shell clamp member (collectively a clam shell clamp member) to the cylindrical bearing. The method also includes supporting a torque tube between the first half clam shell clamp and the second half clam shell clamp, each of which is coupled to the spherical bearing to support the torque tube from the upper region of the clamp housing member, the torque tube being configured from an off-set position from a center region of rotation.

In an example, the apparatus is configured substantially free from any welds during assembly. In an example, the torque tube is coupled to another torque tube via a swage device within a vicinity of the clam shell clamp member. In an example, the torque tube is coupled to an elastomeric damper in line to dampen torque movement to be substantially free from formation of a harmonic waveform along any portion of a plurality of solar panels configured to the torque tube.

In an example, the method includes coupling a pin member to the first half clam shell clamp member, the second half clam shell clamp member, and the spherical bearing. In an example, the method includes coupling a first member and a second member to sandwich the spherical bearing to a tongue region of the upper region of the clamp housing member. In an example, the spherical bearing is configured for rotation, and movement of the pin to pivot along a solid angle region. In an example, the housing clamp member is a continuous structure made of cast or stamped or machined metal material. In an example, each of the first half clam shell member and the second half claim shell member is made of a solid continuous structure that is cast or stamped or machined metal material. In an example, the spherical bearing allows for a construction tolerance, tracker movement, and acting as a bonding path of least resistance taking an electrical current to ground. Further details of the present method and apparatus can be found throughout the present specification and more particularly below.

Figure 15:
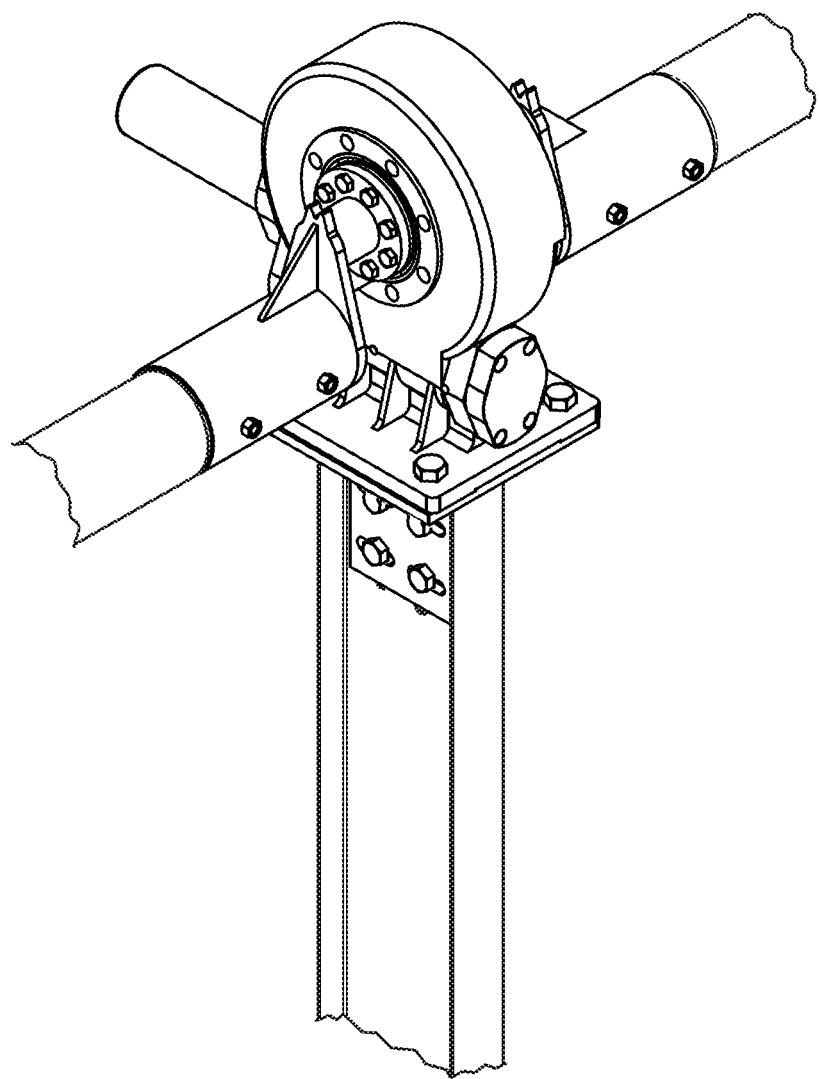
FIG. 15 is a simplified perspective diagram of a drive assembly configured on a pier member according to an embodiment of the present invention.
Figure 16:
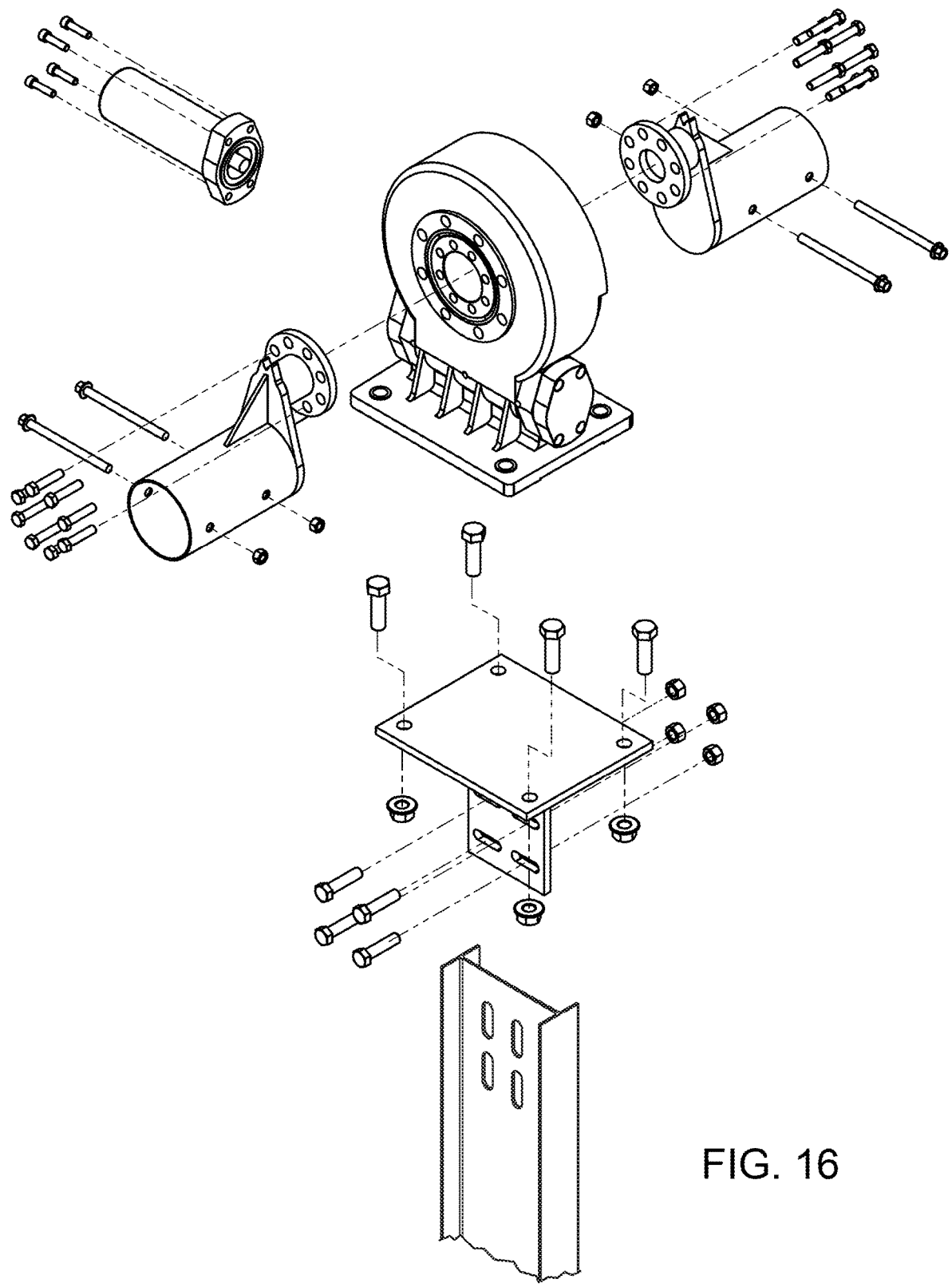
FIGS. 16 through 19 are simplified diagrams illustrating a method for assembling the drive assembly of FIG. 15.
Figure 17:
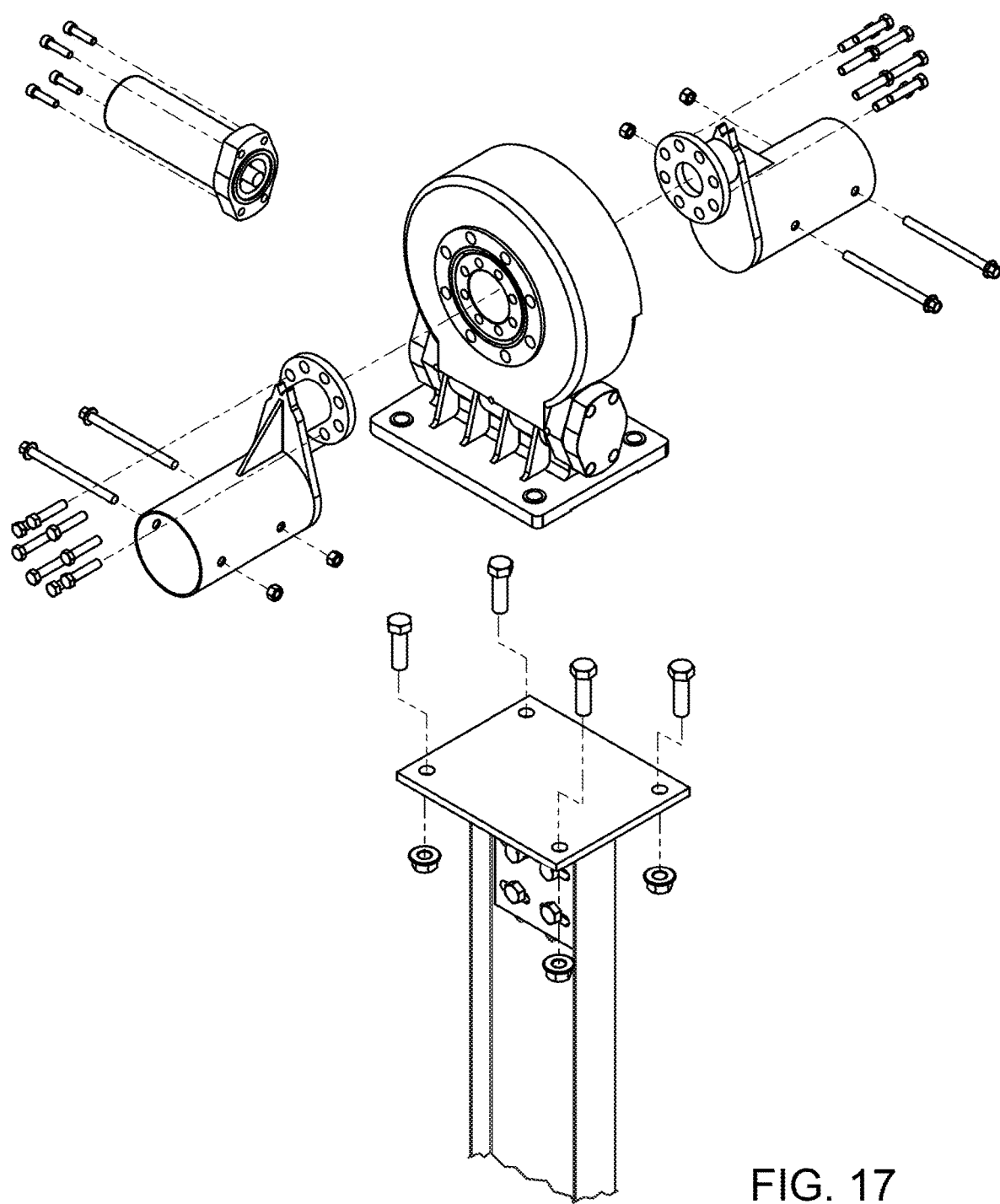
Figure 18:
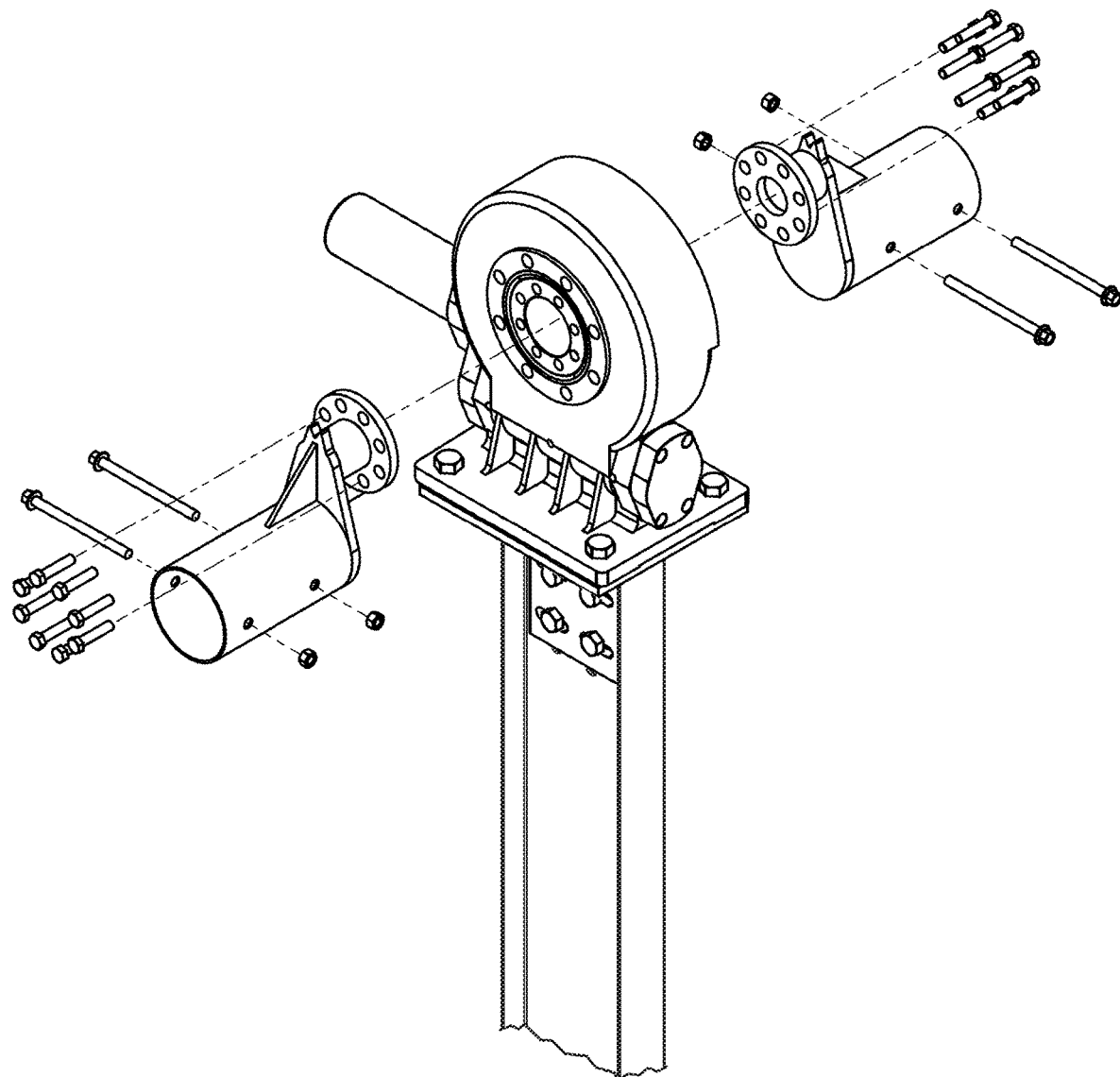
Figure 19:
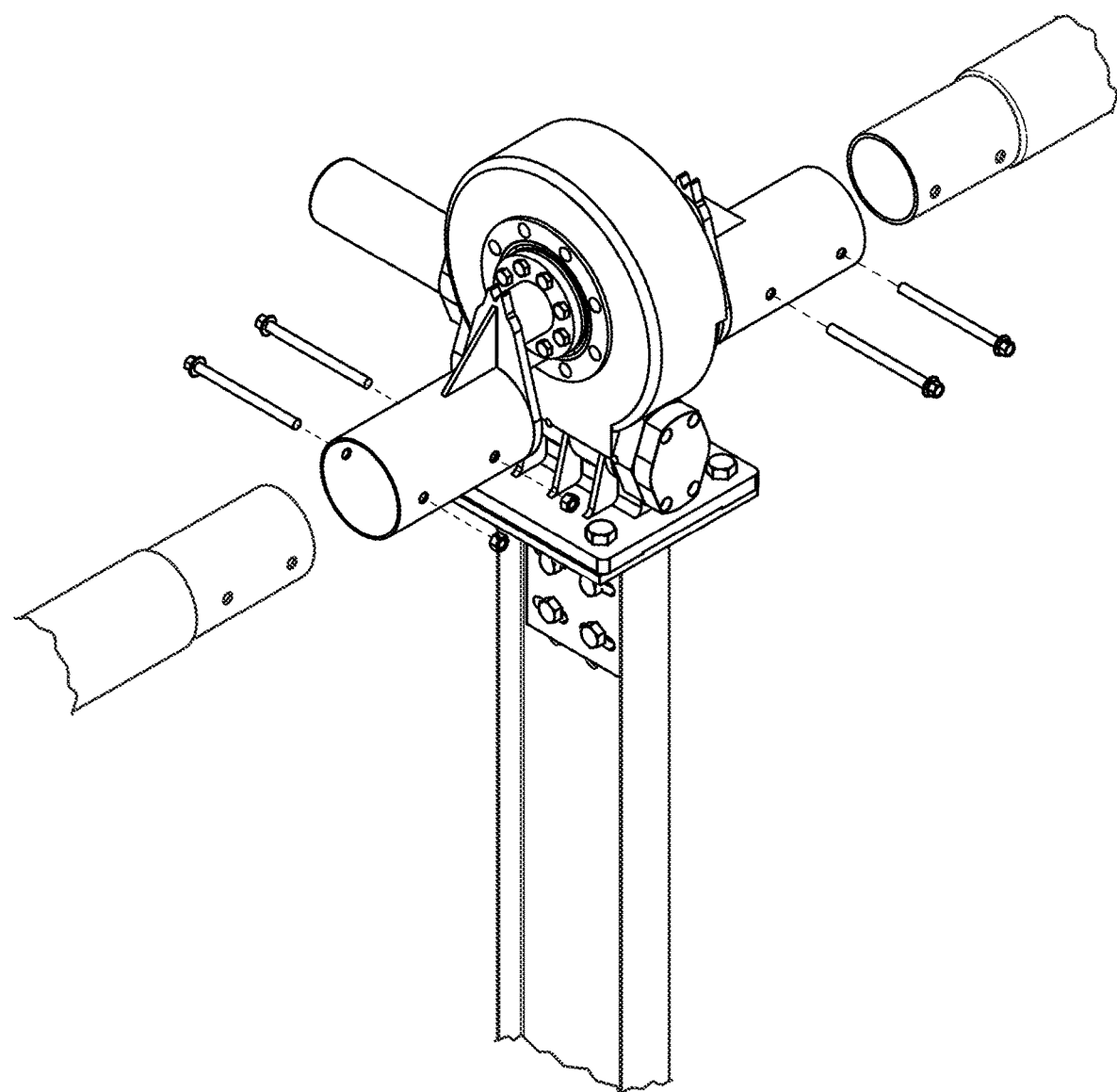

FIG. 15 is a simplified perspective diagram of a drive assembly configured on a pier member according to an embodiment of the present invention. In an example, as shown, the solar tracker apparatus comprises a drive device. The drive device is coupled to an electric motor, which can be DC or AC. The drive device has a shaft, which rotates around a rotational point, and drives each crank, which is described below. The drive device is provided on a support or drive mount, which is configured on an upper region of a pier, which has been described. The drive device is coupled to a crank coupled to the drive device and configured in an offset manner to a frame assembly, which has a plurality of solar modules.

In an example, the drive device provides rotation to a continuous torque tube spatially disposed from a first region to a second region. The drive device has a drive line, which couples via a gear box to drive a pair of cranks Each crank is coupled to each side of the drive device, which causes rotational movement of each crank.

In an example, the crank comprises a first crank coupled to a first side of the drive device and a second crank coupled to a second side of the drive device. In an example, the crank comprises a first crank coupled to a first side of the drive device and a second crank coupled to a second side of the drive device. In an example, each crank has a flange having a plurality of bolt openings to couple to one side of the drive device. Each crank has an arm, which is normal to each flange, and couples to cylindrical member that has one or more bolt openings. The apparatus has a first torque tube coupled to the first crank via the cylindrical member and a second torque tube coupled to the second crank via another cylindrical member. In an example, a first swage fitting is coupling the first crank to the first torque tube and a second swage fitting is coupling the second crank to the second torque tube. One or more bolts are inserted through the cylindrical members to secure a portion of the torque tube in place, and keep it free from rotation or twisting within the cylindrical member, and lock it into place, as shown.

In an example, each of the cranks is made of a suitable metal material that may be cast, machined, or stamped. Each cylindrical member is made of a suitable metal material to coupled to an end of the torque tube, as shown. A swage fitting can be provided to couple or connect the end of the torque tube to each cylindrical member as shown. Of course, there can be variations. Further details of assembling the drive device can be found throughout the present specification, and more particularly below.

FIGS. 16 through 19 are simplified diagrams illustrating a method for assembling the drive assembly of FIG. 15. In an example, the method includes providing a drive device, as shown. In an example, the method includes coupling the drive device via a drive line or shaft to an electric motor, which can be DC or AC. The method includes coupling the drive device to a support or drive mount, which is configured on an upper region of a pier, which has been described. In an example, the pier comprising a plurality of support structures coupled to a drive device support. The drive device support having a first member coupled to the plurality of support structures, and a second member coupled to the drive device.

In an example, the method includes coupling the drive device a crank coupled to the drive device and configured in an offset manner to a frame assembly, which has a plurality of solar modules. In an example, the drive device has the drive line, which couples via a gear box to drive a pair of cranks Each crank is coupled to each side of the drive device, which causes rotational movement of each crank. In an example, the crank comprises a first crank coupled to a first side of the drive device and a second crank coupled to a second side of the drive device. In an example, the crank comprises a first crank coupled to a first side of the drive device and a second crank coupled to a second side of the drive device. In an example, each crank has a flange having a plurality of bolt openings to couple to one side of the drive device. Each crank has an arm, which is normal to each flange, and couples to cylindrical member that has one or more bolt openings. The apparatus has a first torque tube coupled to the first crank via the cylindrical member and a second torque tube coupled to the second crank via another cylindrical member. In an example, a first swage fitting is coupling the first crank to the first torque tube and a second swage fitting is coupling the second crank to the second torque tube. One or more bolts are inserted through the cylindrical members to secure a portion of the torque tube in place, and keep it free from rotation or twisting within the cylindrical member, and lock it into place, as shown.

Figure 20:
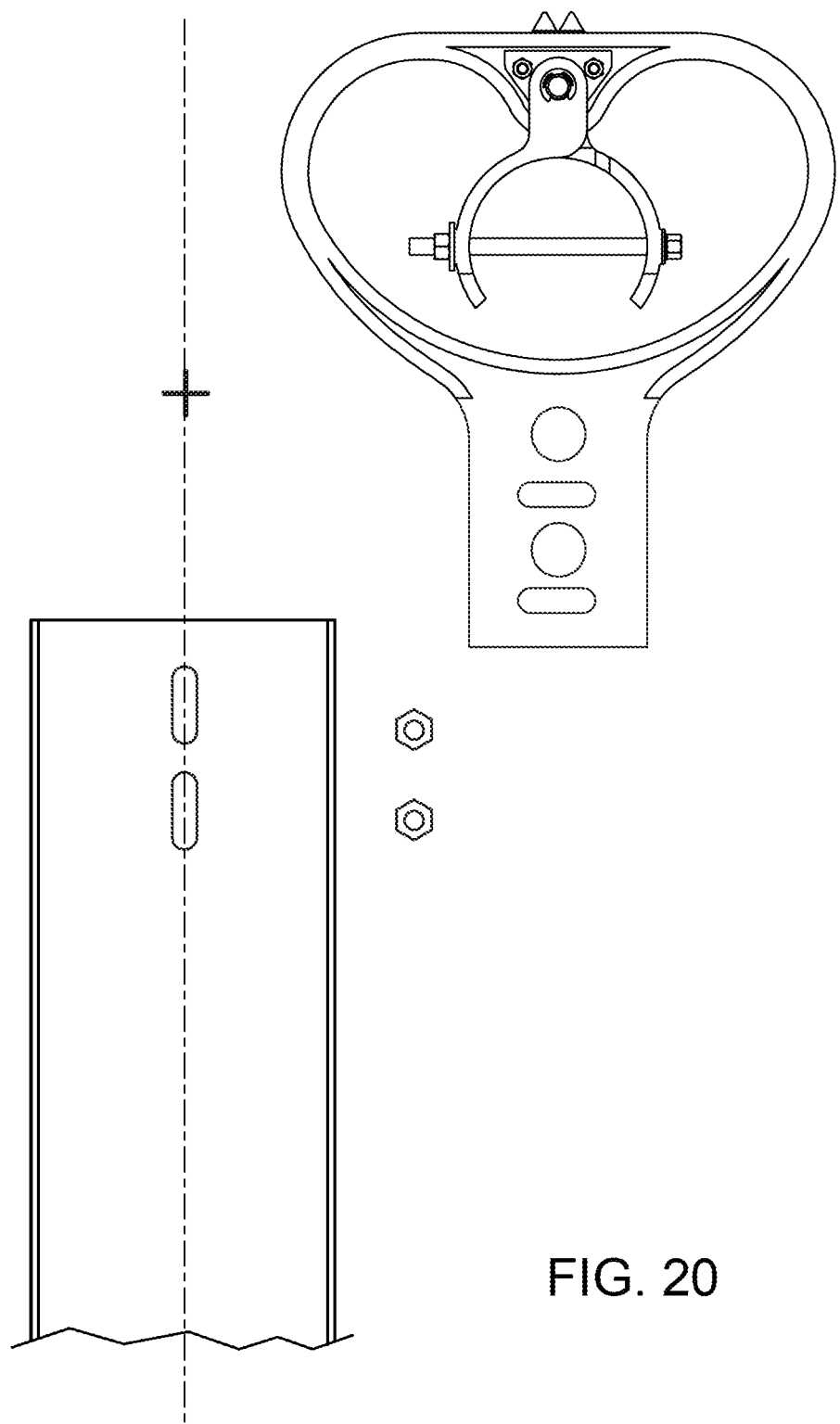
FIG. 20 is a simplified in-line view diagram illustrating a clamp assembly separate and apart from a pier member according to an embodiment of the present invention.

FIG. 20 is a simplified in-line view diagram illustrating a clamp assembly separate and apart from a pier member according to an embodiment of the present invention. As shown, the clamp assembly has a clamp housing member configured in a upright direction, which is a direction away from a direction of gravity. In an example, the clamp housing member comprises a lower region and an upper region. The lower region is coupled to a pier structure. The lower region has a thickness of material comprising bolt openings, which align to openings on an upper portion of the pier structure. Locking nuts and bolts are configured to hold the lower region of the clamp housing to the pier structure in an upright manner. At least a pair of openings are provided in each of the lower region of the clamp housing and the pier structure, as shown. Each of the openings in the lower region of the clamp housing is configured as a slot to allow for adjustment in a direction normal to the direction of the length of the pier structure. Each of the openings in the pier structure is configured as an elongated slot in the direction of the length of the pier structure to allow for adjustment in the same direction. Of course, there can be variations, where the directions of the slots are exchanged and/or combined.

In an example, the upper region comprises a spherical bearing device. The upper region has a tongue structure, which has an opening that houses the spherical bearing between a pair of plates, which hold the bearing in place. In an example, the spherical bearing allows for rotational, and movement in each of the three axis directions within a desirable range. Each of the plates is disposed within a recessed region on each side of the tongue structure. Each of the plates may include a fastener to hold such plate in place within the recessed region.

In an example, the clamp housing has a pair of openings and lower region that is designed like a heart like shape and a tongue region, which supports the spherical bearing assembly, as shown. Each lobe of the heart like shape acts as a stop for movement of the torque tube in a lateral rotational movement in either direction depending upon the spatial orientation of the lobe. Further details of the clamp housing can be found further below.

In an example, clamp assembly has a clam shell clamp member coupled to the spherical bearing and the clam shell clamp being suspended from the spherical bearing. That is, the clam shell clamp has a first side and a second side. Each side has an upper region comprising an opening. A pin is inserted through each of the openings, while an opening of the spherical bearing is provided as a third suspension region between each of the openings, as shown.

Each side of the clam shell is shaped to conform or couple to at least one side of a portion of the torque tube, as shown. Each side has one or more opens, which align to one or more openings on the portion of the torque tube. A pin or bolt is inserted through each of the openings to clamp the clam shell clamp to the portion of the torque tube and surround substantially an entirety of a peripheral region of the torque tube. The pin or bolt or pins or bolts also holds the torque tube in a fixed position relative to the clam shell clamp to prevent the torque tube from slipping and/or twisting within the clam shell clamp. Of course, there can be variations.

In an example, the spherical bearing allows for a construction tolerance, tracker movement, and acts as a bonding path of least resistance taking an electrical current to ground. The bonding path occurs from any of the modules, through the frame, to each of the clamp assembly, to one or more piers, and then to ground.

In an example, the clam shell apparatus comprising a first member operably coupled to a second member to hold a torque tube in place. In an example, the apparatus has a clamp housing operably coupled to the clam shell apparatus via a spherical bearing device such that the spherical bearing comprises an axis of rotation, which is different from a center of the torque tube.

Figure 21:
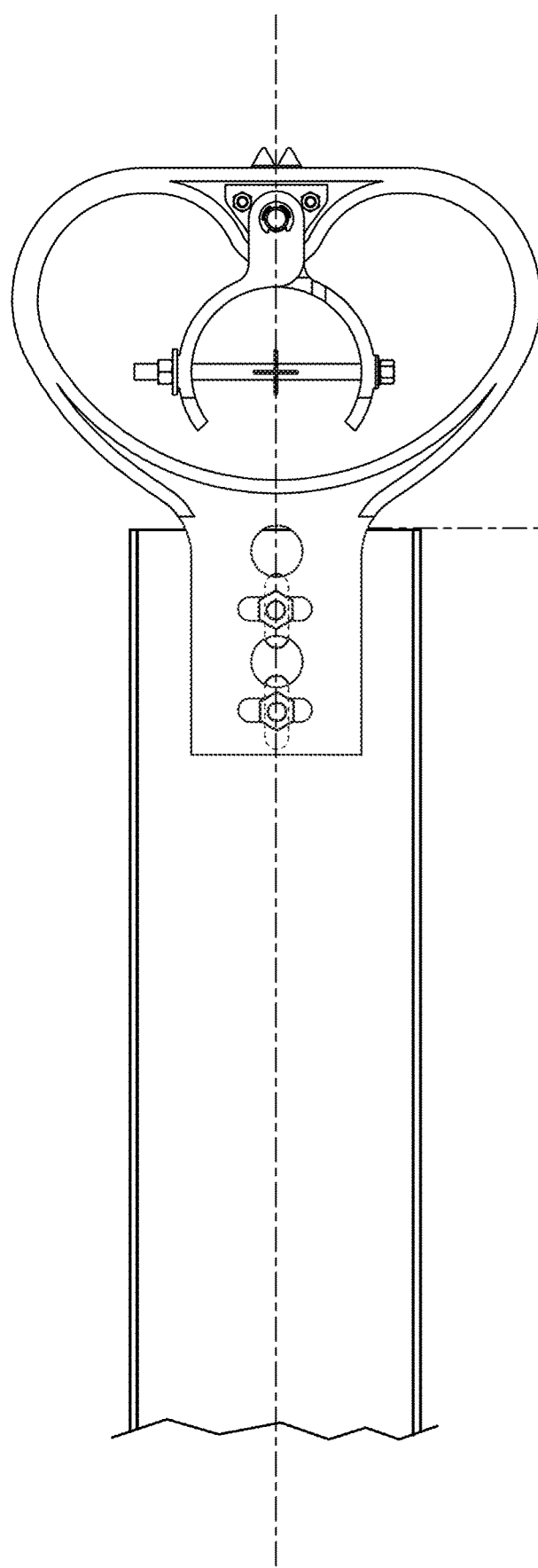
FIG. 21 is a simplified in-line view diagram illustrating a clamp assembly coupled to a pier member according to an embodiment of the present invention.

FIG. 21 is a simplified in-line view diagram illustrating a clamp assembly coupled to a pier member according to an embodiment of the present invention. As shown, a pair of nuts and bolts holds the pier structure to the clamp housing along the dotted line.

Figure 22:
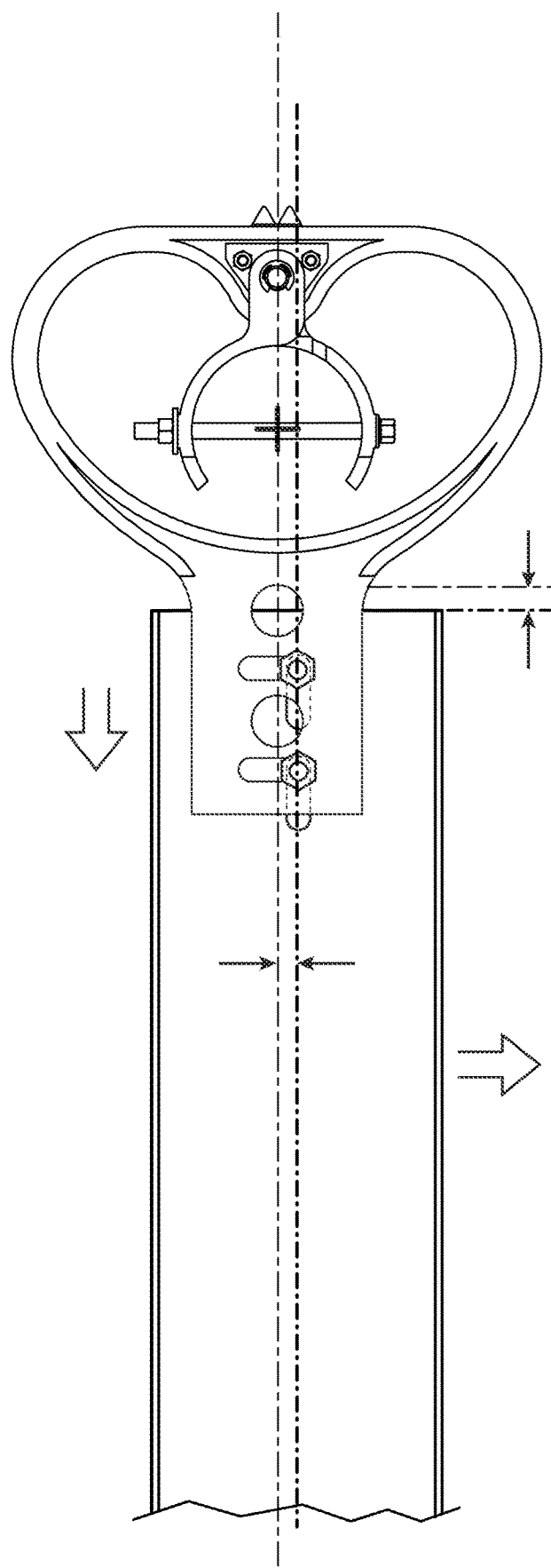
FIG. 22 is a simplified in-line view diagram illustrating a clamp assembly coupled to a pier member in a first orientation according to an embodiment of the present invention.

FIG. 22 is a simplified in-line view diagram illustrating a clamp assembly coupled to a pier member in a first orientation according to an embodiment of the present invention. As shown, the clamp housing can be off-set in a vertical and lateral manner using the slots in each of the pier and housing structure facing the in-line view of the torque tube.

Figure 23:
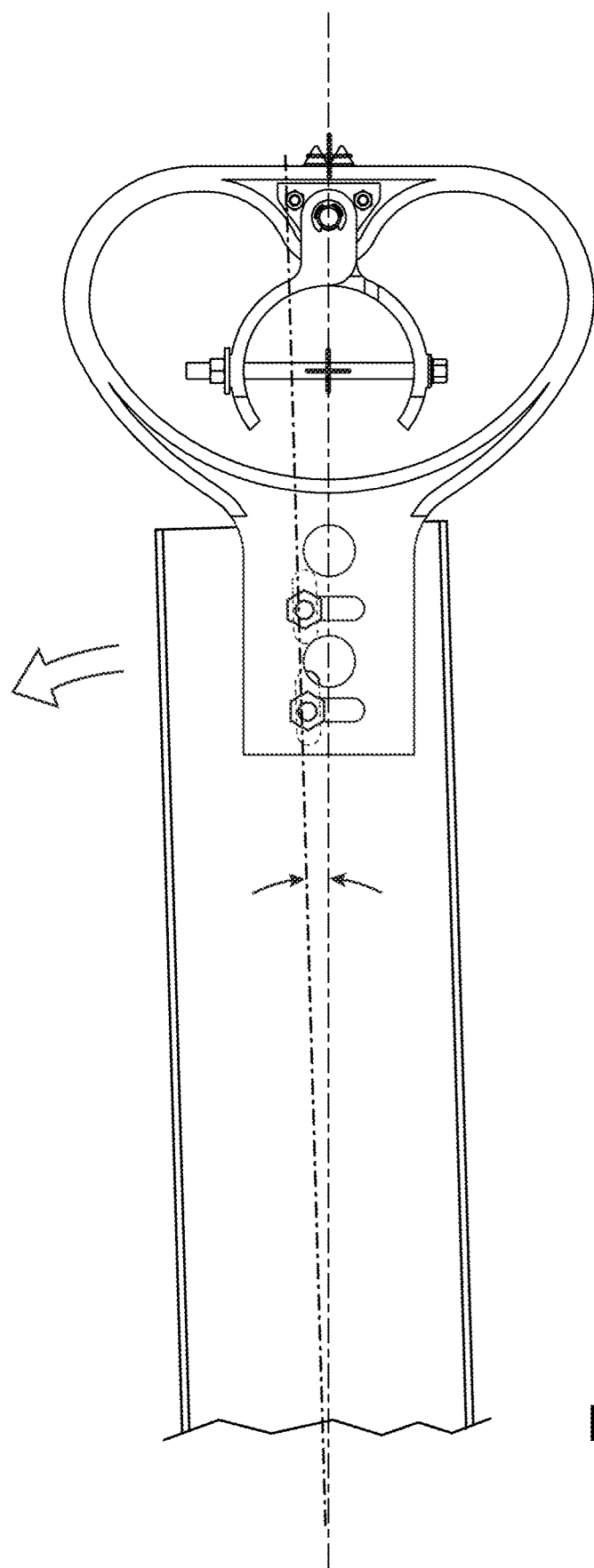
FIG. 23 is a simplified in-line view diagram illustrating a clamp assembly coupled to a pier member in a second orientation according to an embodiment of the present invention.

FIG. 23 is a simplified in-line view diagram illustrating a clamp assembly coupled to a pier member in a second orientation according to an embodiment of the present invention. As shown, the clamp housing can be adjusted in a rotational manner (in either direction) using the same slots in each of the pier and housing structures facing the in-line view of the torque tube.

Figure 24:
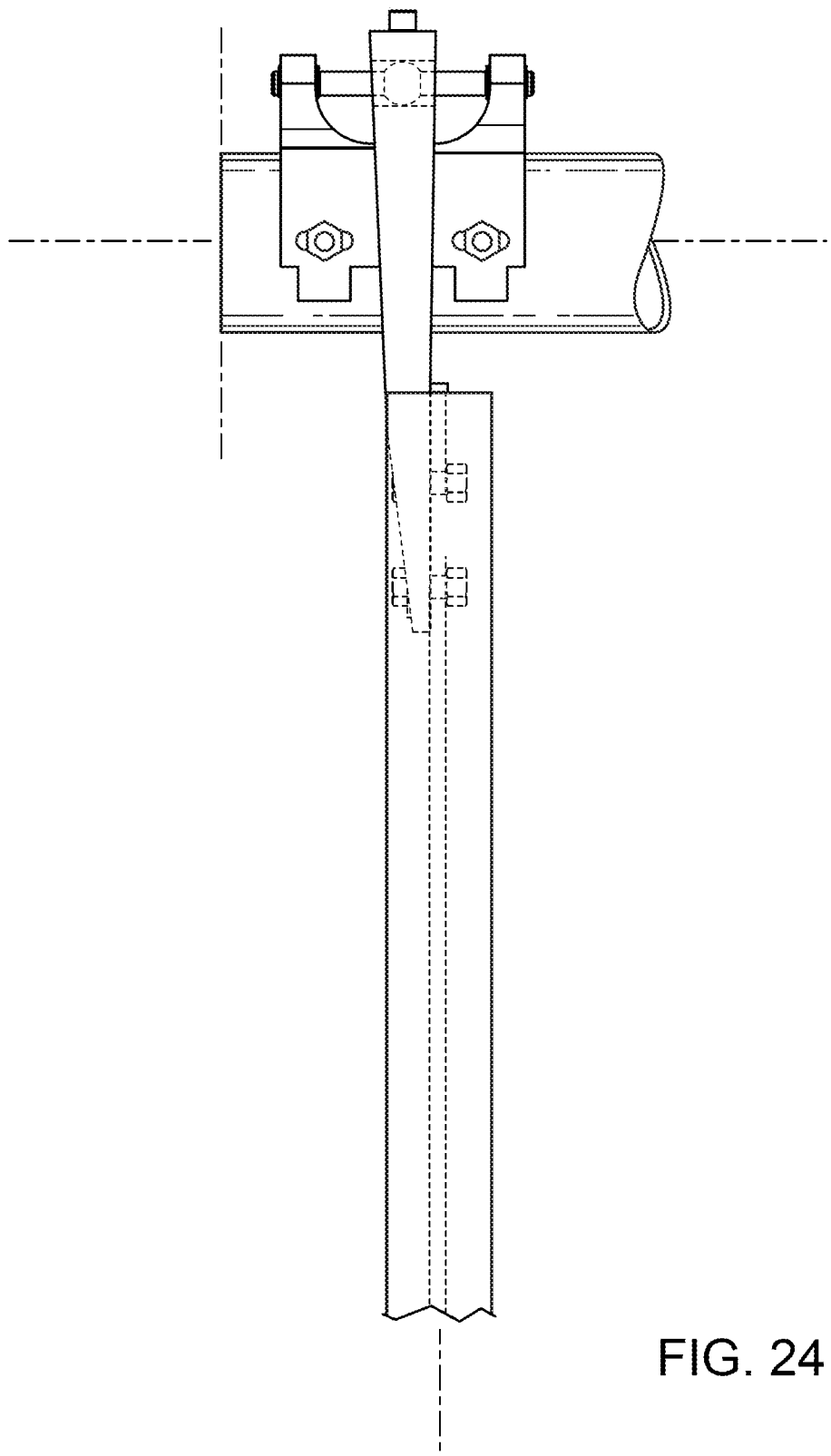
FIG. 24 is a simplified side view diagram illustrating a clamp assembly coupled to a pier member in a first orientation according to an embodiment of the present invention.

FIG. 24 is a simplified side view diagram illustrating a clamp assembly coupled to a pier member in a first orientation according to an embodiment of the present invention. As shown, the housing and pier structure, along with the torque tube, are arranged in a normal orientation using the pins configuring the torque tube to the clam shell clamp member. As shown, the clamp member has an elongated opening to allow each of the pins to be adjusted in place, which allows the relationship of the clamp and torque tube to be adjusted.

Figure 25:
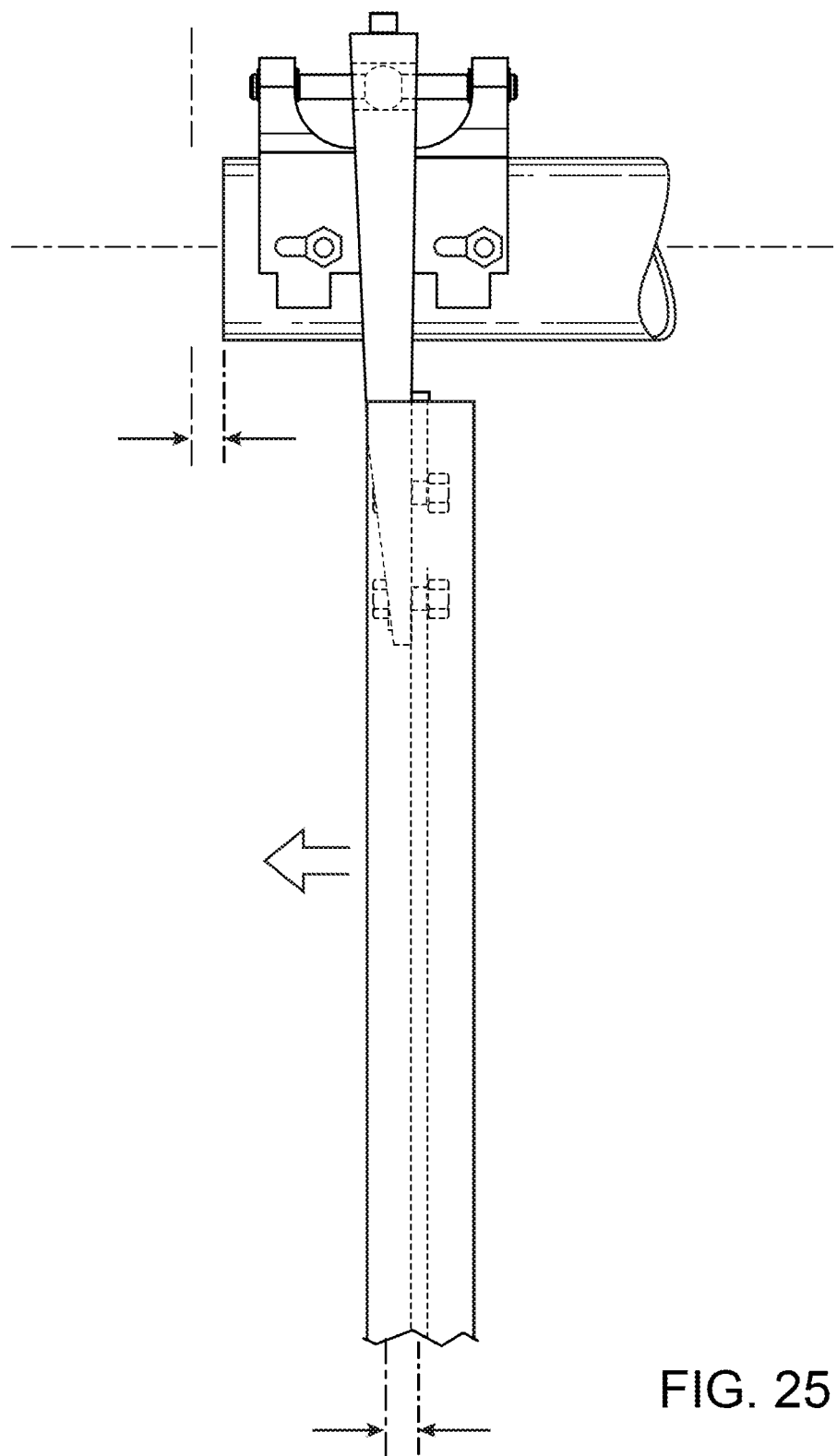
FIG. 25 is a simplified side view diagram illustrating a clamp assembly coupled to a pier member in a second orientation according to an embodiment of the present invention.

FIG. 25 is a simplified side view diagram illustrating a clamp assembly coupled to a pier member in a second orientation according to an embodiment of the present invention. As shown, the torque tube is shifted in an in-line direction (either way) using the slots in the clamp, while the torque tube has a smaller opening for the pin, which does not allow for any adjustment, in an example.

Figure 26:
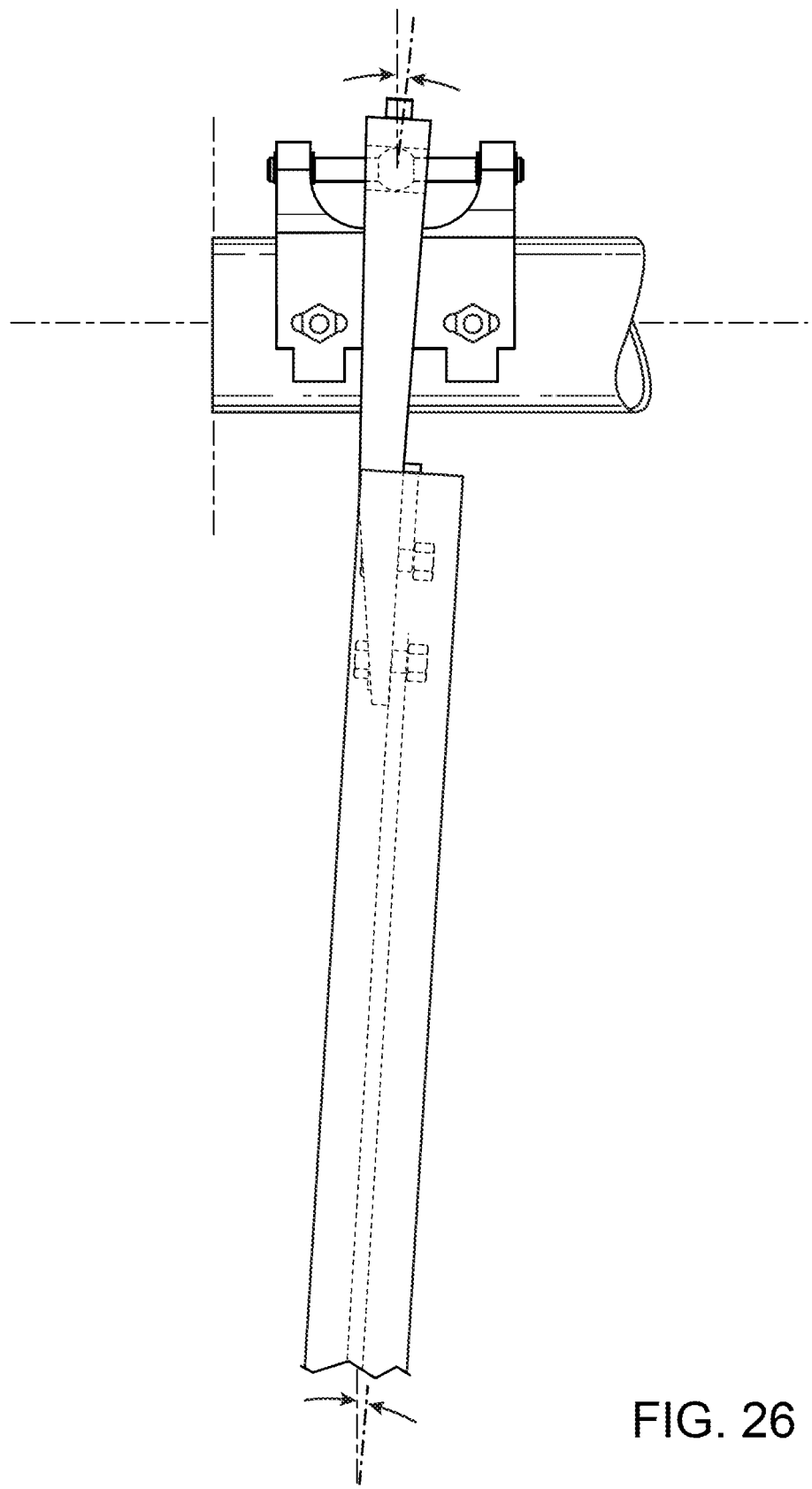
FIG. 26 is a simplified side view diagram illustrating a clamp assembly coupled to a pier member in a third orientation according to an embodiment of the present invention.

FIG. 26 is a simplified side view diagram illustrating a clamp assembly coupled to a pier member in a third orientation according to an embodiment of the present invention. As shown, the torque tube can be rotated or adjusted relative to the direction of the length of the pier using the movement of the spherical bearing assembly, explained and shown. As shown, the torque tube is parallel to the direction of gravity in an example.

Figure 27:
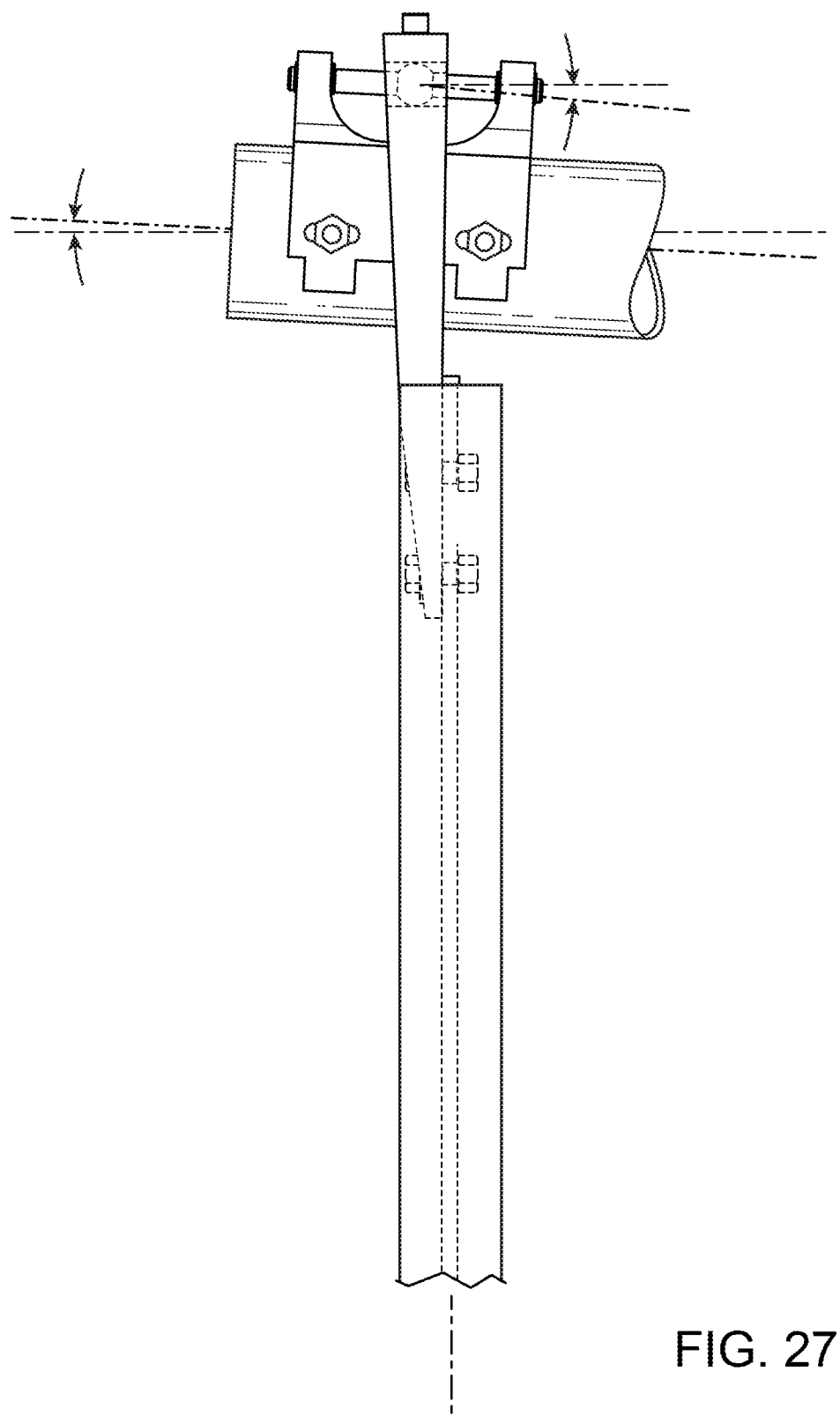
FIG. 27 is a simplified side view diagram illustrating a clamp assembly coupled to a pier member in a fourth orientation according to an embodiment of the present invention.

FIG. 27 is a simplified side view diagram illustrating a clamp assembly coupled to a pier member in a fourth orientation according to an embodiment of the present invention. As shown, the torque tube can be rotated or adjusted relative to the direction of the length of the pier using the movement of the spherical bearing assembly, explained and shown. As shown, the torque tube is not parallel to the direction of gravity in an example.

Figure 28:
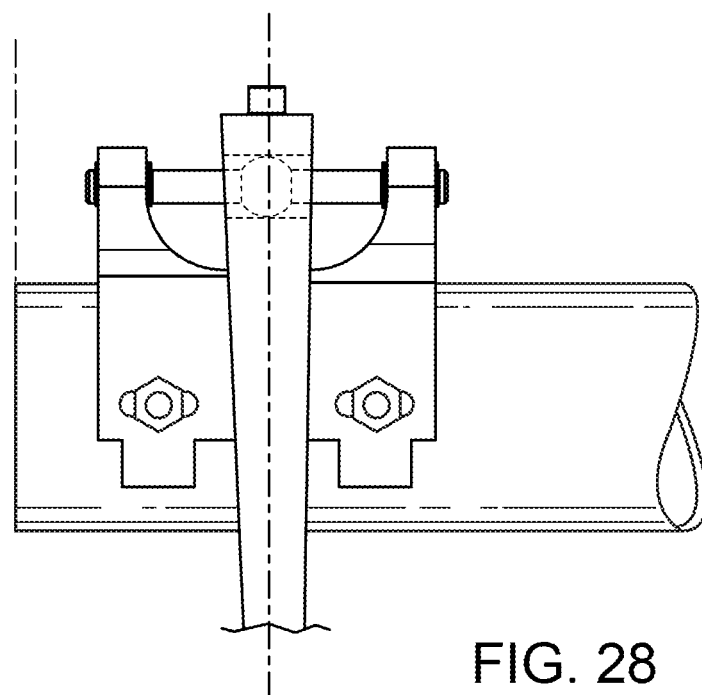
FIG. 28 is a simplified side view diagram illustrating a clamp assembly coupled to a pier member in a fifth orientation according to an embodiment of the present invention.

FIG. 28 is a simplified side view diagram illustrating a clamp assembly coupled to a pier member in a fifth orientation according to an embodiment of the present invention. As shown, the torque tube, housing, and clamp are aligned in this example.

Figure 29:
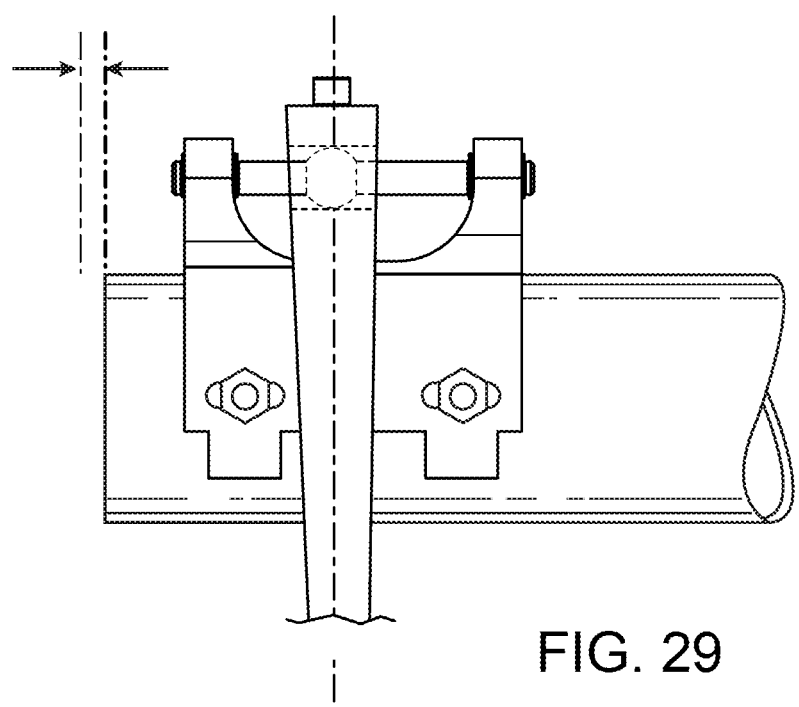
FIG. 29 is a simplified side view diagram illustrating a clamp assembly coupled to a pier member in a sixth orientation according to an embodiment of the present invention.

FIG. 29 is a simplified side view diagram illustrating a clamp assembly coupled to a pier member in a sixth orientation according to an embodiment of the present invention. As shown, the torque tube, housing, and clamp are aligned in this example. However, the position of the spherical bearing to pin has shifted in one direction by sliding the pin in the same direction, although the pin can be slid in the other opposite direction in other examples. In this example, pin to clamp arrangement can be moved along the pin from one spatial region to another spatial region.

Figure 30:
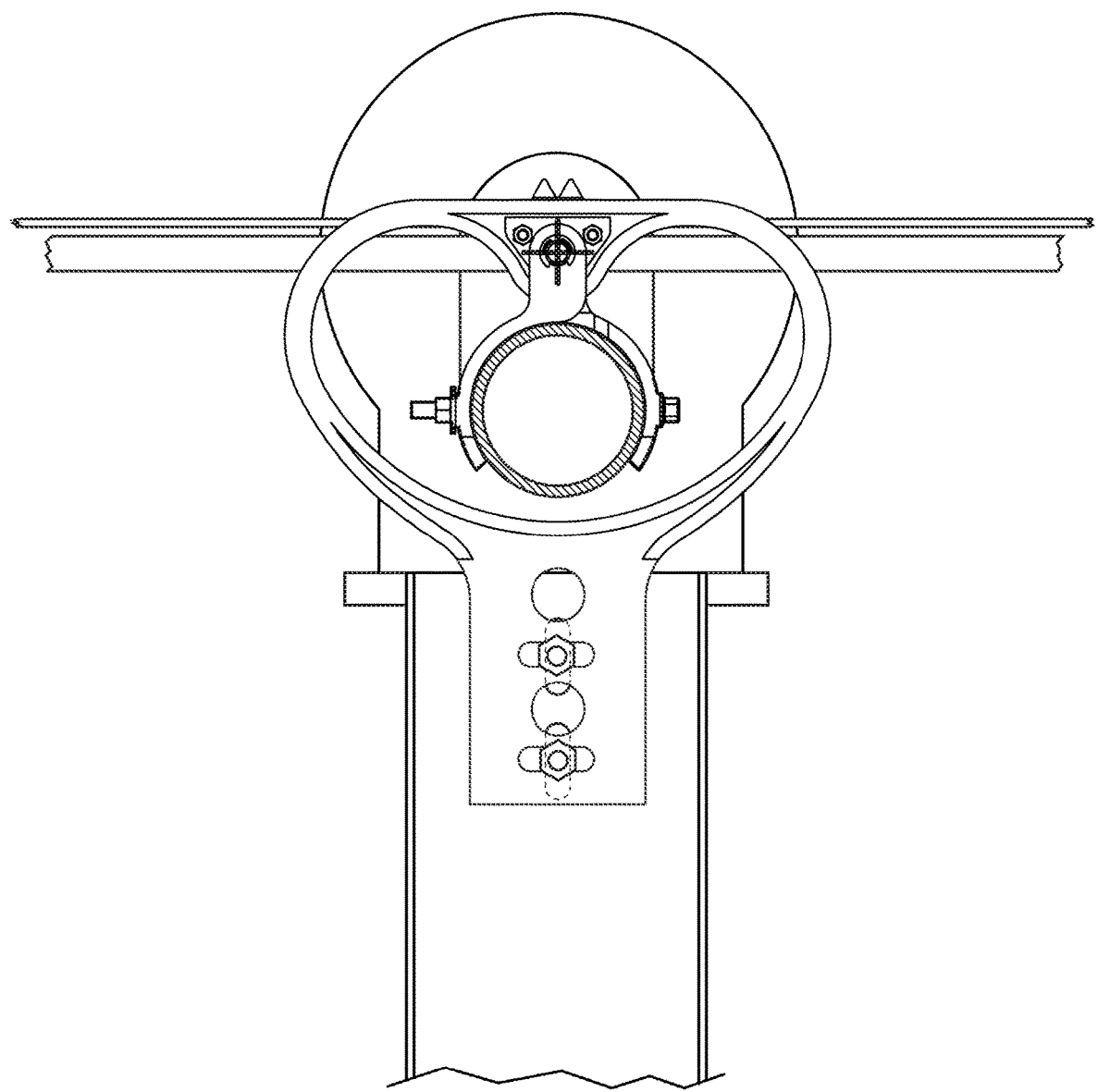
FIGS. 30 through 32 illustrate an in-line view of the clamp assembly and the drive assembly in multiple configurations according to embodiments of the present invention.
Figure 31:
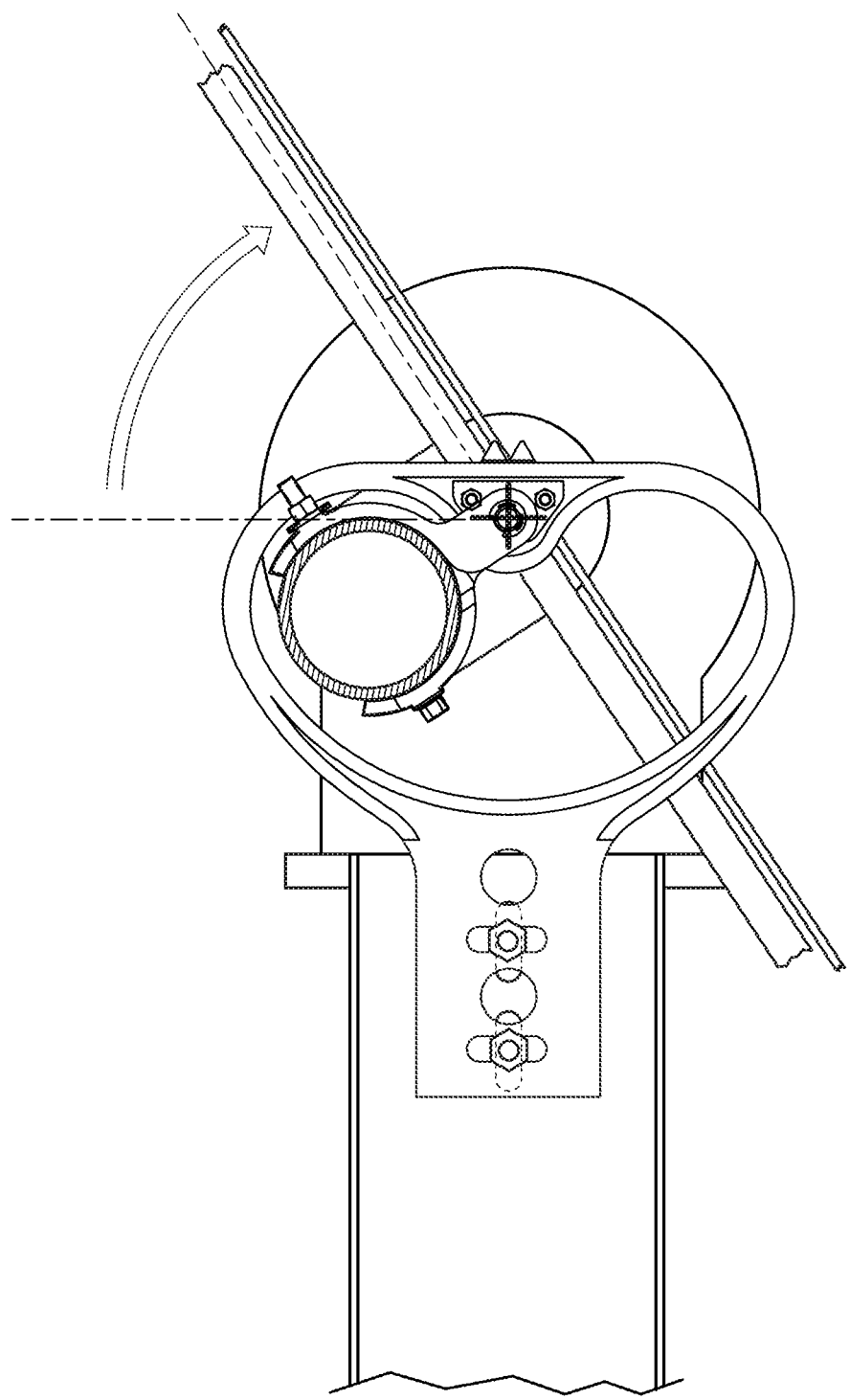
Figure 32:
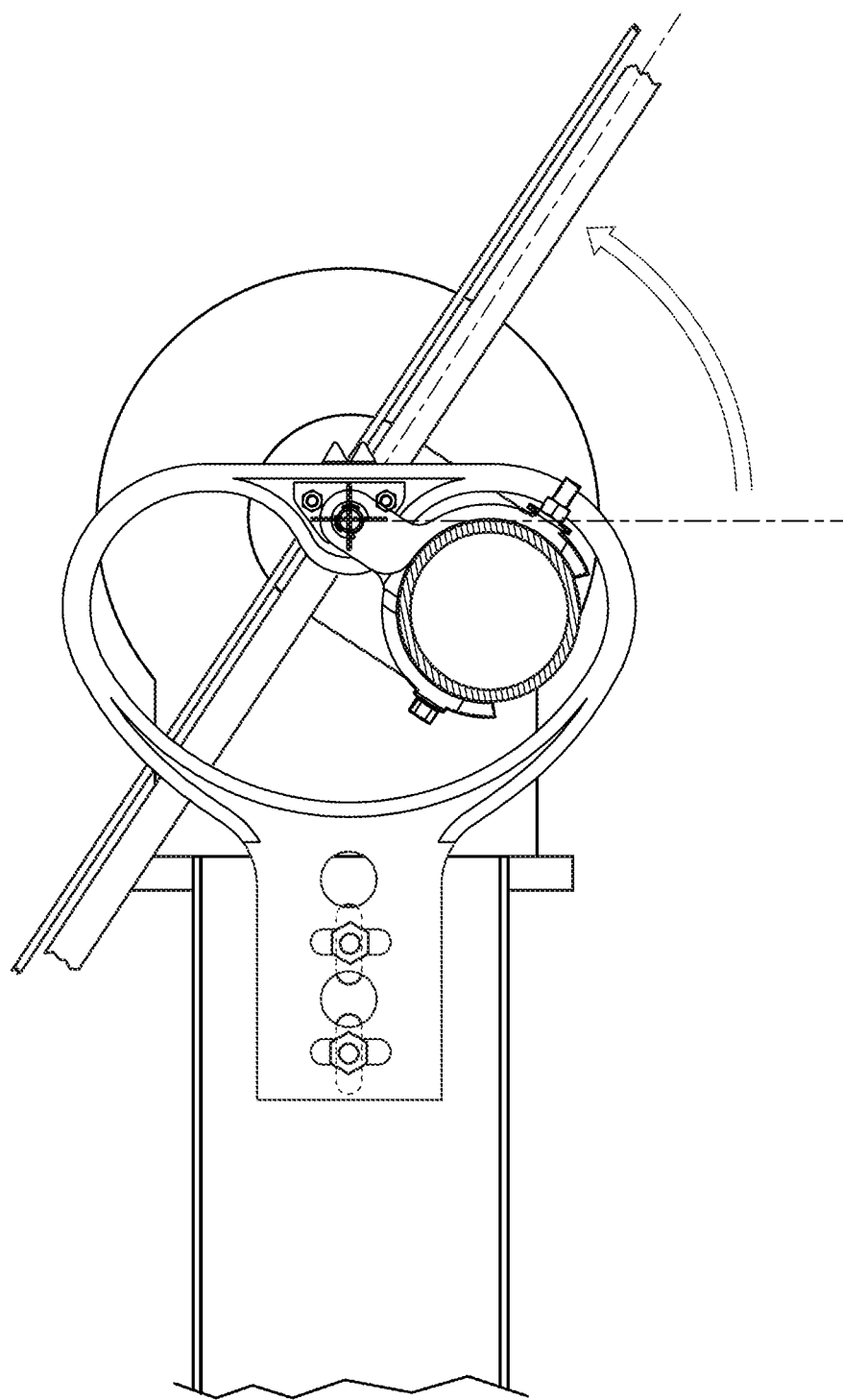

FIGS. 30 through 32 illustrate an in-line view of the clamp assembly and the drive assembly in multiple configurations according to embodiments of the present invention. As shown, the crank is in a lower position, which allows for the torque tube to be at its lowest position in an example. As the drive device moves the crank, the torque tube swings from the lowest position to an elevated position in a radial manner along a first direction or an elevated position in a radial manner along a second direction, as shown. As the torque tube rotates, the plurality of solar panels fixed to the torque tube also rotate along a path from a first spatial region to a second spatial region. As shown, each of the inner regions of the lobes acts as a stop for the torque tube or an override for the torque tube. Of course, there can be other variations.

Figure 33:
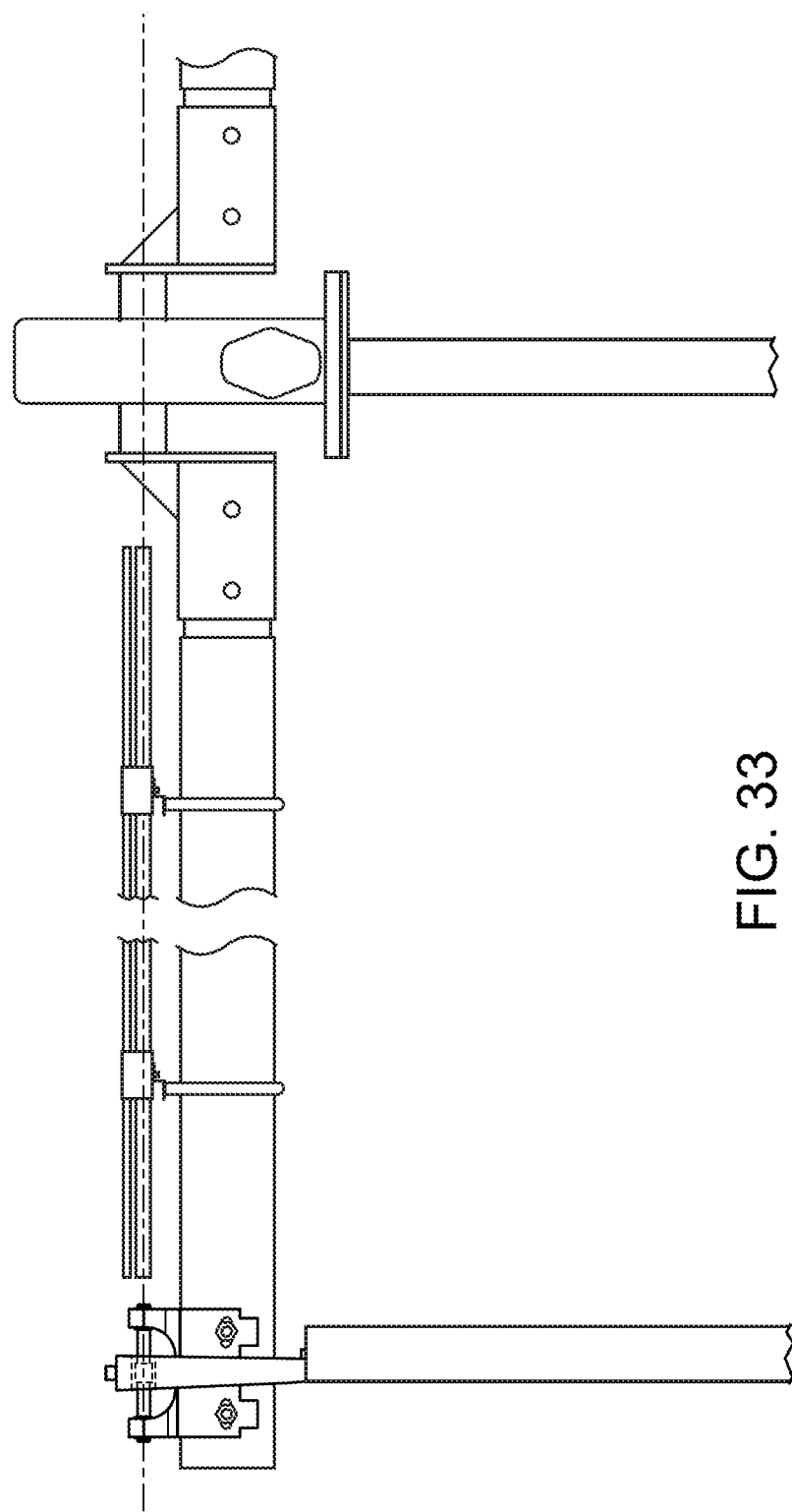
FIG. 33 is a side view diagram of the tracker apparatus according to an embodiment of the present invention.

FIG. 33 is a side view diagram of the tracker apparatus according to an embodiment of the present invention. As shown is a side view diagram of the torque tube, solar panels with frames, and clamp housing and structure.

FIGS. 34 and 35 are simplified side view diagrams of a torque tube according to an embodiment of the present invention. As shown, each of the torque tubes has a plurality of openings on each end for affixing to either the clamp or drive device cylinder. Each of the torque tubes also has a plurality of openings for clamps configured to hold the tube to a frame coupled to the plurality of solar modules.

Figure 36:
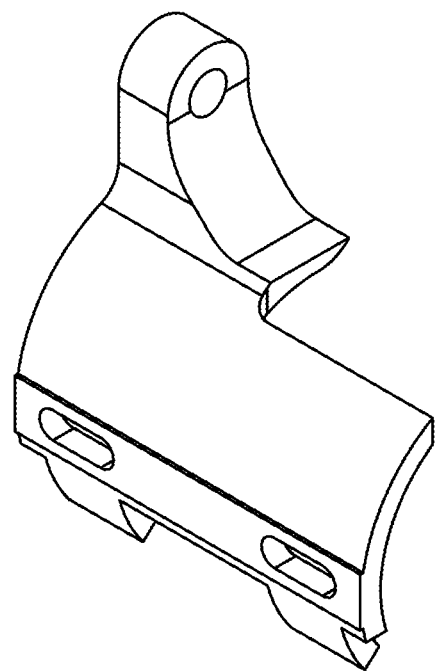
FIGS. 36, 37, and 38 are simplified perspective-view, side view, and front view diagrams of a clamp member according to an embodiment of the present invention.
Figure 37:
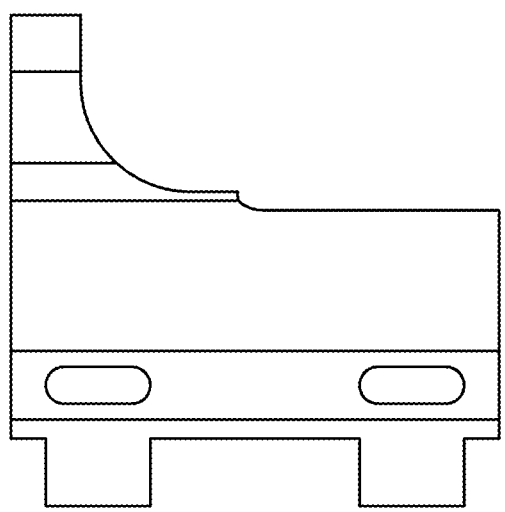
Figure 38:
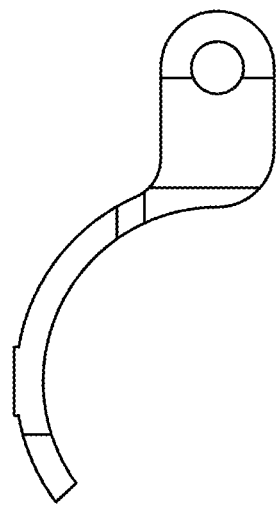

FIGS. 36, 37, and 38 are simplified perspective-view, side view, and front view diagrams of a clamp member or half clam shell member according to an embodiment of the present invention. As shown are the clam shell members, including pin opening to be coupled to the spherical bearing, and a plurality of slots for bolts to hold the torque tube in place and for adjustment.

Figure 39:
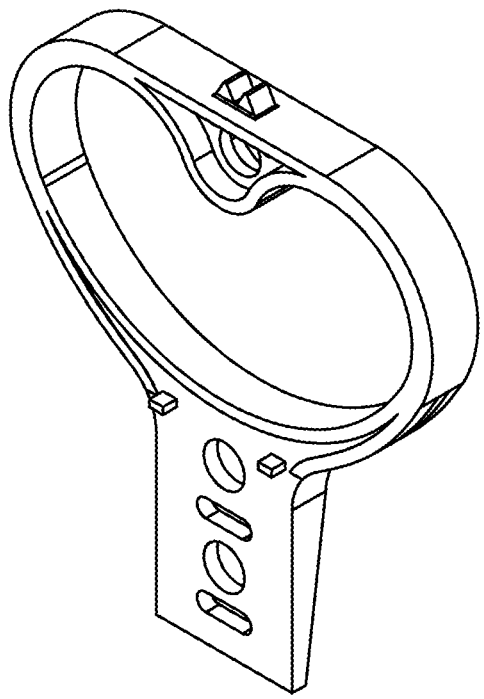
FIGS. 39 and 40 are simplified perspective-view and side view diagrams of a clamp housing according to an embodiment of the present invention.
Figure 40:
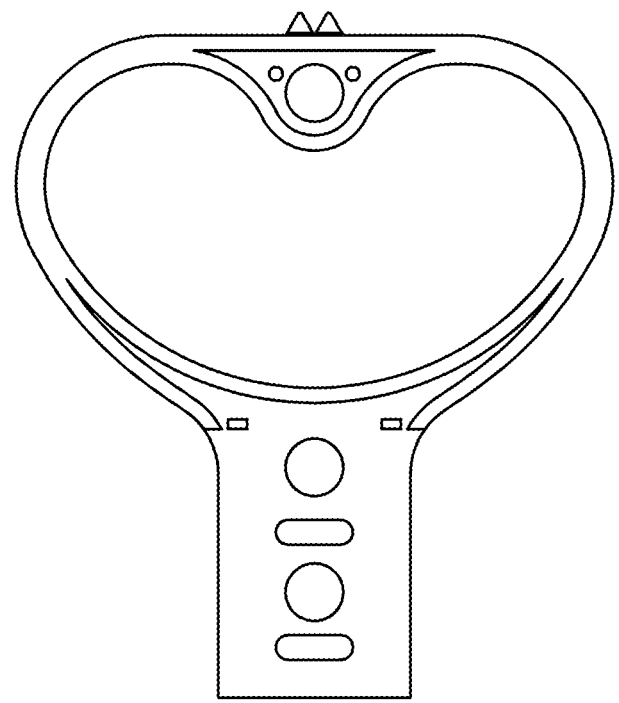
Figure 41:
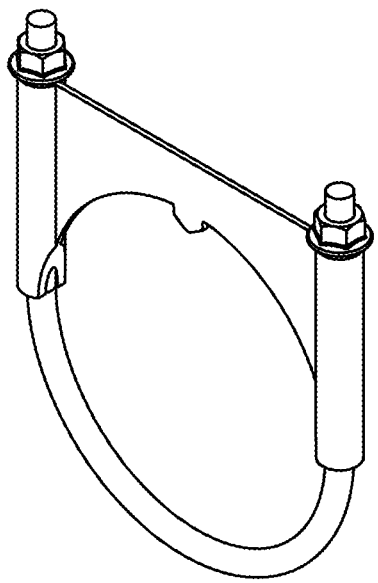
FIGS. 41, 42, 43, and 44 are simplified diagrams of component(s) for a U-bolt member according to an embodiment of the present invention.
Figure 42:
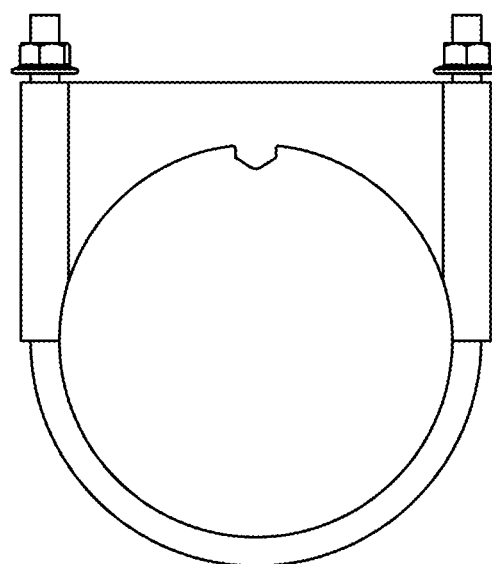
Figure 43:
Figure 44:
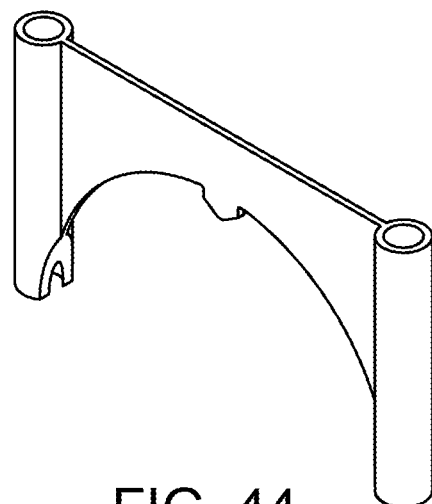

FIGS. 39 and 40 are simplified perspective-view and side view diagrams of a clamp housing according to an embodiment of the present invention. As shown is the clamp housing configured as a heart like shape, with tongue. The tongue has a recessed region, and an opening or slot for the spherical bearing. The housing also has a member to be coupled to the pier structure.

FIGS. 41, 42, 43, and 44 are simplified diagrams of component(s) for a U-bolt member according to an embodiment of the present invention. As shown is a U-bolt member and a pair of nuts to secure the U-bolt. The components also includes an upper clamp with a protrusion to be coupled to a notch or opening in the torque tube to present any movement between the torque tube and U-bolt member. That is, the protrusion acts as a stop to hold the U-bolt in place.

Figure 45:
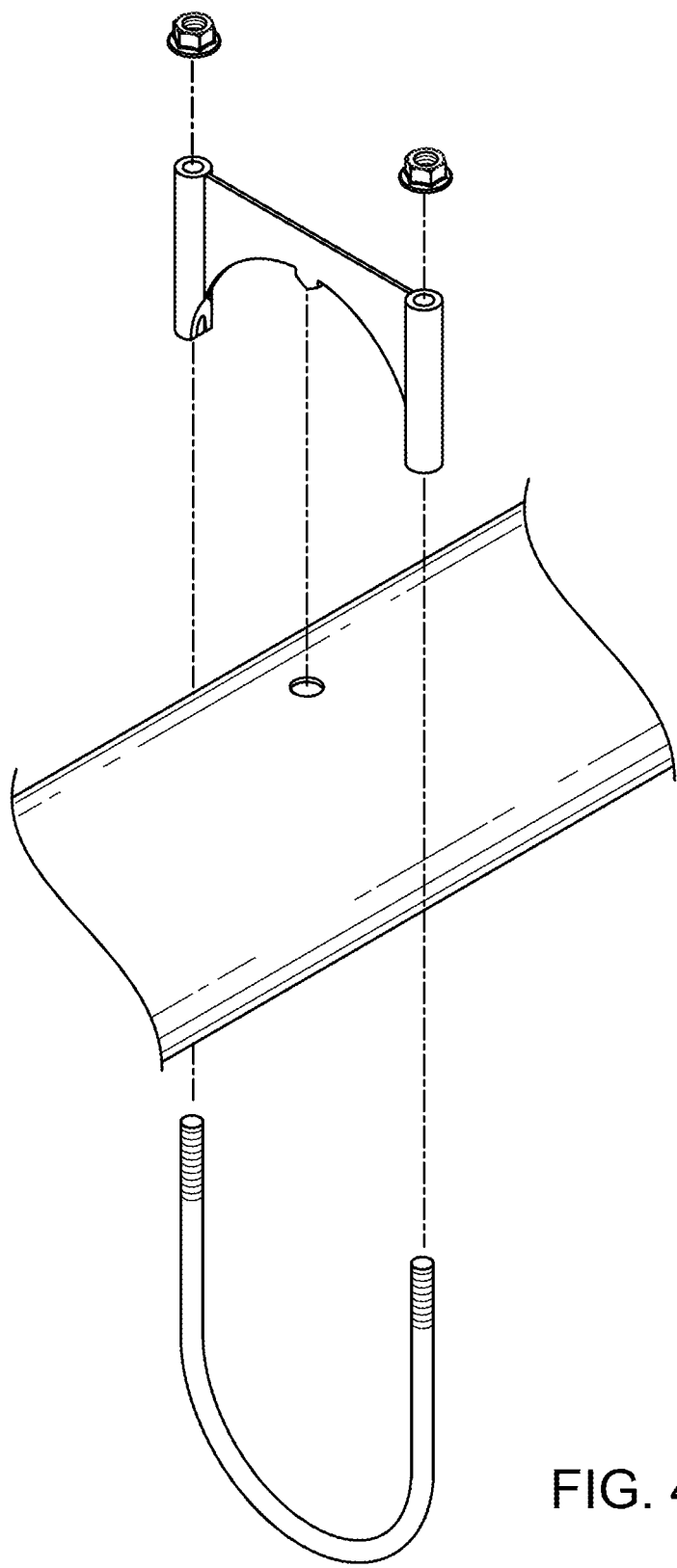
FIGS. 45, 46, and 47 are simplified diagrams illustrating a method of configuring a U-bolt member to a torque tube according to an embodiment of the present invention.
Figure 46:
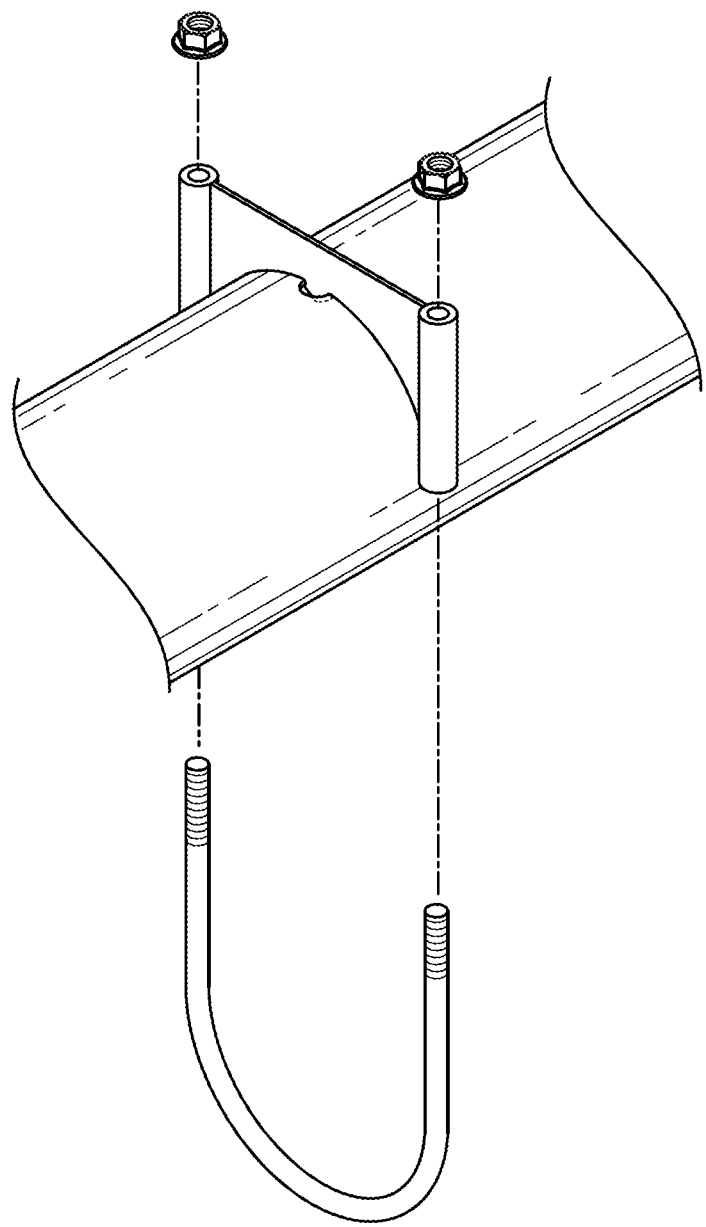
Figure 47:
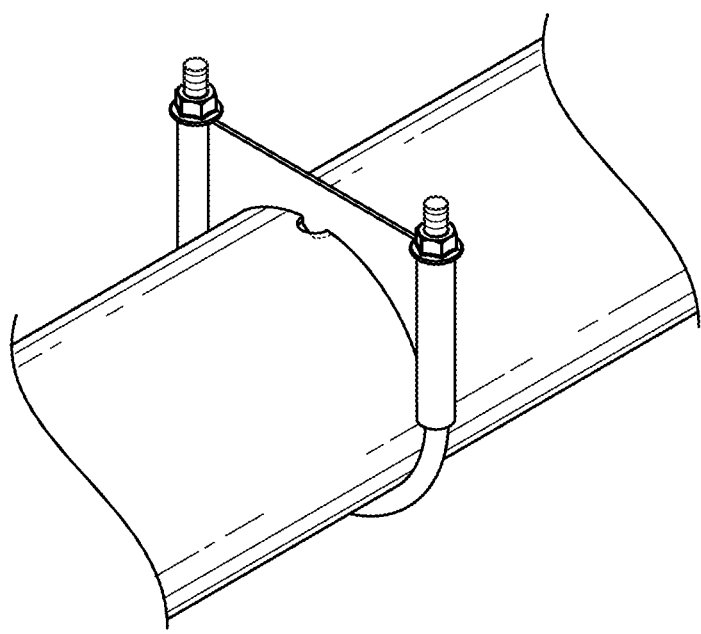

FIGS. 45, 46, and 47 are simplified diagrams illustrating a method of configuring a U-bolt member to a torque tube according to an embodiment of the present invention. As shown are U-bolt coupled to a periphery of the torque tube. The clamp member including protrusion, which has an thinner portion and thicker portion, coupled to a notch in the torque tube. A pair of bolts fastens and secures the clamp member and U-bolt in place to hold the frame structure, which couples to the plurality of solar modules.

Figures 48, 49:
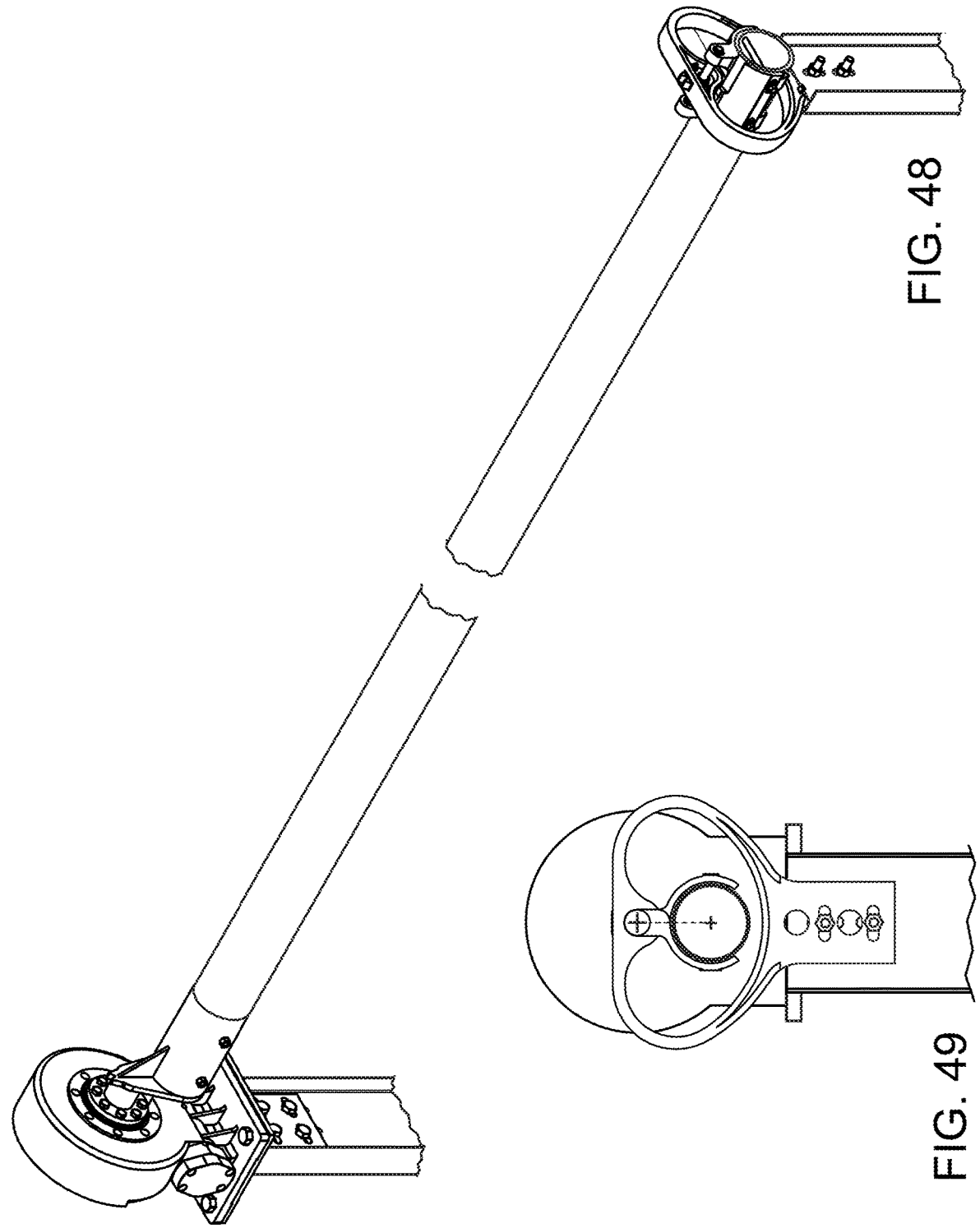
FIGS. 48 and 49 illustrate various views of a tracker apparatus according to an embodiment of the present invention.

FIGS. 48 and 49 illustrate various views of a tracker apparatus according to an embodiment of the present invention. As shown, the torque tube and tracker apparatus are in a normal rest position.

Figures 50, 51:
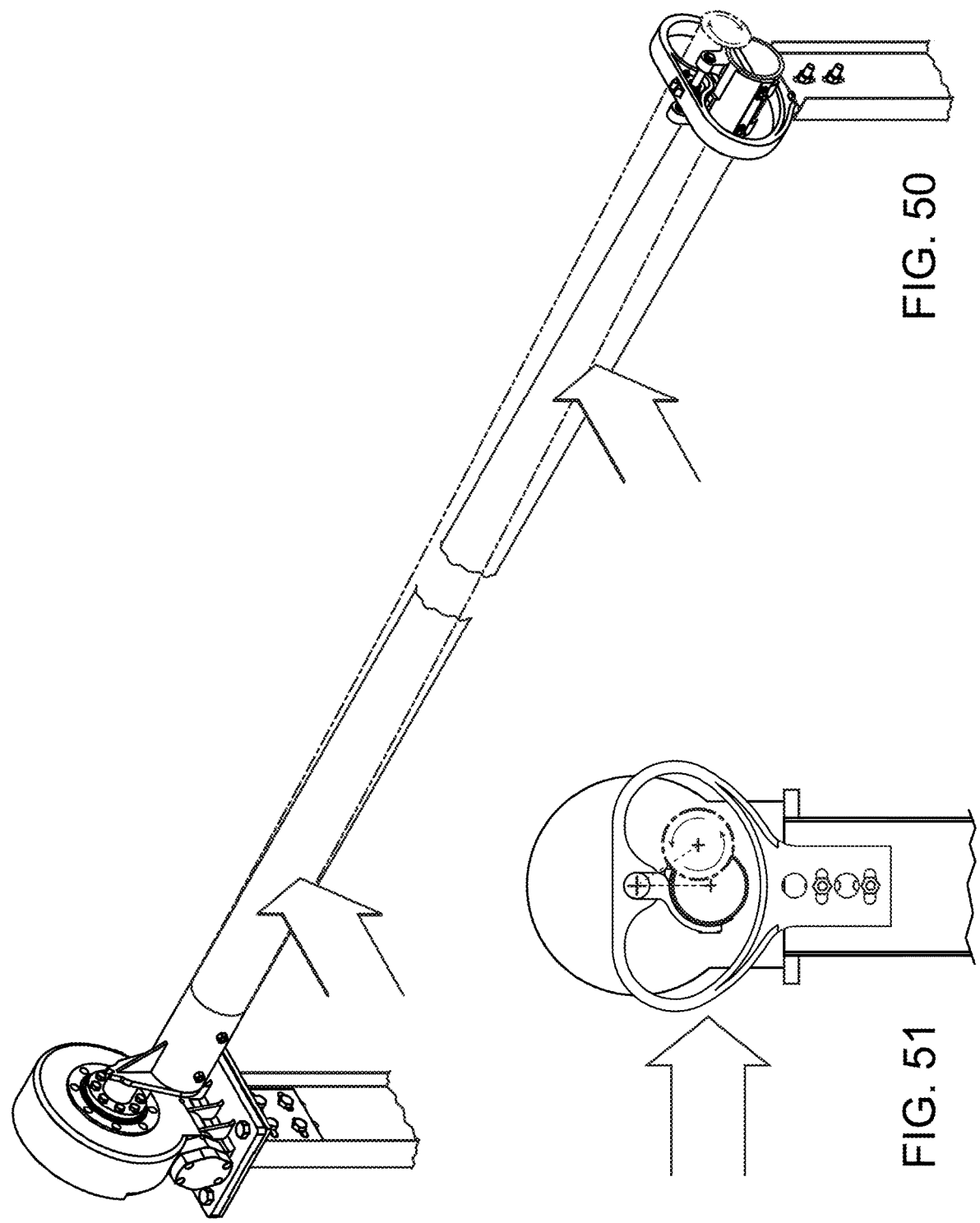
FIGS. 50 and 51 illustrate views of a tracker apparatus according to an embodiment of the present invention.

FIGS. 50 and 51 illustrate views of a tracker apparatus according to an embodiment of the present invention. As shown, a lateral force is provided against a direction normal to the length of the torque tube, which causes one end of the torque tube to move in the lateral direction, while the other end remains fixed in an example.

Figure 52:
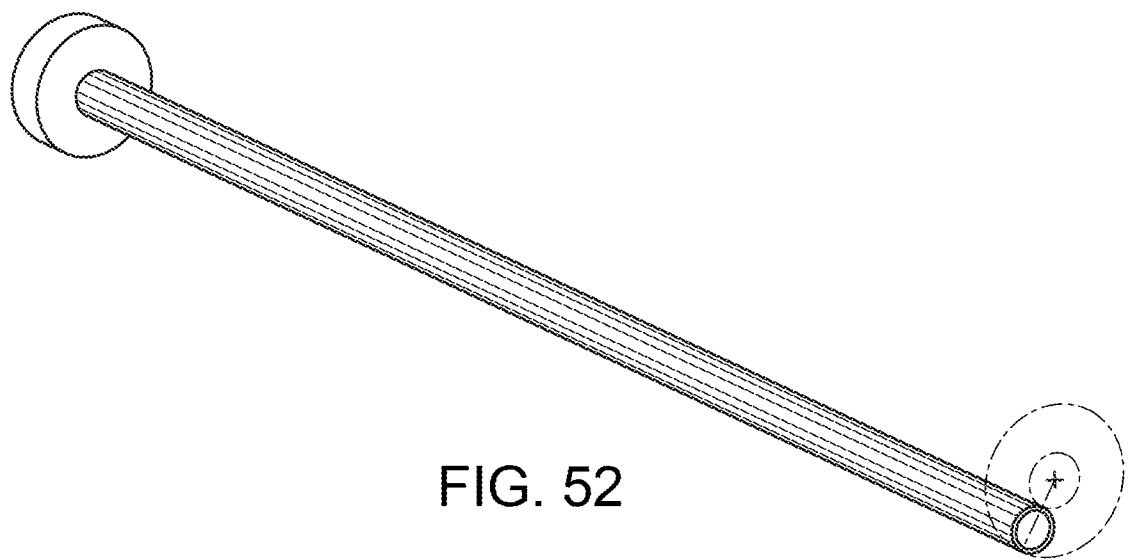
FIGS. 52 and 53 illustrate an illustration of a torque tube according to an embodiment of the present invention.
Figure 53:
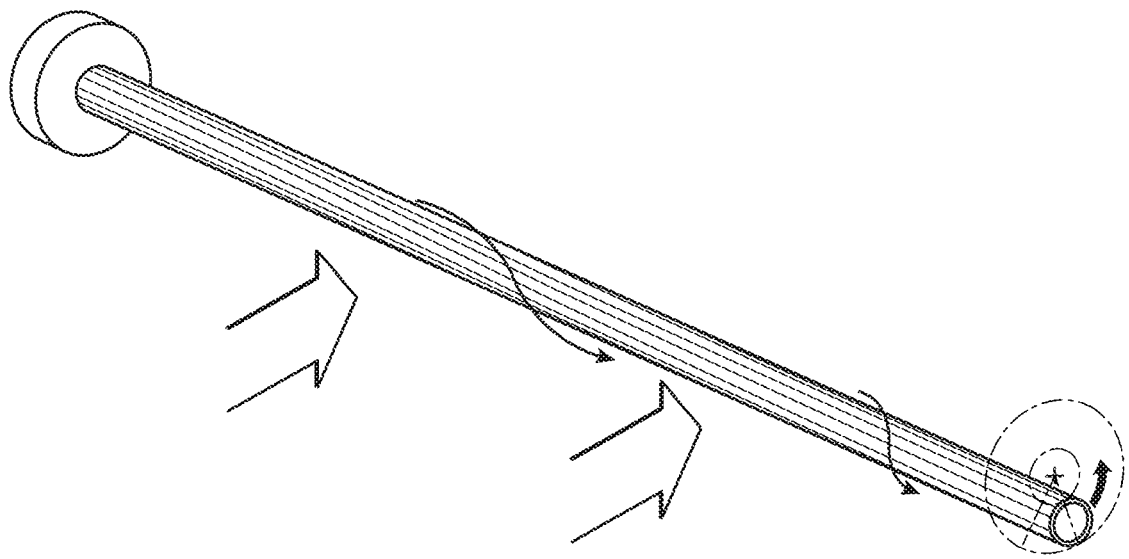

FIGS. 52 and 53 illustrate an illustration of a torque tube according to an embodiment of the present invention. As shown, the torque tube rotates and swings in a radial manner upon being subjected to the lateral force, in an example. The torque tube stops against an inner side of one of the lobes of the clamp housing.

Figure 54:
FIG. 54 is a perspective diagram of a clamp housing and support member according to an example of the present invention.

FIG. 54 is a perspective diagram of a clamp housing and support member according to an example of the present invention. As shown is a first configuration of the clamp to the support member.

Figure 55:
FIG. 55 is a perspective diagram of a clamp housing and support member according to an example of the present invention.

FIG. 55 is a perspective diagram of a clamp housing and support member according to an example of the present invention. As shown is a second configuration of the clamp to the support member. In an example, the support member has an elongated slot that allows for the clamp member to move from a first spatial location to a second spatial location in a continuous manner along a determined direction. A pair of nuts/bolts or other fasteners are provided to secure the housing to the support, as shown.

Figure 56:
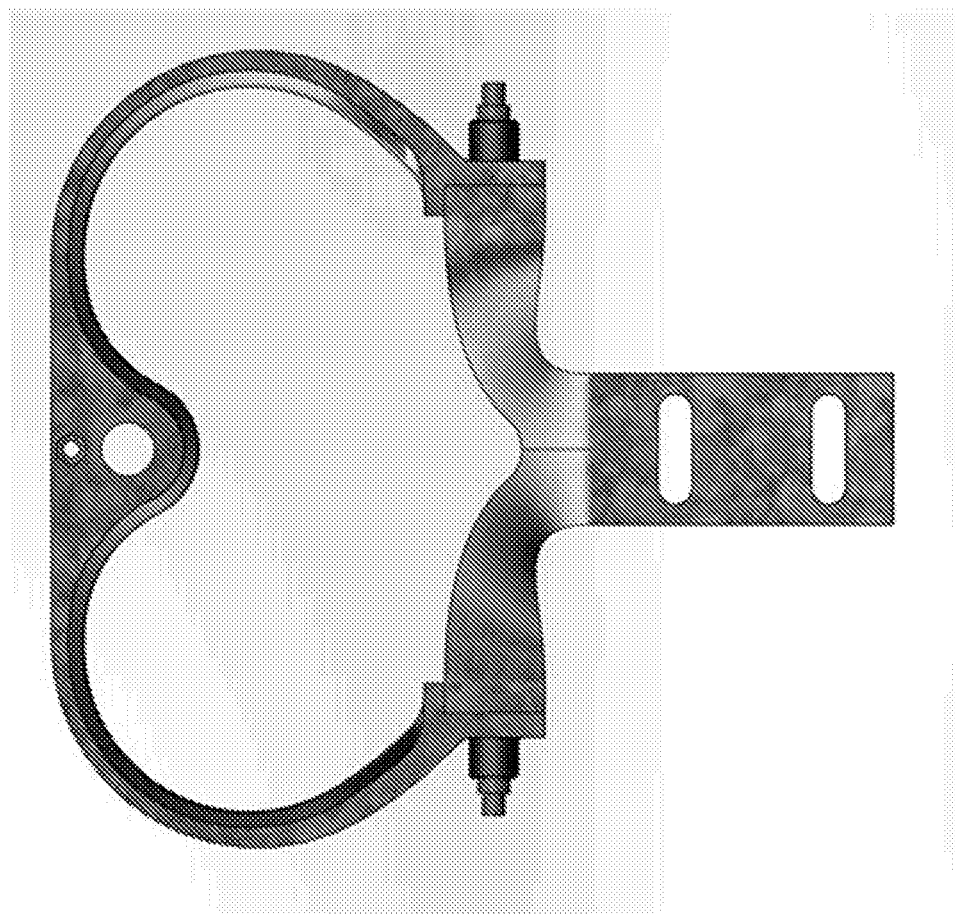
FIG. 56 is a front-view diagram of the clamp housing and support member according to an example of the present invention.

FIG. 56 is a front-view diagram of the clamp housing an support member according to an example of the present invention.

Figure 57:
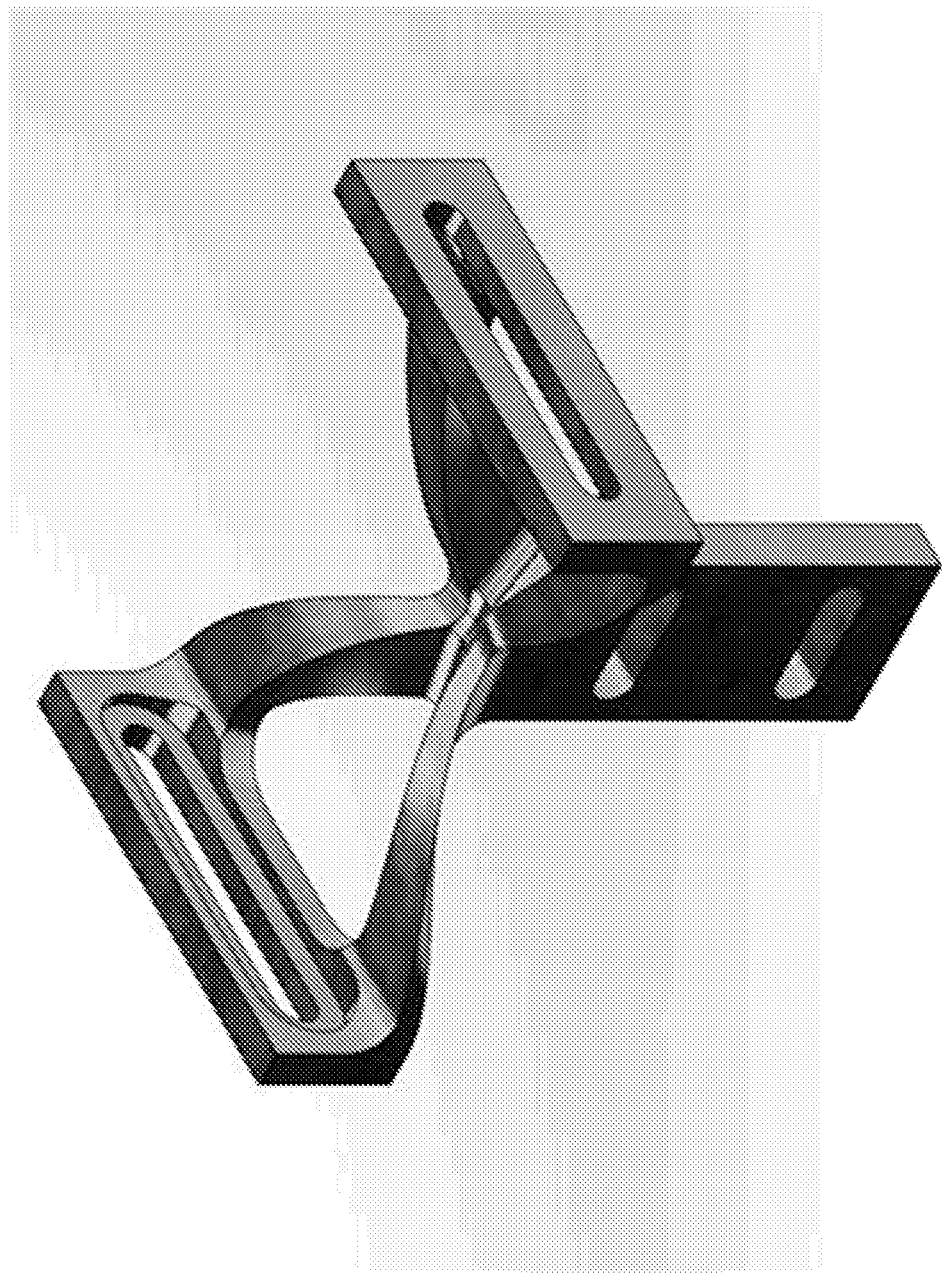
FIGS. 57 and 58 illustrate a perspective view and a front view of the support member according to an example of the present invention.
Figure 58:
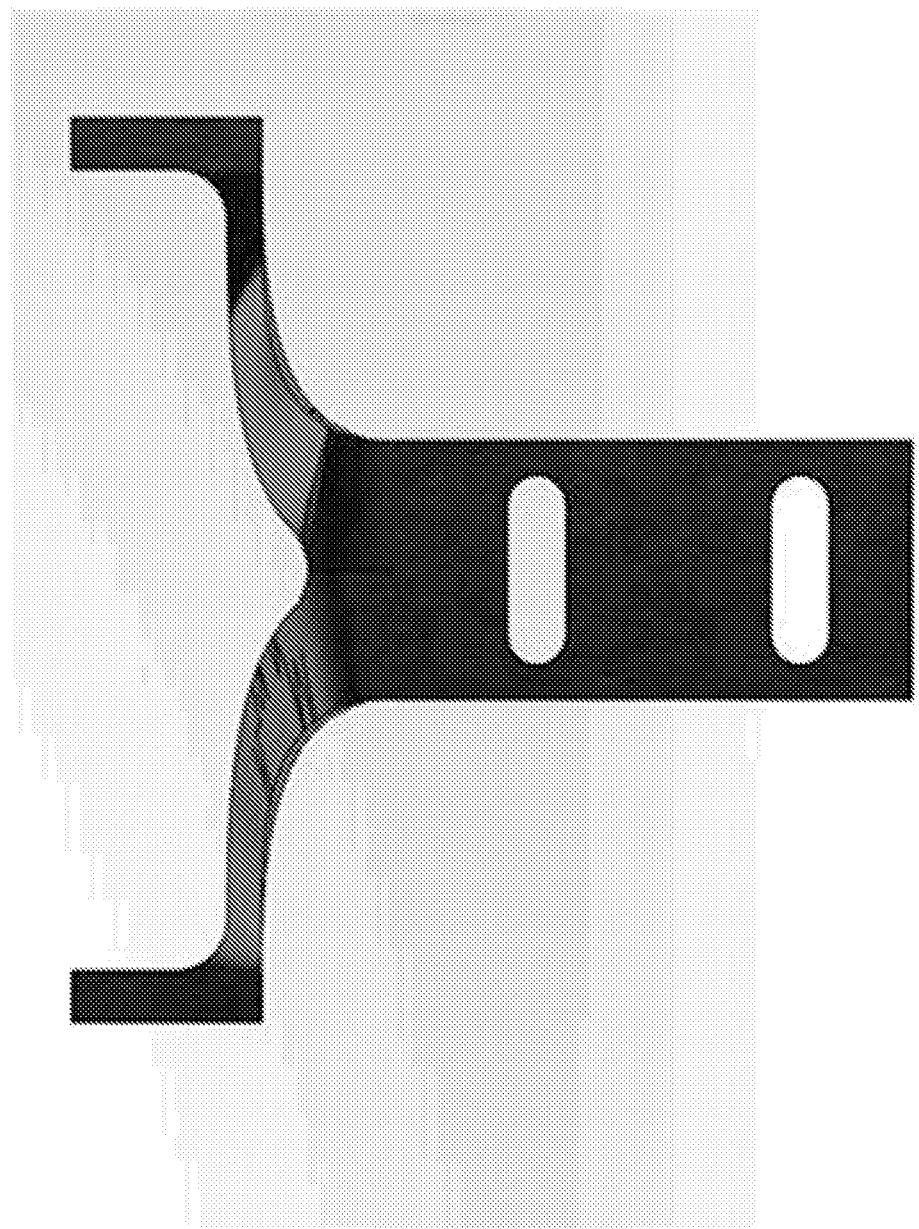

FIGS. 57 and 58 illustrate a perspective view and a front view of the support member according to an example of the present invention.

Figure 59:
FIG. 59 illustrate a perspective view of the clamp housing according to an example of the present invention.

FIG. 59 illustrate a perspective view of the clamp housing according to an example of the present invention.

Figure 60:
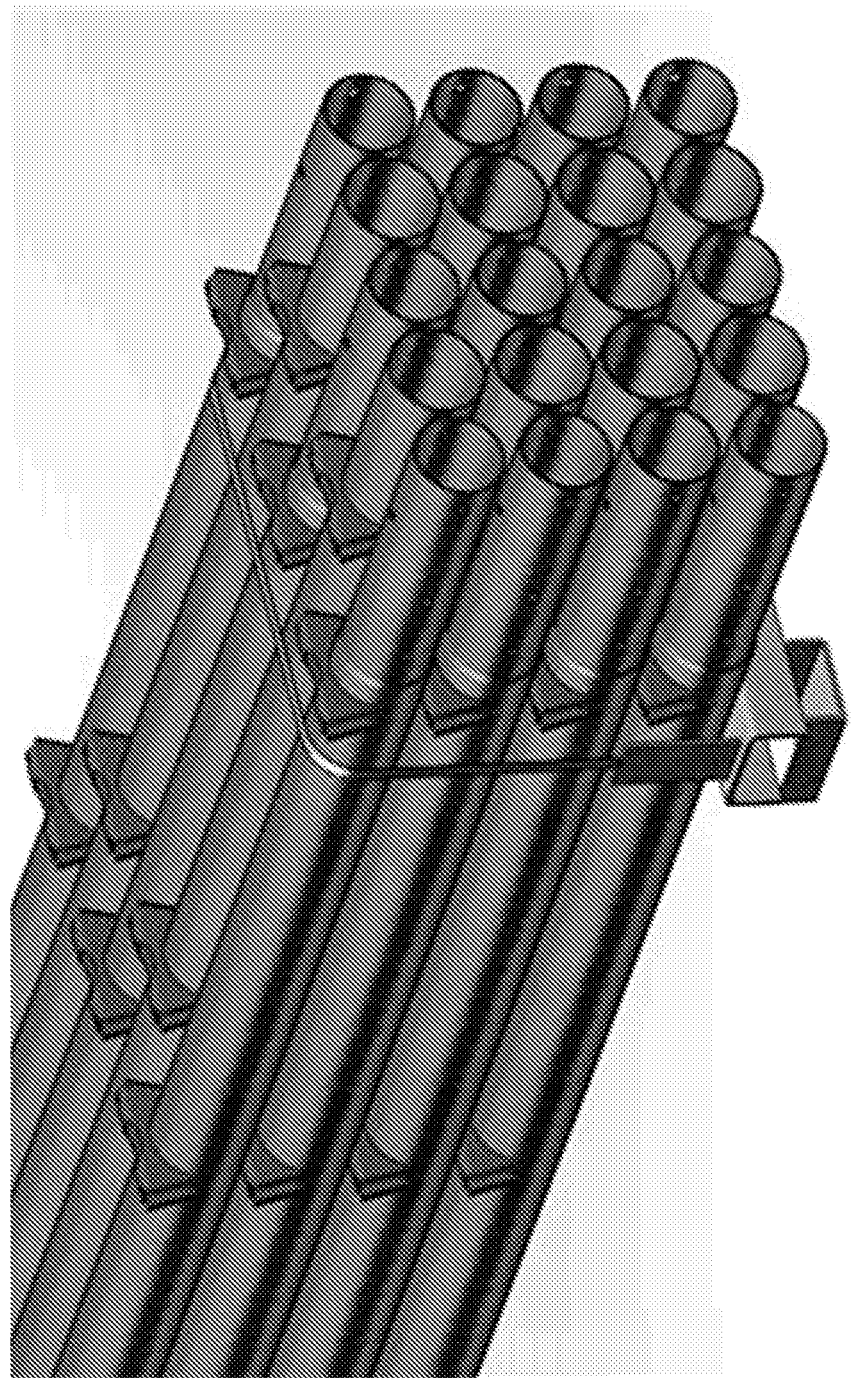
FIG. 60 is an illustration of a plurality of torque tubes configured in a stack for transportation in an example.

FIG. 60 is an illustration of a plurality of torque tubes configured in a stack for transportation in an example. As shown, each of the torque tubes has at least a pair of clamp or spacers having a recessed region, which has a similar or same curvature as the torque tube to allow the torque tube to be inserted into the recessed region and be substantially free from movement once the plurality of tubes have been strapped together.

Figure 61:
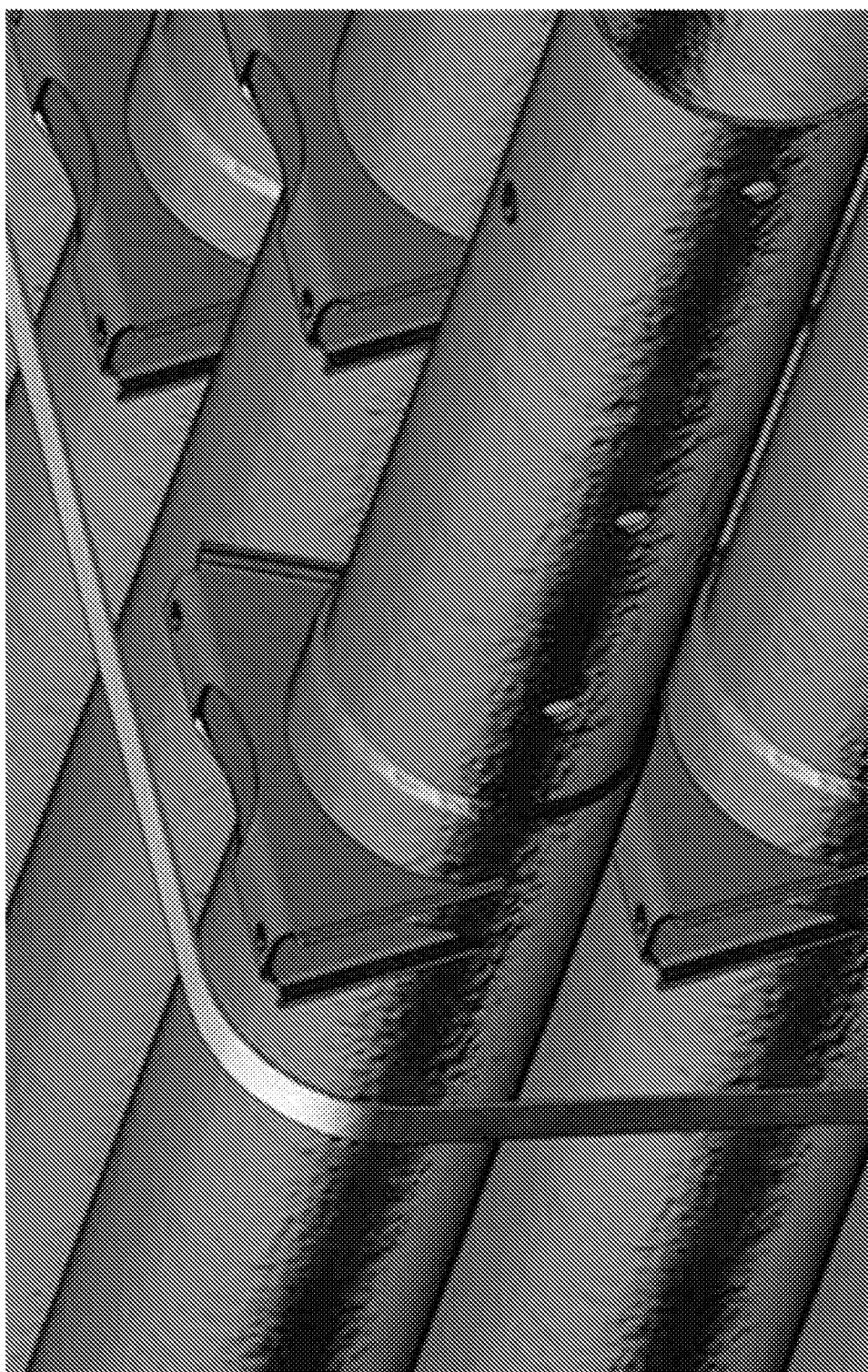
FIG. 61 is a more detailed illustration of a U-bolt and clamp having a recessed region for stacking in the stack of the prior Figure.

FIG. 61 is a more detailed illustration of a clamp or spacer having a recessed region for stacking in the stack of the prior Figure. As shown, each clamp or upper clamp or spacer has a recessed region, which intimately mates or couples with an outer periphery of the torque tube. Of course, there can be variations.

Figure 62:
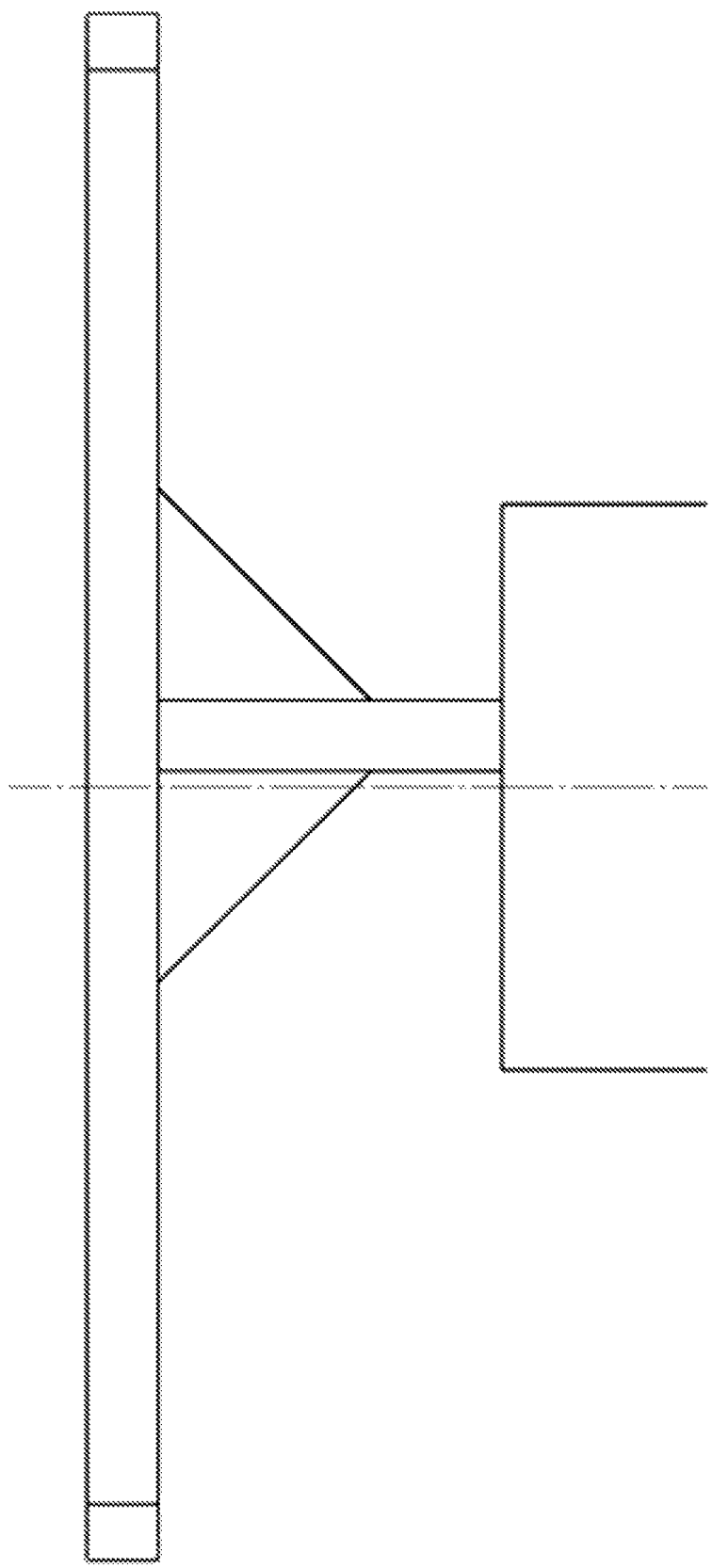
FIGS. 62, 63, and 64 illustrate various views of the drive device support member according to an example of the present invention.
Figure 63:
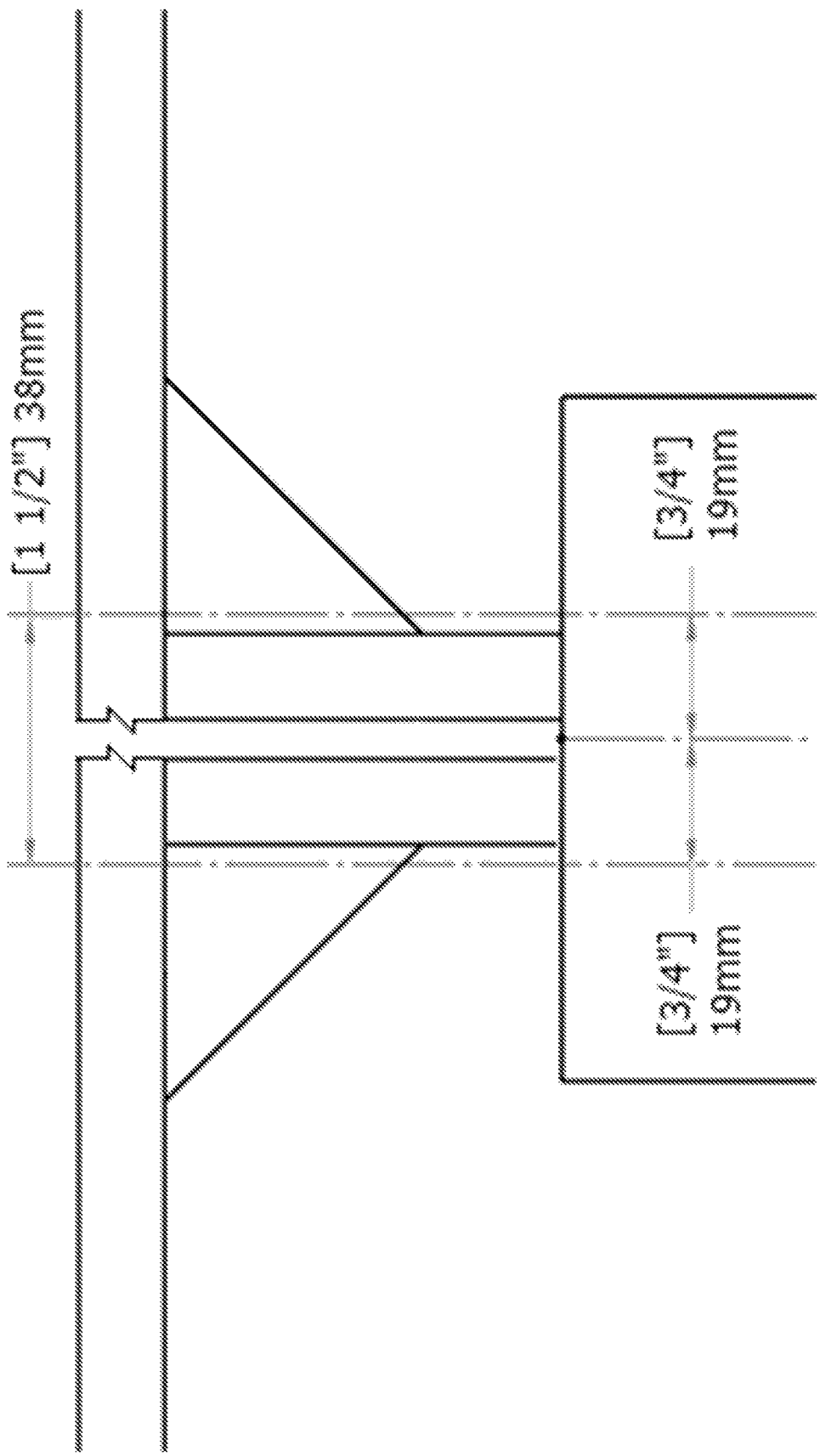
Figure 64:
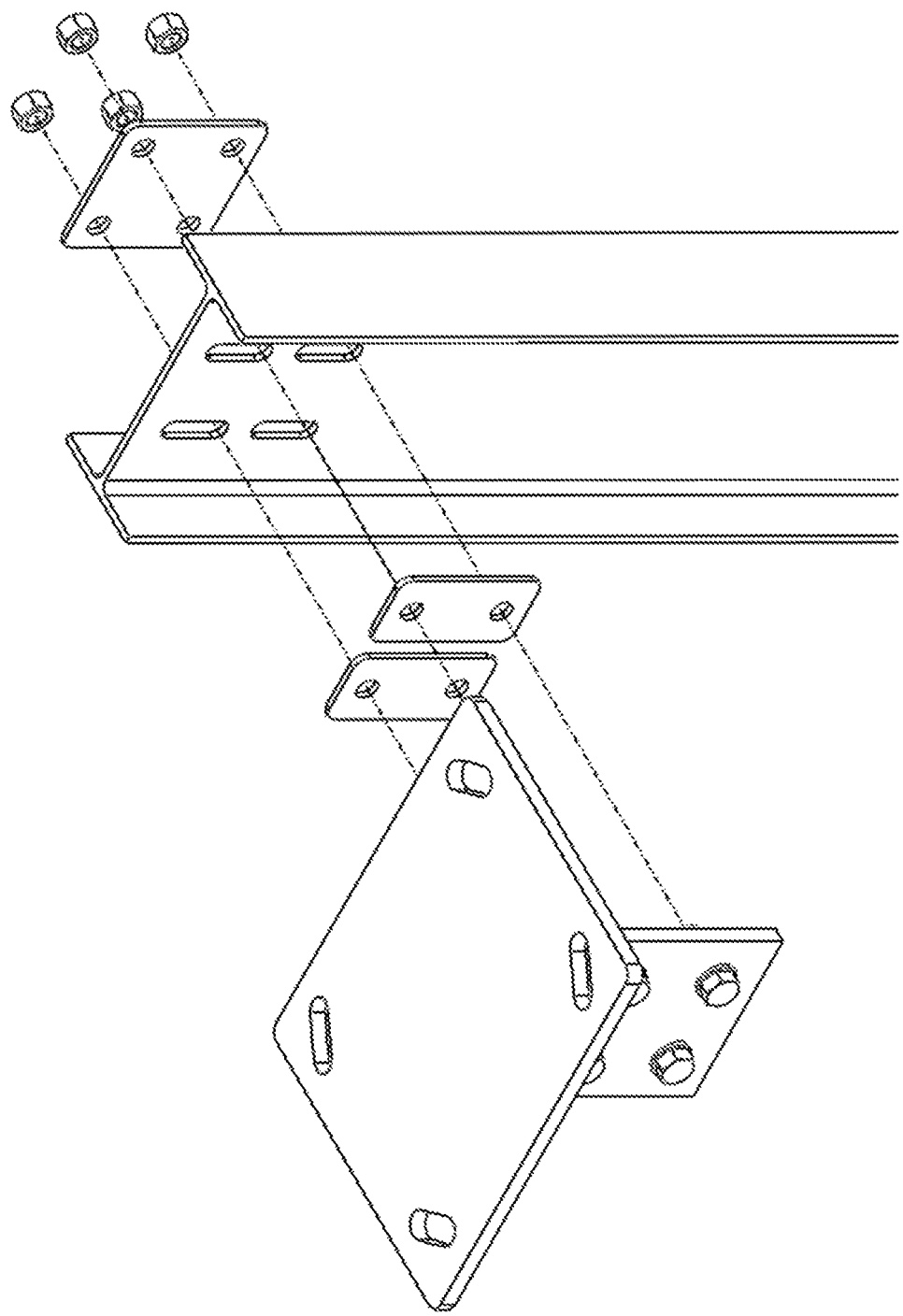

FIGS. 62, 63, and 64 illustrate various views of the drive device support member according to an example of the present invention. As shown, the member has a built-in offset so that a horizontal portion remains centered over a pier structure. In an example, the offset can also be used to shift the drive device in a north-south direction or other direction. By installing the drive mount backwards, on the appropriate side of the pier, the drive can be moved about one inch or other dimension in the desired direction. In an example, the support member has a plurality of spacer plates, which can be 3/16-inch thick or other dimension. In an example, only one set of spacer plates may be used due to the length of the four 5052 M16×50 bolts, although there can be variations.

Figure 65:
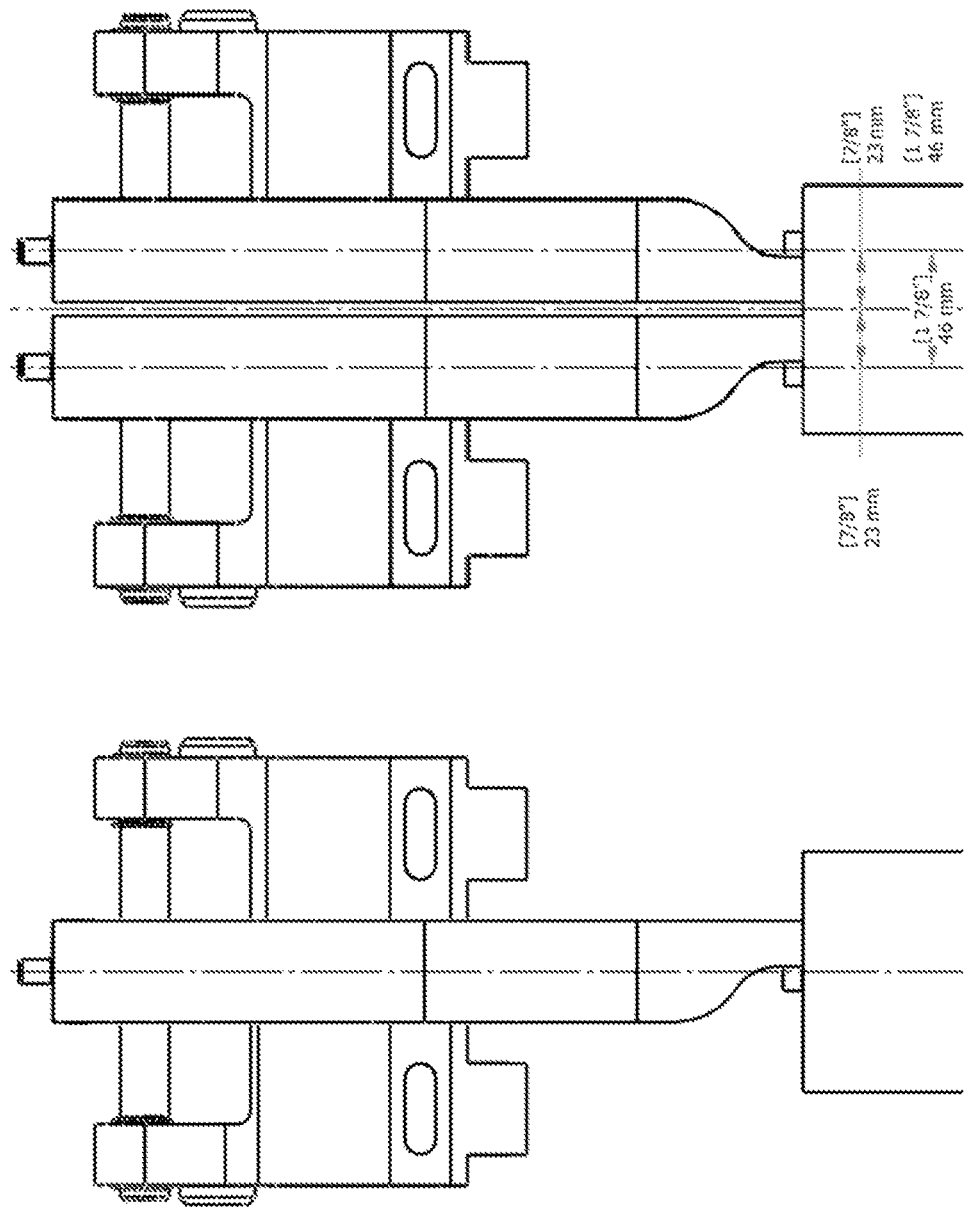
FIGS. 65 and 66 illustrate various views of a clamp assembly according to an example of the present invention.
Figure 66:
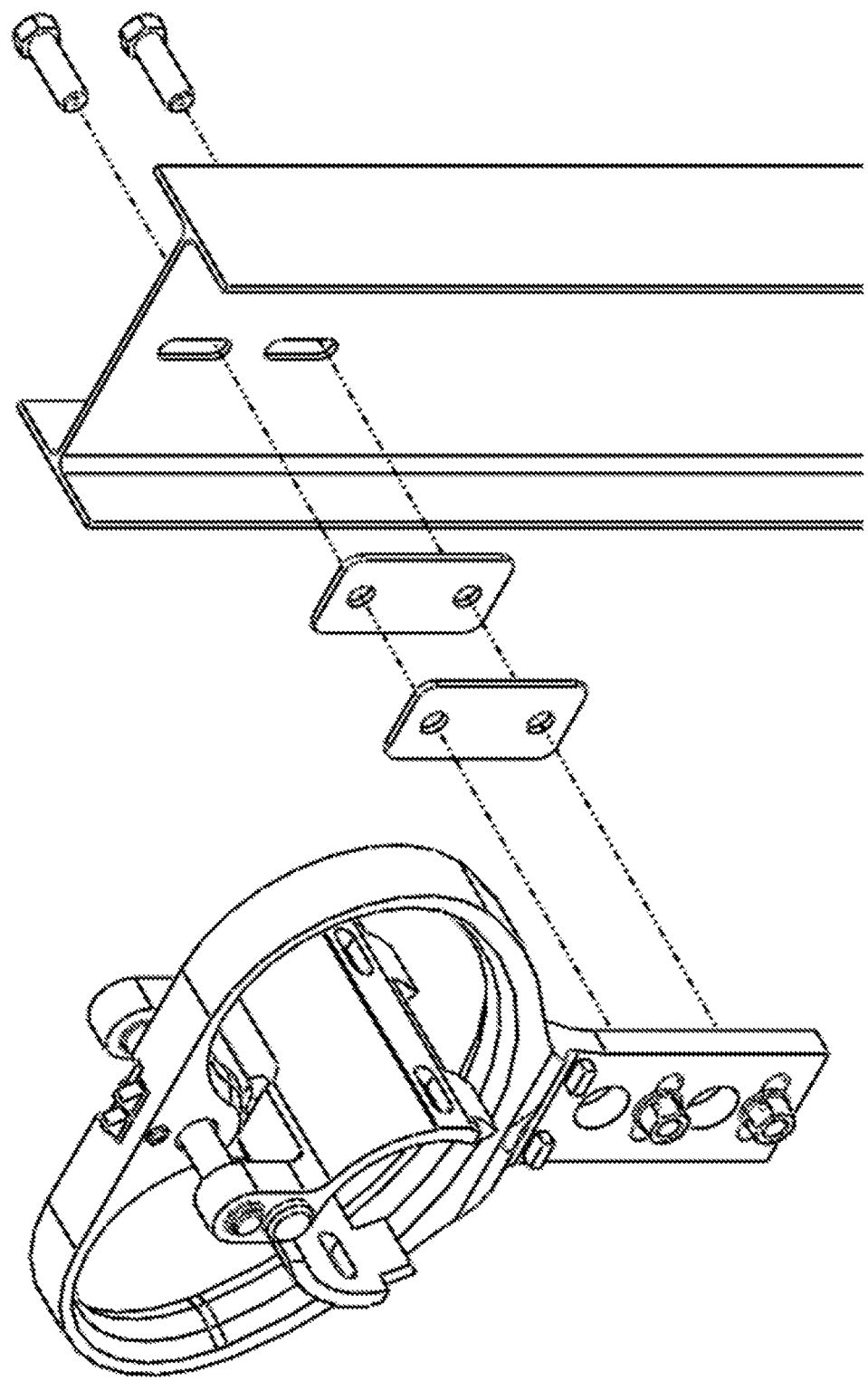
Figure 67:
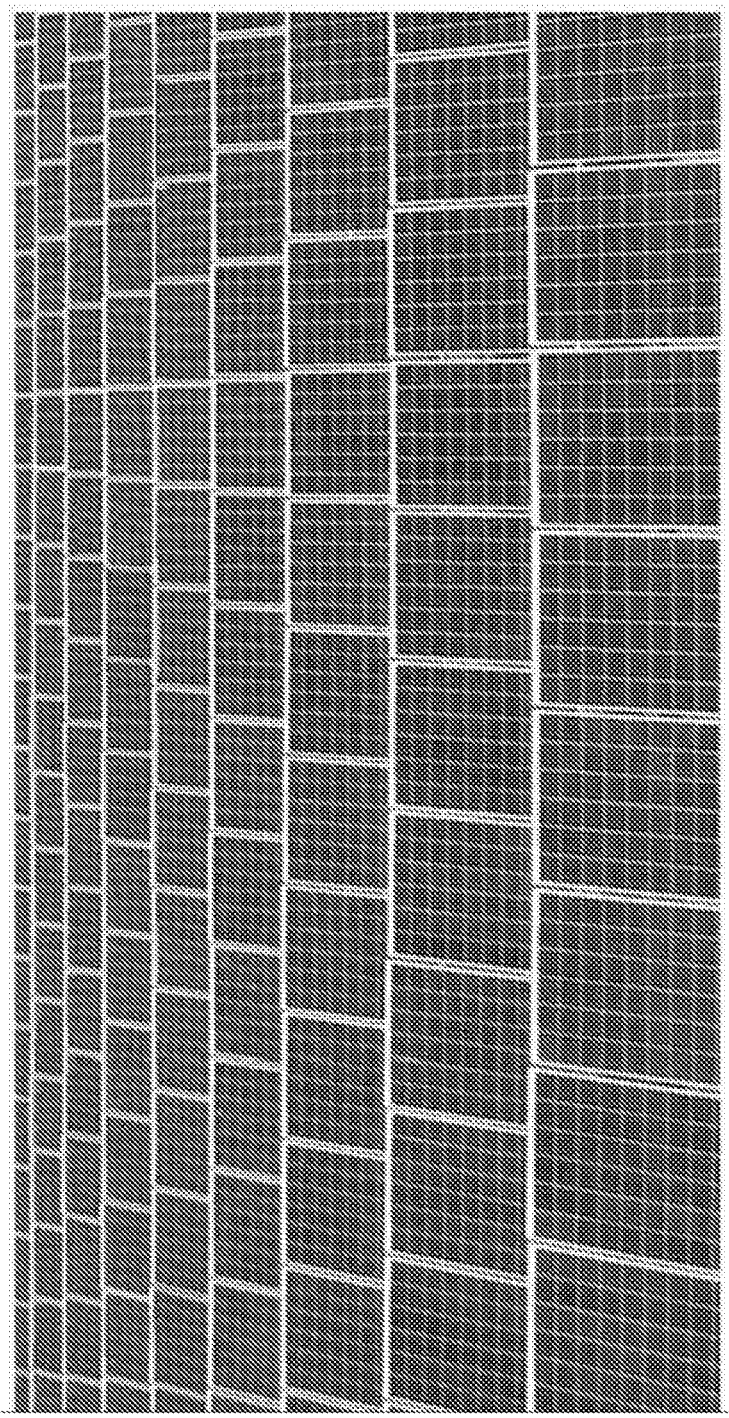
FIGS. 67 through 71 illustrate various view of a horizontal tracker configured with a plurality of solar panels in a portrait view according to examples of the present invention.
Figure 68:
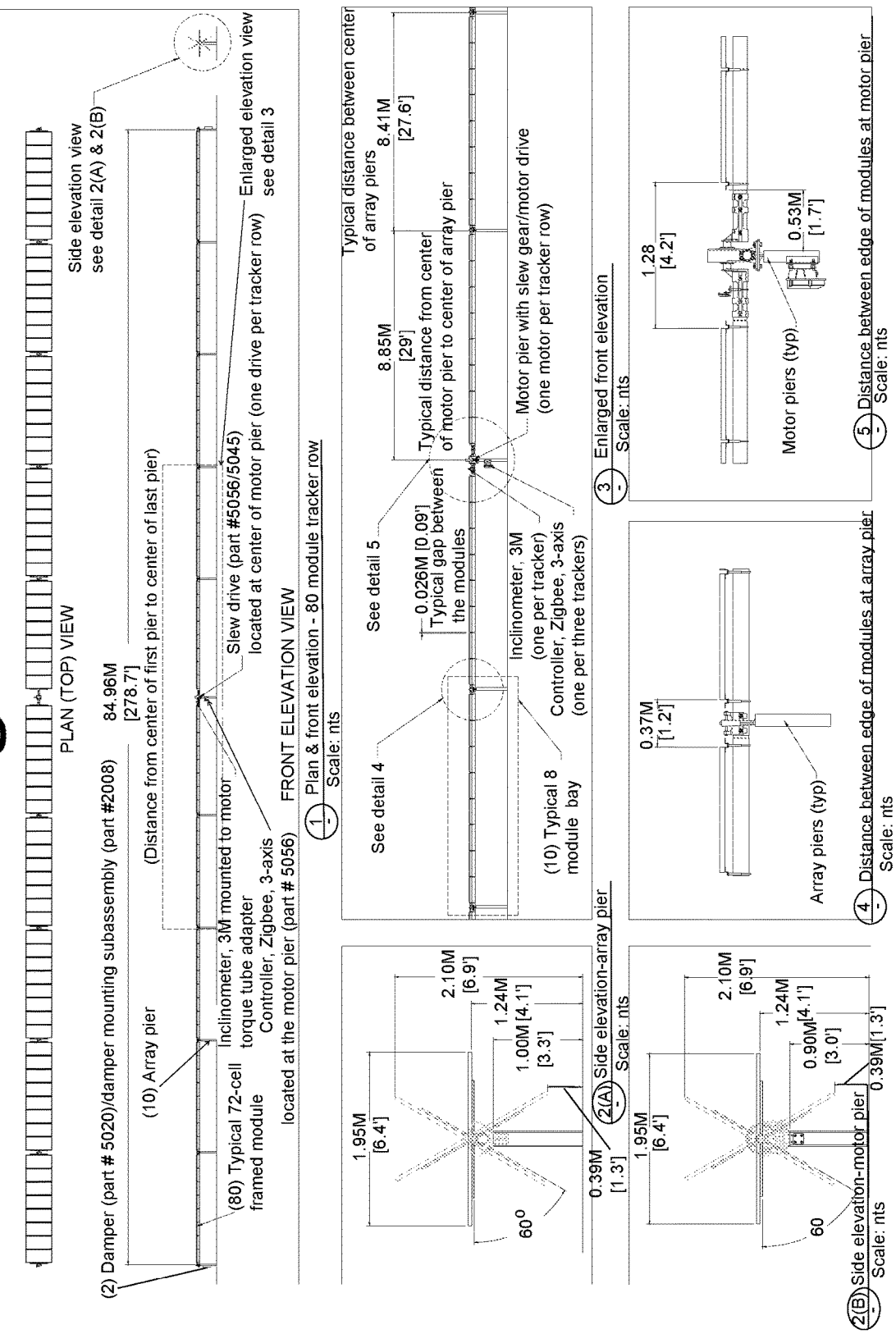
Figure 69:
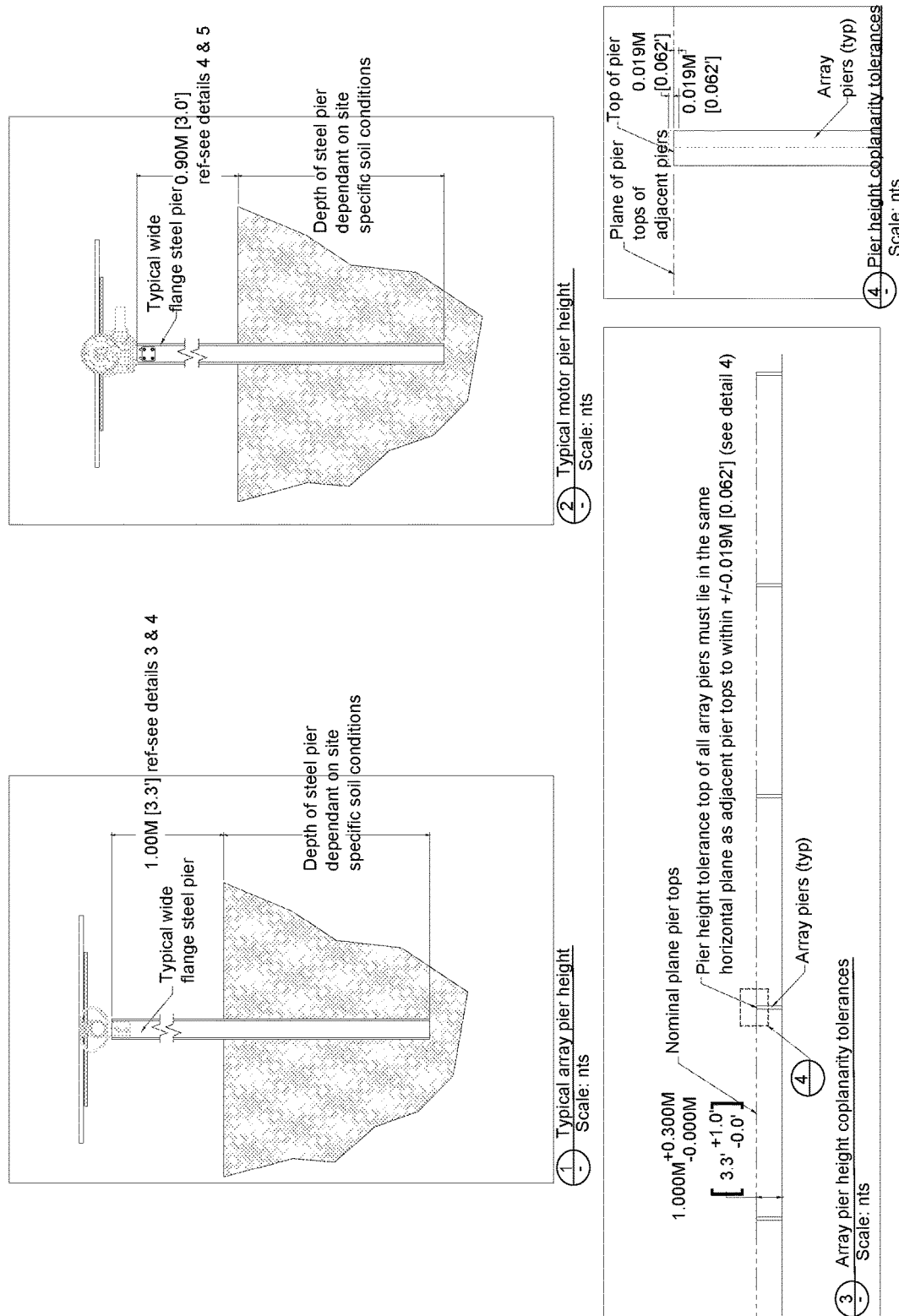
Figure 70:
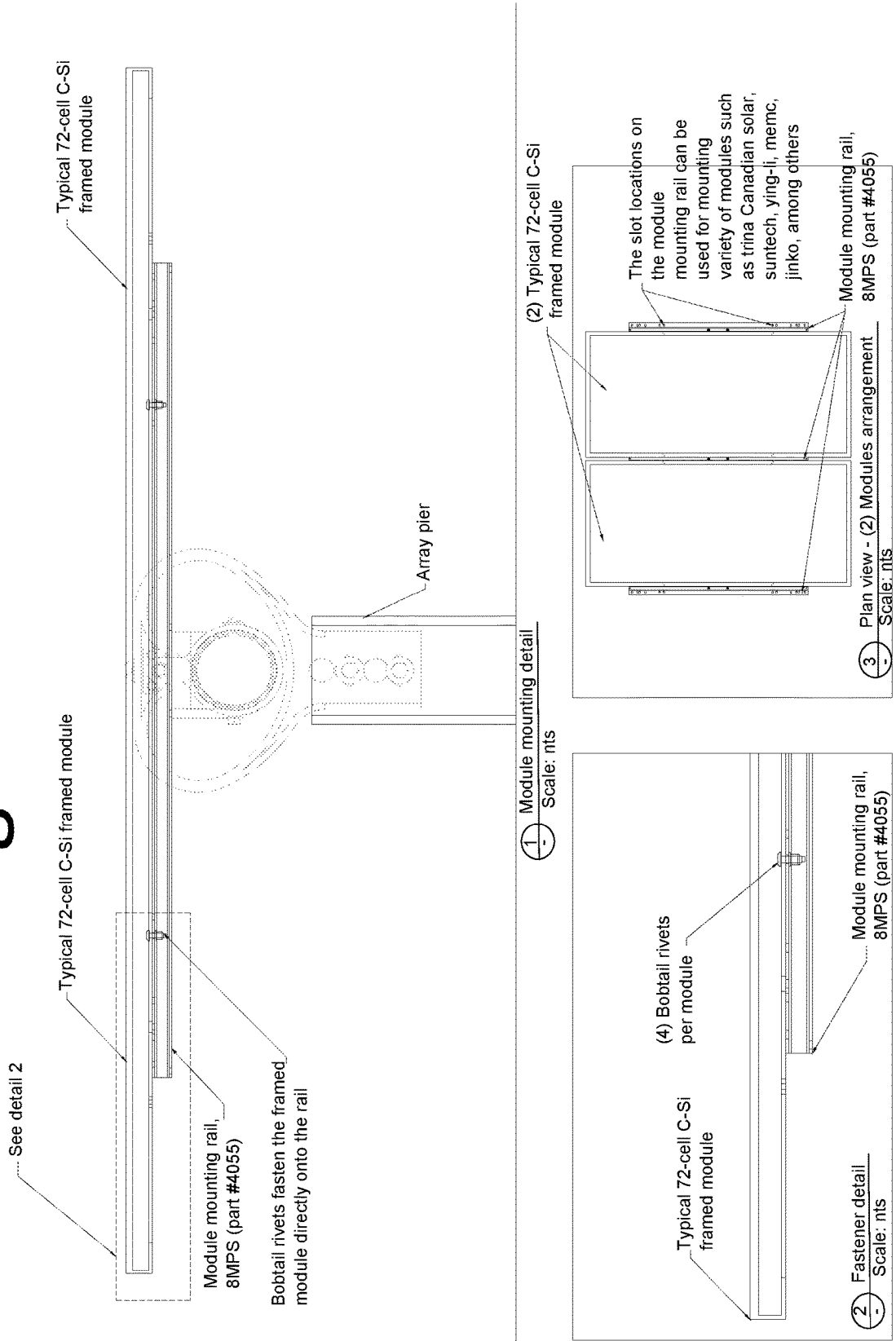
Figure 71:
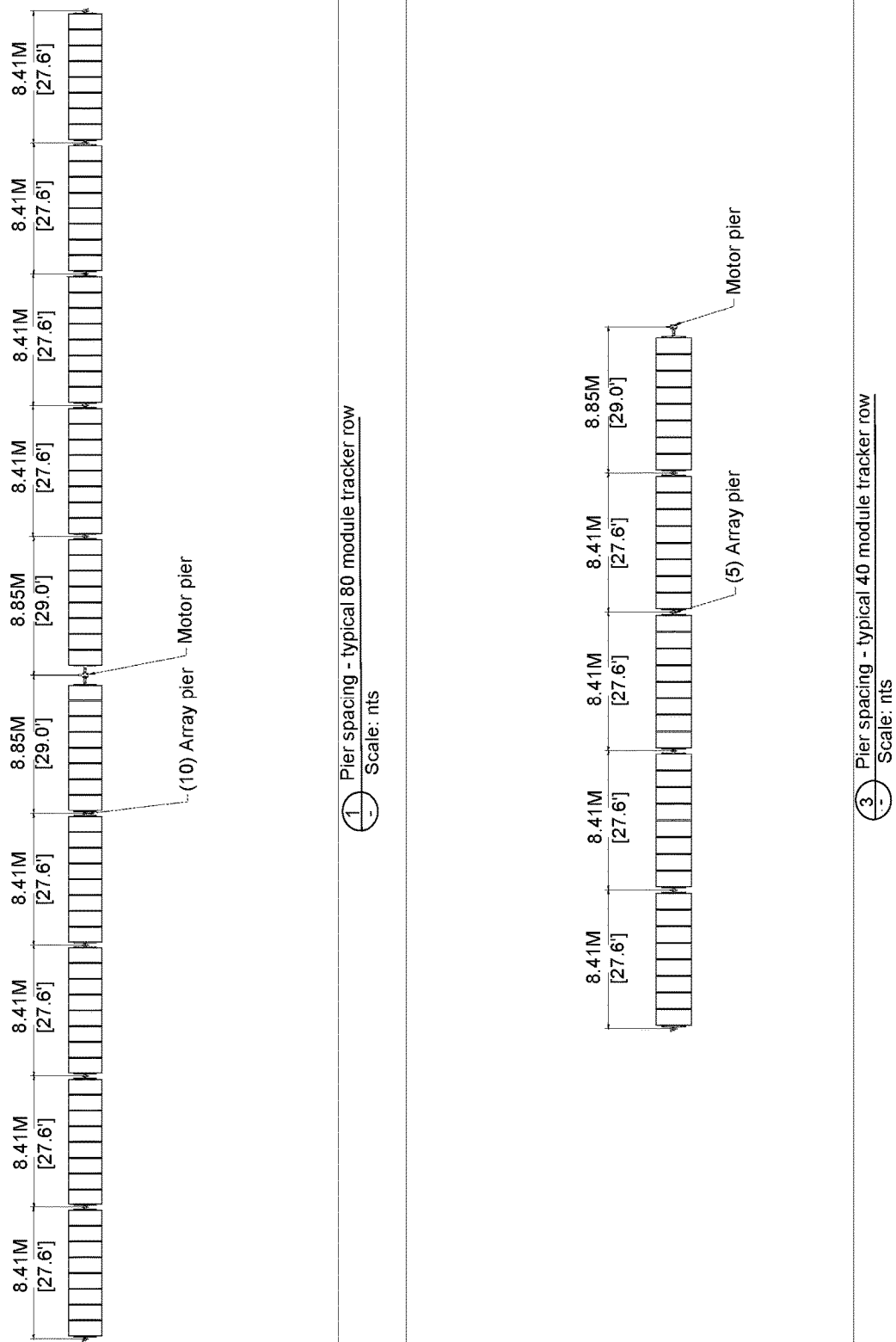

FIGS. 65 and 66 illustrate various views of a clamp assembly according to an example of the present invention.

FIGS. 67 through 71 illustrate various view of a horizontal tracker configured with a plurality of solar panels in a portrait view according to examples of the present invention. As shown, each of the solar panels can be configured where the length is aligned with a direction of gravity, while the width is normal to the length.

Figure 72:
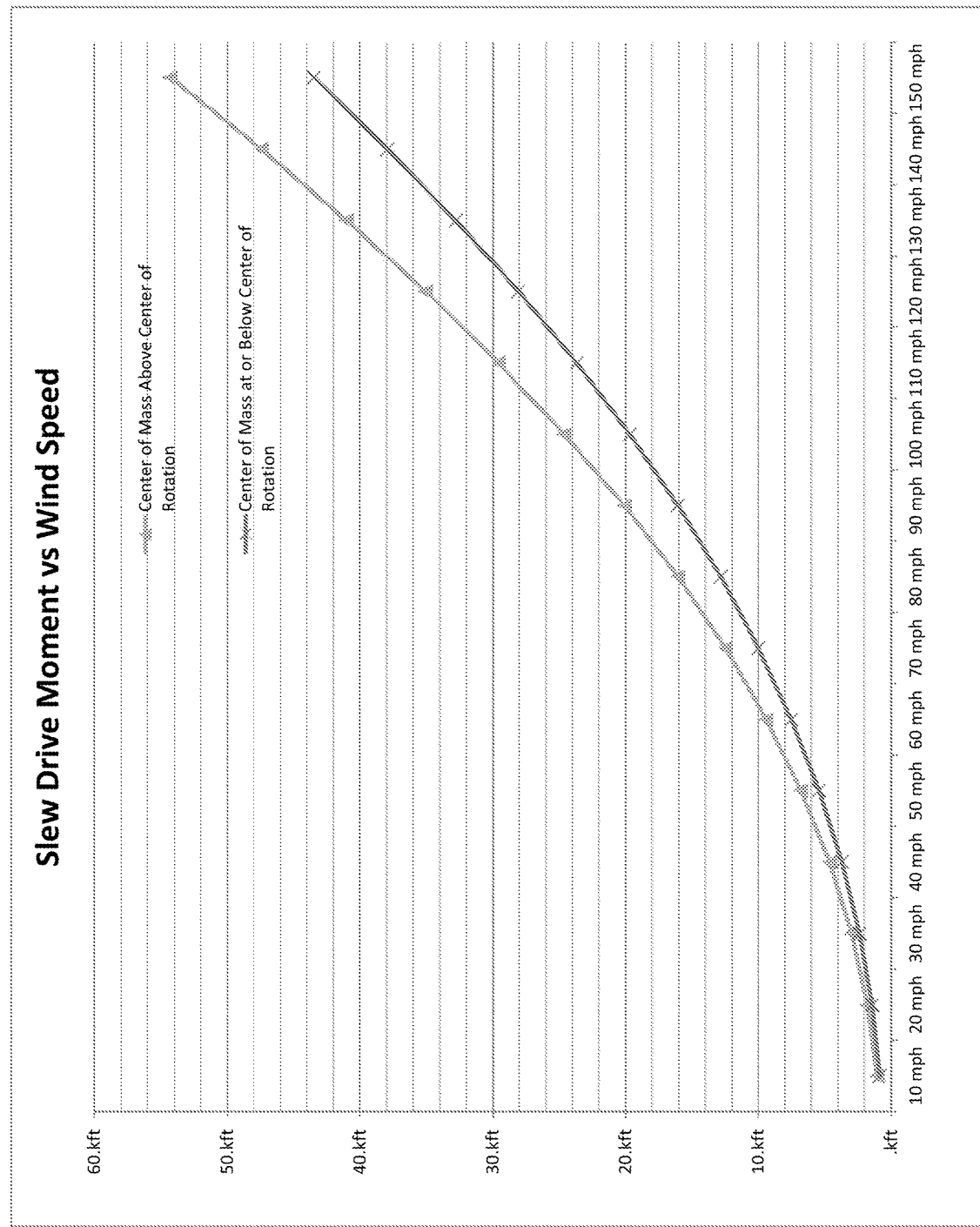
FIG. 72 is a simplified plot illustrating a force plotted against a wind speed in an example of the present invention.

FIG. 72 is a simplified plot illustrating a force plotted against a wind speed in an example of the present invention. As shown, the present method and apparatus have a lower drive force. In an example, a benefit of the present apparatus that the center of mass is configured to allow the solar modules to rotate about a first angle through a solid angle to a second angle, while the amount of load in driving the rotating is substantially the same, unlike conventional tracker technologies.

In an example, the present parts and elements can be made of suitable material, such as steel, aluminum, or other alloys. Additionally, such steel and/or alloys and/or aluminum can be cast, stamped, or welded, or combinations thereof. Of course, there can be other variations, modifications, and alternatives. In an example, the drive motor is operable to move the torque tube about the center of rotation and is substantially free from a load and move the torque tube about the center of rotation at substantially a same force from a first radial position to a second radial position.

It is understood that the examples and embodiments described herein are for illustrative purposes only and that various modifications or changes in light thereof will be suggested to persons skilled in the art and are to be included within the spirit and purview of this application and scope of the appended claims.

I claim:

1. A solar tracker apparatus, the apparatus comprising:
a slew gear drive device;
a torque tube;
a frame assembly;
a crank extending between first and second end portions, the first end portion including a flange coupled to the slew gear drive device, the second end portion coupled to an end portion of the torque tube such that the longitudinal axis of the torque tube is offset from a center of rotation of the flange coupled to the slew gear drive device, wherein the frame assembly is coupled to a plurality of solar modules.

2. The apparatus of claim 1, wherein the torque tube is a continuous torque tube spatially disposed from a first region to a second region.

3. The apparatus of claim 1, wherein the crank comprises a first crank coupled to a first side of the slew gear drive device
and a second crank coupled to a second side of the slew gear drive device,
the first crank comprising a first flange connected to the first side of the slew gear drive device,
and the second crank comprising a second flange connected the second side of the slew gear drive device,
the first crank further comprising a first arm coupled to a first cylinder,
the first cylinder swage fitted an end of the torque tube,
the second crank comprising a second arm coupled to a second cylinder,
the second cylinder swage fitted to an end of a second torque tube,
the torque tube and the second torque tube operably connected to opposite sides of the slew gear drive device,
the torque tube being off-set from an axis of the slew gear drive device by the first arm.

4. The apparatus of claim 1, wherein the crank comprises a first crank coupled to a first side of the slew gear drive device and a second crank coupled to a second side of the slew gear drive device, wherein a first portion of the torque tube is coupled to the first crank and a second portion of the torque tube is coupled to the second crank.

5. The apparatus of claim 1 wherein the crank comprises a first crank coupled to a first side of the slew gear drive device and a second crank coupled to a second side of the slew gear drive device, wherein a first portion of the torque tube is coupled to the first crank and a second portion of the torque tube is
coupled to the second crank, wherein a first swage fitting couples the first crank to the first portion of the torque tube and a second swage fitting couples the second crank to the second portion of the torque tube tube is coupled to the first crank and a second portion of the independently driven torque tube is coupled to the second crank, wherein a first swage fitting couples the first crank to the first portion of the independently driven torque tube and a second swage fitting couples the second crank to the second portion of the independently driven torque tube.

6. The apparatus of claim 2 further comprising a pier coupled to the slew gear drive device, the pier comprising a plurality of support structures coupled to a drive device support, and the drive device support having a first member coupled to the plurality of support structures, and a second member coupled to the slew gear drive device.

7. The apparatus of claim 2 further comprising a drive mount coupled to a pier.

* * * * *